US012581652B2

(12) United States Patent
Zhou et al.

(10) Patent No.: US 12,581,652 B2
(45) Date of Patent: Mar. 17, 2026

(54) THREE-DIMENSIONAL MEMORY DEVICES HAVING CHANNEL CAP STRUCTURES AND METHODS FOR FORMING THE SAME

(71) Applicant: SANDISK TECHNOLOGIES LLC, Addison, TX (US)

(72) Inventors: Bing Zhou, San Jose, CA (US); Raghuveer S. Makala, Campbell, CA (US); Senaka Kanakamedala, San Jose, CA (US); Rahul Sharangpani, Fremont, CA (US); Adarsh Rajashekhar, Santa Clara, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 388 days.

(21) Appl. No.: 18/363,460

(22) Filed: Aug. 1, 2023

(65) Prior Publication Data

US 2024/0349500 A1     Oct. 17, 2024

Related U.S. Application Data

(60) Provisional application No. 63/496,653, filed on Apr. 17, 2023.

(51) Int. Cl.
H10B 43/27          (2023.01)
H10B 41/27          (2023.01)
          (Continued)

(52) U.S. Cl.
CPC ............. H10B 43/27 (2023.02); H10B 41/27 (2023.02); H10B 41/35 (2023.02); H10B 43/35 (2023.02);
          (Continued)

(58) Field of Classification Search
CPC ........ H10B 43/27; H10B 41/27; H10B 41/35; H10B 43/35; H10B 41/48; H10B 43/40; H10D 64/037
See application file for complete search history.

(56) References Cited

U.S. PATENT DOCUMENTS 9,177,966 B1    11/2015  Rabkin et al.
10,629,616 B1    4/2020  Kai et al.
          (Continued)

FOREIGN PATENT DOCUMENTS

WO     WO 2020/0147119 A1     7/2020

OTHER PUBLICATIONS

Sharangpani, R. et al., "Three-Dimensional Memory Devices Having Channel Cap Structures And Methods Of Forming The Same," U.S. Appl. No. 18/363,486, filed Aug. 1, 2023.
          (Continued)

*Primary Examiner* — Sonya McCall-Shepard
(74) *Attorney, Agent, or Firm* — THE MARBURY LAW GROUP PLLC

(57) ABSTRACT

A semiconductor structure includes an alternating stack of insulating layers and electrically conductive layers, a memory opening vertically extending through the alternating stack and a memory opening fill structure located in the memory opening. A Group IV-containing material portion is formed by selective deposition on an end portion of the vertical semiconductor channel. Alternatively, a backside semiconductor cap structure can be formed directly on a bottom surface of the vertical semiconductor channel by selective or non-selective deposition of a semiconductor material.

14 Claims, 76 Drawing Sheets

(51) Int. Cl.
| | |
|---|---|
| *H10B 41/35* | (2023.01) |
| *H10B 43/10* | (2023.01) |
| *H10B 43/35* | (2023.01) |
| *H10B 43/40* | (2023.01) |
| *H10B 43/50* | (2023.01) |
| *H10B 80/00* | (2026.01) |
| *H10W 90/00* | (2026.01) |
| *H10W 80/00* | (2026.01) |

(52) U.S. Cl.
CPC ............ *H10B 80/00* (2023.02); *H10W 90/00* (2026.01); *H10W 80/211* (2026.01); *H10W 80/312* (2026.01); *H10W 80/327* (2026.01); *H10W 90/792* (2026.01)

(56) References Cited

U.S. PATENT DOCUMENTS

| | | | | |
|---|---|---|---|---|
| 11,049,876 | B2 | 6/2021 | Kaminaga et al. | |
| 11,195,781 | B2 | 12/2021 | Okina et al. | |
| 11,201,107 | B2 | 12/2021 | Okina et al. | |
| 11,355,486 | B2 | 6/2022 | Mizutani et al. | |
| 11,393,836 | B2 | 7/2022 | Tsutsumi et al. | |
| 11,482,539 | B2 | 10/2022 | Sharangpani et al. | |
| 11,508,711 | B2 | 11/2022 | Ninomiya et al. | |
| 11,631,690 | B2 | 4/2023 | Okina | |
| 11,676,954 | B2 | 6/2023 | Rabkin et al. | |
| 2020/0098780 | A1* | 3/2020 | Cui | H10B 43/10 |
| 2020/0258817 | A1 | 8/2020 | Okina et al. | |
| 2020/0286909 | A1 | 9/2020 | Yuda et al. | |
| 2020/0403005 | A1 | 12/2020 | Sakurai et al. | |
| 2021/0005621 | A1* | 1/2021 | Hu | H10B 43/35 |
| 2021/0035965 | A1 | 2/2021 | Mizutani et al. | |
| 2021/0091063 | A1 | 3/2021 | Ninomiya et al. | |
| 2022/0052073 | A1 | 2/2022 | Kitazawa et al. | |
| 2022/0130853 | A1 | 4/2022 | Sharangpani et al. | |
| 2022/0157841 | A1 | 5/2022 | Tsutsumi et al. | |
| 2022/0157842 | A1 | 5/2022 | Tsutsumi et al. | |
| 2022/0189984 | A1 | 6/2022 | Okina | |
| 2022/0208748 | A1 | 6/2022 | Rabkin et al. | |
| 2022/0336484 | A1 | 10/2022 | Iwai et al. | |
| 2022/0359555 | A1 | 11/2022 | Toyama et al. | |
| 2023/0232624 | A1 | 7/2023 | Iwai et al. | |

OTHER PUBLICATIONS

ISR-WO—Notification of Transmittal of The International Search Report and Written Opinion of the International Searching Authority for International Patent Application No. PCT/US2024/012890, mailed May 27, 2024, 16 pages.

Demaurex, B. et al., "Low-temperature plasma-deposited silicon epitaxial films: growth and properties," Journal of Applied Physics, Aug. 2014, vol. 116, No. 5, 053519-053519-9; DOI:10.1063/1.4892095.

Endoh et al., "Novel Ultra High-Density Memory with a Stacked-Surrounding Gate Transistor (S-SGT) Structured Cell," IEDM Proc. (2001) 33-36.

Li, L. et al., "The Nature of $PH_3$ Decomposition Reaction over Amorphous CoNiBP Alloy Supported on Carbon Nanotubes," Industrial & Engineering Chemistry Research 2010, vol. 49, No. 4, pp. 1658-1662, https:/doi.org/10.1021/ie9015478.

Loh, T.H. et al., "Ultrathin low temperature SiGe buffer for the growth of high quality Ge epilayer on Si(100) by ultrahigh vacuum chemical vapor deposition," *Appl. Phys. Lett.* Vo. 90, 092108 (2007), https://doi.org/10.1063/1.2709993.

Loo, R. et al., "Processing Technologies for Advanced Ge Devices," Jan. 2017, ECS Journal of Solid State Science and Technology, vol. 6, No. 1: pp. 14-P20, (2017), https://doi.org/10.1149/2.0301612iss.

Porret, C. et al., "Very Low Temperature Epitaxy of Group-IV Semiconductors for Use in FinFET, Stacked Nanowires and Monolithic 3D Integration," *ECS Journal of Solid State Science and Technology*, vol. 8, No. 8, p. 392; https://doi.org/10.1149/2.0071908iss.

Teplin, C.W. et al., "Low-temperature silicon homoepitaxy by hot-wire chemical vapor deposition with a Ta filament," Journal of Crystal Growth, vol. 287, Issue 2, Jan. 25, 2006, pp. 414-418, https://doi.org/10.1016/j.jcrysgro.2005.11.055.

U.S. Appl. No. 17/655,272, filed Mar. 17, 2022, SanDisk Technologies LLC.

U.S. Appl. No. 17/659,057, filed Apr. 13, 2022, SanDisk Technologies LLC.

U.S. Appl. No. 17/662,926, filed May 11, 2022, SanDisk Technologies LLC.

U.S. Appl. No. 17/684,975, filed Mar. 2, 2022, SanDisk Technologies LLC.

U.S. Appl. No. 17/806,406, filed Jun. 10, 2022, SanDisk Technologies LLC.

U.S. Appl. No. 17/806,415, filed Jun. 10, 2022, SanDisk Technologies LLC.

U.S. Appl. No. 17/931,362, filed Sep. 12, 2022, SanDisk Technologies LLC.

U.S. Appl. No. 18/347,838, filed Jul. 6, 2023, SanDisk Technologies LLC.

U.S. Appl. No. 18/350,573, filed Jul. 11, 2023, SanDisk Technologies LLC.

U.S. Appl. No. 18/355,765, filed Jul. 20, 2023, SanDisk Technologies LLC.

U.S. Appl. No. 18/357,634, filed Jul. 24, 2023, SanDisk Technologies LLC.

U.S. Appl. No. 18/357,702, filed Jul. 24, 2023, SanDisk Technologies LLC.

U.S. Appl. No. 18/359,697, filed Jul. 26, 2023, SanDisk Technologies LLC.

U.S. Appl. No. 18/362,743, filed Jul. 31, 2023, SanDisk Technologies LLC.

U.S. Appl. No. 18/362,761, filed Jul. 31, 2023, SanDisk Technologies LLC.

U.S. Appl. No. 18/362,805, filed Jul. 31, 2023, SanDisk Technologies LLC.

* cited by examiner

1

THREE-DIMENSIONAL MEMORY DEVICES HAVING CHANNEL CAP STRUCTURES AND METHODS FOR FORMING THE SAME

FIELD

The present disclosure relates generally to the field of semiconductor devices, and particularly to three-dimensional memory devices containing channel cap structures and methods for forming the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a semiconductor structure is provided, which comprises: an alternating stack of insulating layers and electrically conductive layers; a memory opening vertically extending through the alternating stack; a memory opening fill structure located in the memory opening and comprising a memory film and a vertical semiconductor channel that laterally surrounds a core cavity that is free of any solid-phase material therein; a Group IV-containing material portion contacting an end portion of the vertical semiconductor channel and exposed in the core cavity; and a source contact structure in contact with a bottom surface of the Group IV-containing material portion and a bottom surface of a bottommost layer in the alternating stack.

According to another aspect of the present disclosure, a method of forming a semiconductor structure is provided. The method comprises: forming an alternating stack of insulating layers and spacer material layers over a carrier substrate, wherein the spacer material layers are formed as, or are subsequently replaced with, electrically conductive layers; forming a memory opening through the alternating stack; forming a memory opening fill structure in the memory opening, wherein the memory opening fill structure comprises a memory film and a vertical semiconductor channel; removing the carrier substrate; removing an end portion of the memory opening fill structure to expose an end portion of the vertical semiconductor channel; selectively growing a Group IV-containing material portion from physically exposed surfaces of the vertical semiconductor channel; and forming a source contact structure on the Group IV-containing material portion.

According to yet another aspect of the present disclosure, a semiconductor structure is provided, which comprises: an alternating stack of insulating layers and electrically conductive layers; a memory opening vertically extending through the alternating stack; a memory opening fill structure located in the memory opening and comprising a memory film and a vertical semiconductor channel; and a backside semiconductor cap structure having a top surface that is in contact with a bottom surface of the vertical semiconductor channel, wherein an entirety of the top surface of the backside semiconductor cap structure is located within a horizontal plane including a bottom surface of a bottommost insulating layer within the alternating stack.

According to still another aspect of the present disclosure, a method of forming a semiconductor structure is provided, which comprises; forming an alternating stack of insulating layers and spacer material layers over a carrier substrate, wherein the spacer material layers are formed as, or are subsequently replaced with, electrically conductive layers; forming a memory opening vertically through the alternating stack; forming a memory opening fill structure in the memory opening, wherein the memory opening fill structure comprises a memory film and a vertical semiconductor channel; removing the carrier substrate; exposing a bottom surface of the vertical semiconductor channel within a horizontal plane including a bottom surface of a bottommost insulating layer within the alternating stack; and forming a backside semiconductor cap structure by depositing a semiconductor material directly on the bottom surface of the vertical semiconductor channel.

DETAILED DESCRIPTION

Figure 1:
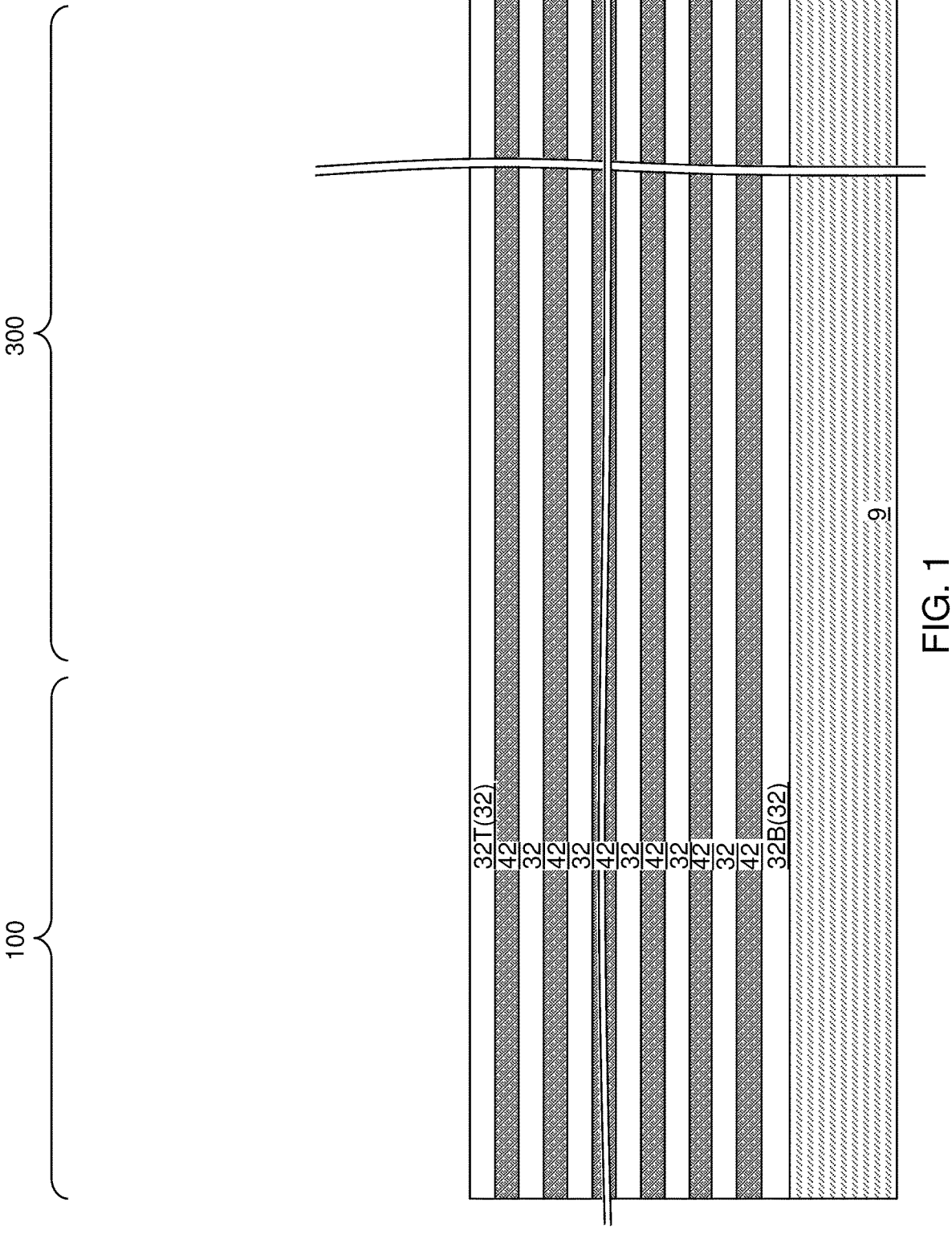
FIG. 1 is a schematic vertical cross-sectional view of a first exemplary structure after formation of an alternating stack of insulating layers and sacrificial material layers over a carrier substrate according to a first embodiment of the present disclosure.

As discussed above, the embodiments of the present disclosure are directed to a three-dimensional memory device containing channel cap structures and methods for forming the same, the various aspects of which are described below. Embodiments of the disclosure can be employed to form various structures including a multilevel memory structure, non-limiting examples of which include three-dimensional memory devices comprising a plurality of memory strings.

The drawings are not drawn to scale. Multiple instances of an element may be duplicated where a single instance of the element is illustrated, unless absence of duplication of elements is expressly described or clearly indicated other-wise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements hav-ing the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, an element located "on" a second element can be located on the exterior side of a surface of the second element or on the interior side of the second element. As used herein, an element is located "directly on" a second element if there exist a physical contact between a surface of the element and a surface of the second element. As used herein, an element is "electrically connected to" a second element if there exists a conductive path consisting of at least one conductive material between the element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered sur-face. A substrate may be a layer, may include one or more layers therein, or may have one or more layer thereupon, thereabove, and/or therebelow.

Generally, a semiconductor die, or a semiconductor pack-age, can include a memory chip. Each semiconductor pack-age contains one or more dies (for example one, two, or four). The die is the smallest unit that can independently execute commands or report status. Each die contains one or more planes (typically one or two). Identical, concurrent operations can take place on each plane, although with some restrictions. Each plane contains a number of blocks, which are the smallest unit that can be erased in a single erase operation. Each block contains a number of pages, which are the smallest unit that can be programmed, i.e., a smallest unit on which a read operation can be performed.

As used herein, a "semiconducting material" refers to a material having electrical conductivity in the range from $1.0 \times 10^{-5}$ S/m to $1.0 \times 10^5$ S/m. As used herein, a "semicon-ductor material" refers to a material having electrical con-ductivity in the range from $1.0 \times 10^{-5}$ S/m to 1.0 S/m in the absence of electrical dopants therein, and is capable of producing a doped material having electrical conductivity in a range from 1.0 S/m to $1.0 \times 10^7$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/m. As used herein, an "insulator material" or a "dielectric material" refers to a material having electrical conductivity less than $1.0 \times 10^{-5}$ S/m. As used herein, a "heavily doped semiconductor material" refers to a semi-conductor material that is doped with electrical dopant at a sufficiently high atomic concentration to become a conduc-tive material either as formed as a crystalline material or if converted into a crystalline material through an anneal process (for example, from an initial amorphous state), i.e., to provide electrical conductivity greater than $1.0 \times 10^5$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-5}$ S/m to $1.0 \times 10^7$ S/m. An "intrinsic semiconductor material" refers to a semicon-ductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

Referring to FIG. 1, a first exemplary structure according to a first embodiment of the present disclosure is illustrated. The first exemplary structure comprises a carrier substrate 9, which may be a semiconductor substrate or a conductive substrate. For example, the carrier substrate 9 may comprise a commercially available silicon wafer. Alternatively, the carrier substrate 9 may comprise any material that may be removed selective the materials of insulating layers 32 and dielectric material portions to be subsequently formed.

An alternating stack of first material layers and second material layers can be formed over the carrier substrate 9. The first material layers may be insulating layers, and the second material layers may be spacer material layers. In one embodiment, the spacer material layers may comprise sacrificial material layers 42. In this case, an alternating stack (32, 42) of insulating layers 32 and sacrificial material layers 42 can be formed over the carrier substrate 9. The insulating layers 32 comprise an insulating material such as undoped silicate glass or a doped silicate glass, and the sacrificial material layers 42 comprise a sacrificial material such as silicon nitride or a silicon-germanium alloy. In one embodiment, the insulating layers 32 (i.e., the first material layers) may comprise silicon oxide layers, and the sacrificial material layers 42 (i.e., the second material layers) may comprise silicon nitride layers.

The alternating stack (32, 42) may comprise multiple repetitions of a unit layer stack including an insulating layer 32 and a sacrificial material layer 42. The total number of repetitions of the unit layer stack within the alternating stack (32, 42) may be, for example, in a range from 8 to 1,024, such as from 32 to 256, although lesser and greater number of repetitions may also be employed. The topmost one of the insulating layers 32 is hereafter referred to as a topmost insulating layer 32T. The bottommost one of the insulating layers 32 is an insulating layer 32 that is most proximal to the carrier substrate 9 is herein referred to as a bottommost insulating layer 32B.

Each of the insulating layers 32 other than the topmost insulating layer 32 may have a thickness in a range from 20 nm to 100 nm, such as from 30 nm to 60 nm, although lesser and greater thicknesses may also be employed. Each of the sacrificial material layers 42 may have a thickness in a range from 20 nm to 100 nm, such as from 30 nm to 60 nm, although lesser and greater thicknesses may also be employed. In one embodiment, the topmost insulating layer 32 may have a thickness of about one half of the thickness of other insulating layers 32.

The first exemplary structure comprises a memory array region 100 in which a three-dimensional array of memory elements is to be subsequently formed, and a contact region 300 in which layer contact via structures contacting word lines are to be subsequently formed.

While an embodiment is described in which the spacer material layers are formed as sacrificial material layers 42, the spacer material layers may be formed as electrically conductive layers in an alternative embodiment. Generally, spacer material layers of the present disclosure may be formed as, or may be subsequently replaced at least partly with, electrically conductive layers.

Figure 2:
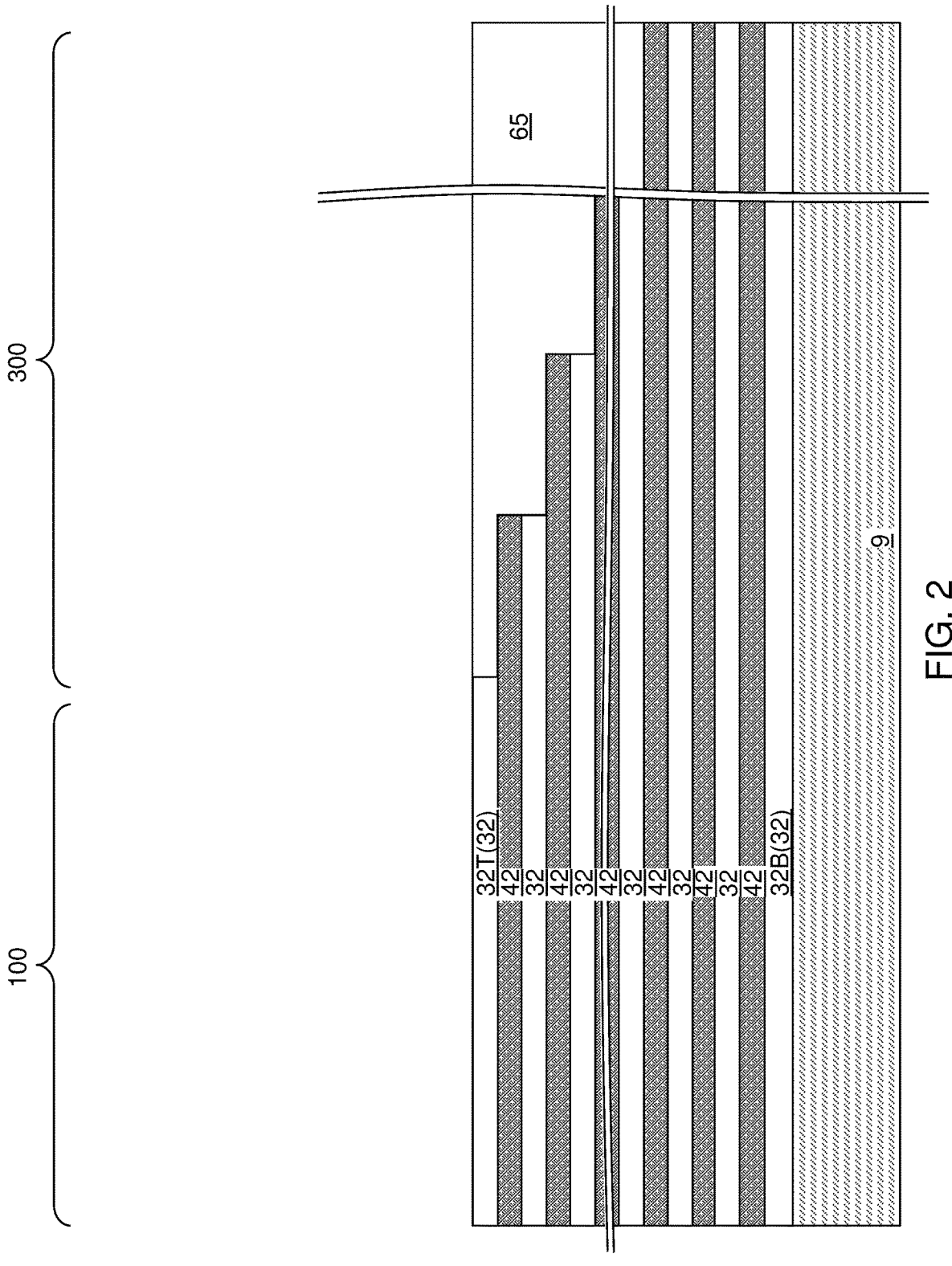
FIG. 2 is a schematic vertical cross-sectional view of the first exemplary structure after formation of stepped surfaces and a stepped dielectric material portion according to the first embodiment of the present disclosure.

Referring to FIG. 2, optional stepped surfaces are formed in the contact region 300. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A stepped cavity is formed within the volume from which portions of the alternating stack (32, 42) are removed through formation of the stepped surfaces. A "stepped cavity" refers to a cavity having stepped surfaces.

The stepped cavity can have various stepped surfaces such that the horizontal cross-sectional shape of the stepped cavity changes in steps as a function of the vertical distance from the top surface of the carrier substrate 9. In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Each sacrificial material layer 42 other than a topmost sacrificial material layer 42 within the alternating stack (32, 42) laterally extends farther than any overlying sacrificial material layer 42 within the alternating stack (32, 42) in the terrace region. The stepped surfaces of the alternating stack (32, 42) continuously extend from a bottommost layer within the alternating stack (32, 42) (such as the bottommost insulating layer 32B) to a topmost layer within the alternating stack (32, 42) (such as the topmost insulating layer 32T).

A stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the topmost insulating layer 32T, for example, by chemical mechanical planarization (CMP). The remaining portion of the deposited dielectric material filling the stepped cavity constitutes the stepped dielectric material portion 65. As used herein, a "stepped" element refers to an element that has stepped surfaces and a horizontal cross-sectional area that increases or decreases stepwise as a function of a vertical distance from a top surface of a substrate on which the element is present. If silicon oxide is employed for the stepped dielectric material portion 65, the silicon oxide of the stepped dielectric material portion 65 may, or may not, be doped with dopants such as B, P, and/or F.

Figure 3:
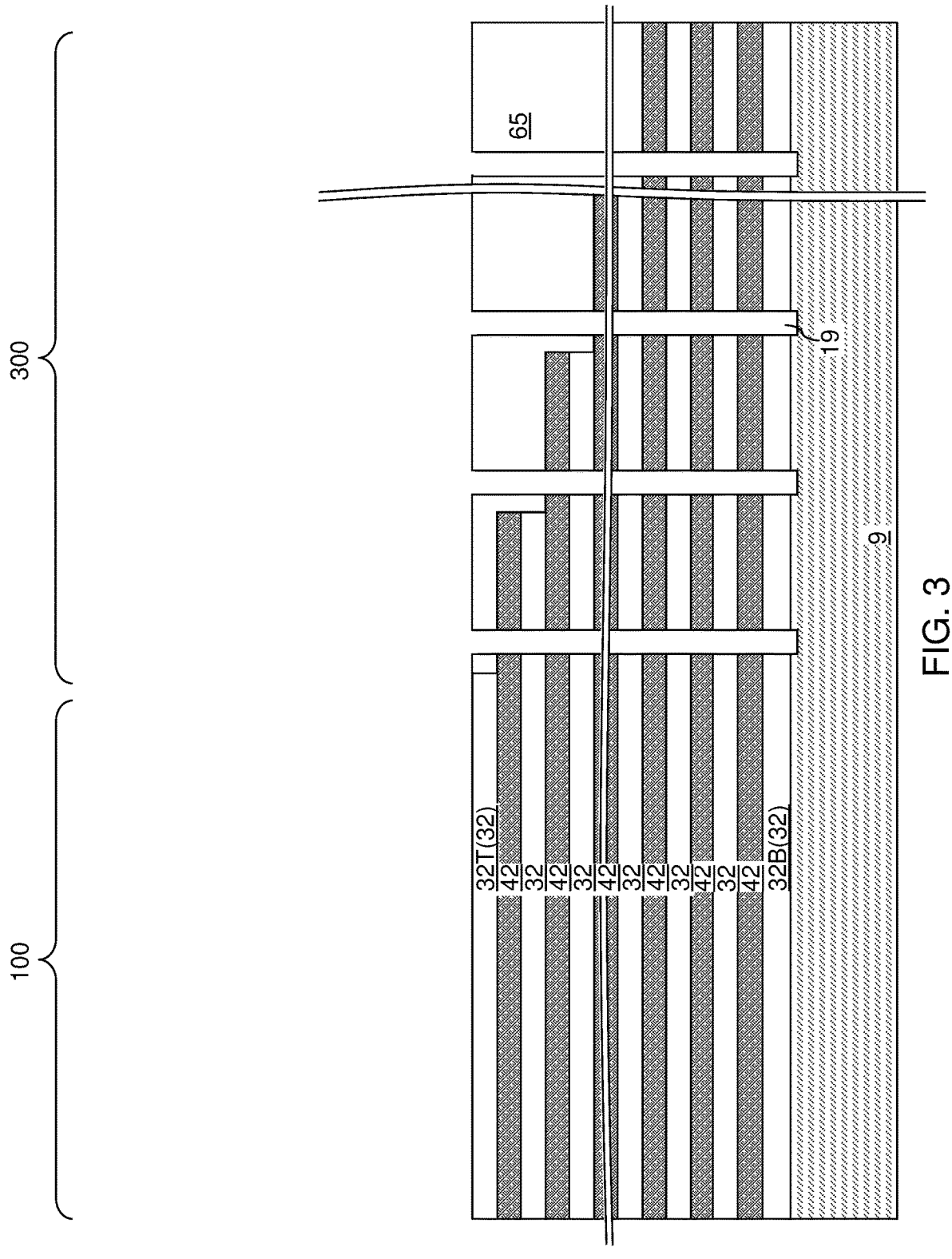
FIG. 3 is a schematic vertical cross-sectional view of the first exemplary structure after formation of support openings according to the first embodiment of the present disclosure.

Referring to FIG. 3, an optional first etch mask layer (such as a photoresist layer) can be formed over the alternating stack (32, 42), and can be lithographically patterned to form openings in the contact region 300. An anisotropic etch process can be performed to transfer the pattern of the openings in the first etch mask layer through the stepped dielectric material portion 65 and the alternating stack (32, 42). Support openings 19 can optionally be formed through the stepped dielectric material portion 65 and the alternating stack (32, 42) in the contact region 300. Each of the support openings 19 can vertically extend into the carrier substrate 9. In one embodiment, bottom surfaces of the support openings 19 may be formed at or below the top surface of the carrier substrate 9. The support openings 19 may have a diameter in a range from 60 nm too 400 nm, such as from 120 nm to 300 nm, although lesser and greater thicknesses may be employed.

Figure 4:
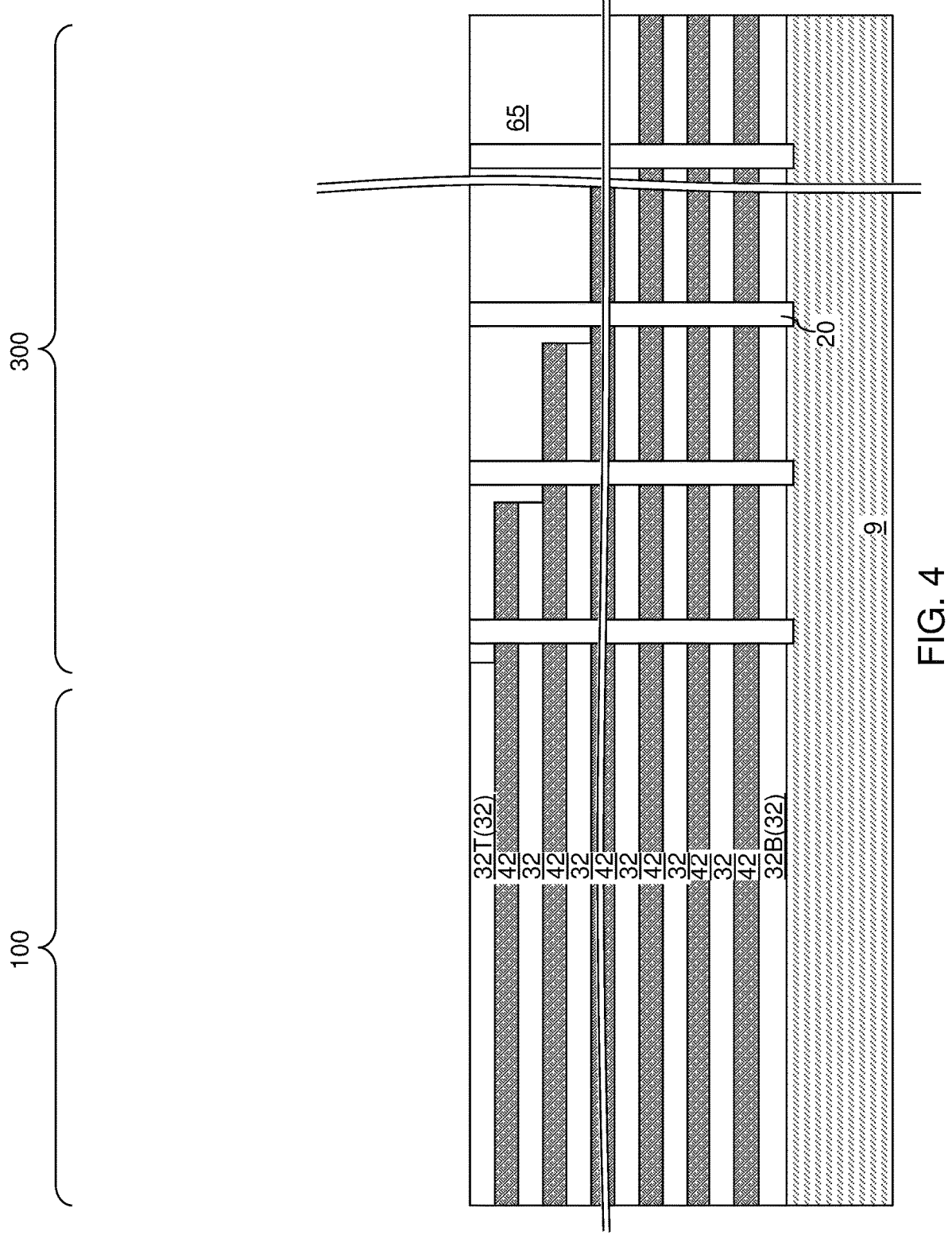
FIG. 4 is a vertical cross-sectional view of the first exemplary structure after formation of support pillar structures according to the first embodiment of the present disclosure.

Referring to FIG. 4, a dielectric fill material, such as silicon oxide, can be deposited in the support openings 19 by a conformal deposition process. Excess portions of the dielectric fill material can be removed from above the top surface of the topmost insulating layer 32T, for example, by a recess etch process. Each portion of the dielectric fill material that fills a respective support opening 19 constitutes a support pillar structure 20, which can be employed to provide structural support to the insulating layers 32 and the stepped dielectric material portion 65 during replacement of the sacrificial material layers 42 with electrically conductive layers. Alternatively, the support openings 19 can be formed at a later step at the same time as the memory openings, and the support pillar structures 20 can be formed in the support openings 19 at the same time as the memory opening fill structures are formed in the memory openings, as will be described below.

Figure 5A:
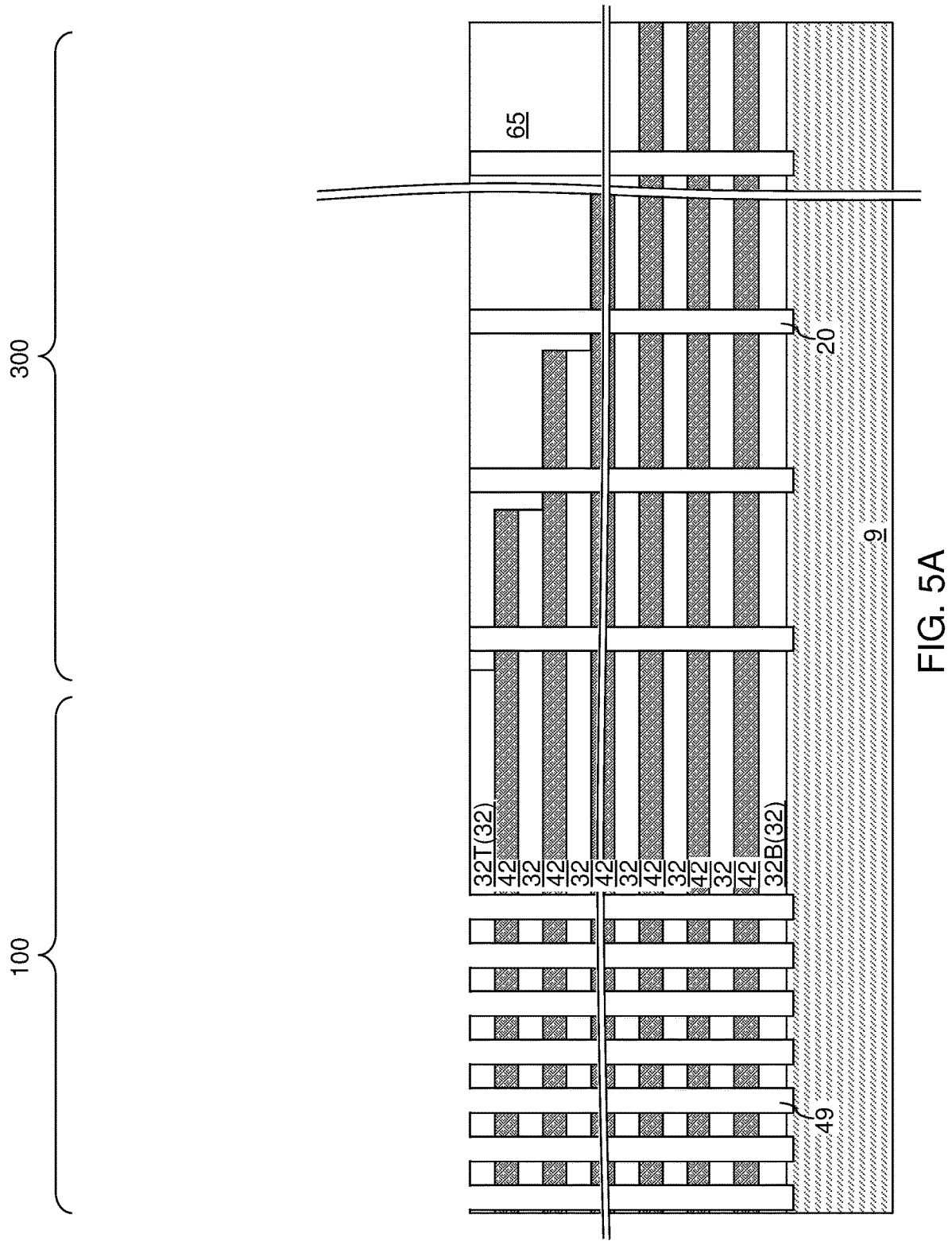
FIG. 5A is a schematic vertical cross-sectional view of the first exemplary structure after formation of memory openings according to the first embodiment of the present disclosure.
Figure 5B:
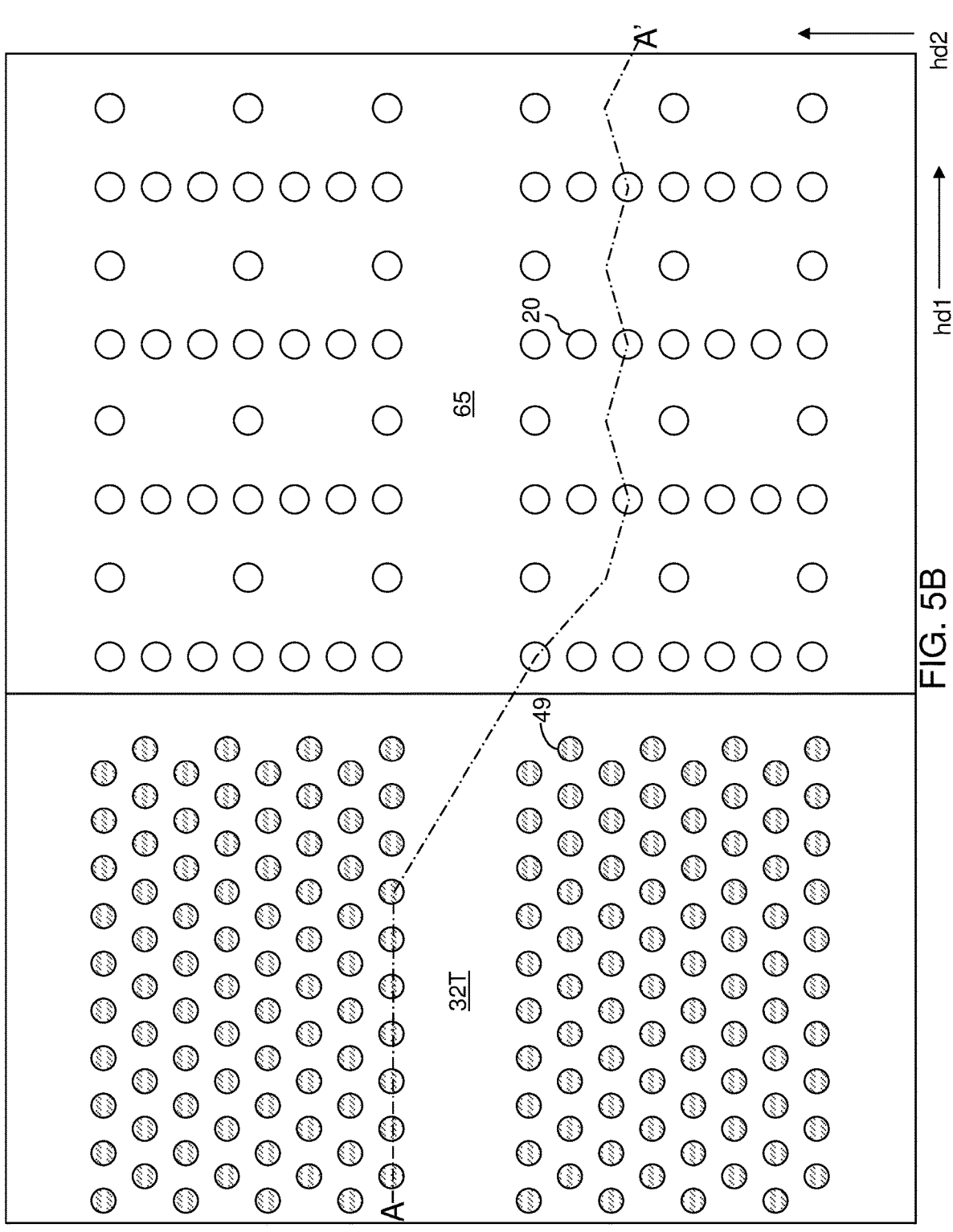
FIG. 5B is a top-down view of the first exemplary structure of FIG. 5A. The vertical plane A-A is the cut plane of the vertical cross-sectional view of FIG. 5A.

Referring to FIGS. 5A and 5B, a second etch mask layer (such as a photoresist layer) can be formed over the alternating stack (32, 42), and can be lithographically patterned to form openings in the memory array region 100. An anisotropic etch process can be performed to transfer the pattern of the openings in the second etch mask layer through the alternating stack (32, 42). Memory openings 49 can be formed through the alternating stack (32, 42) in the memory array region 100. Each of the memory openings 49 can vertically extend at least to a top surface of the carrier substrate 9. In one embodiment, bottom surfaces of the memory openings 49 may be formed at or below the top surface of the carrier substrate 9. Each cluster of memory openings 49 may comprise a plurality of rows of memory openings 49. Each row of memory openings 49 may comprise a plurality of memory openings 49 that are arranged along the first horizontal direction hd1 with a uniform pitch. The rows of memory openings 49 may be laterally spaced among one another along the second horizontal direction hd2, which may be perpendicular to the first horizontal direction hd2. In one embodiment, each cluster of memory openings 49 may be formed as a two-dimensional periodic array of memory openings 49. The memory openings 49 may have a diameter in a range from 60 nm too 400 nm, such as from 120 nm to 300 nm, although lesser and greater thicknesses may be employed. In the alternative embodiment, the support openings 19 are formed at the same time as the memory openings 49 using the same patterned photoresist layer.

FIGS. 6A-6F are sequential vertical cross-sectional views of a memory opening 49 during formation of a memory opening fill structure 58 according to an embodiments of the present disclosure.

Figures 6A, 6B:
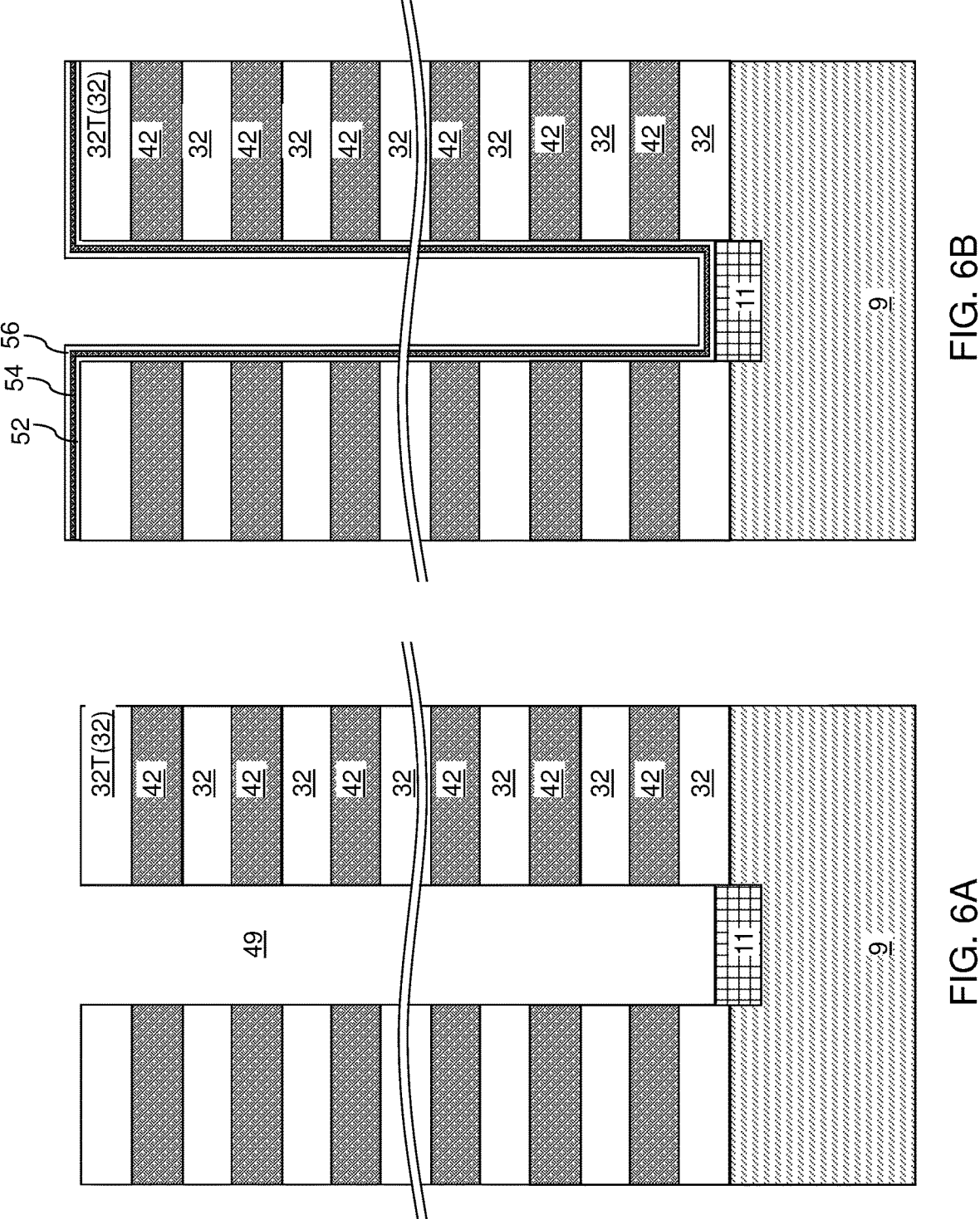
FIGS. 6A-6F are sequential vertical cross-sectional views of a memory opening during formation of a memory opening fill structure according to an embodiments of the present disclosure.

Referring to FIG. 6A, sacrificial pedestal structures 11 can be formed at the bottom of each of the memory openings 49. In an embodiment in which the carrier substrate 9 comprises a semiconductor material (such as single crystalline silicon), the sacrificial pedestal structures 11 may comprise a semiconductor material, such as single crystalline silicon, and can be formed by selective growth of the semiconductor material from physically exposed surfaces of the carrier substrate 9. A selective semiconductor deposition process, such as a selective epitaxy process may be employed to form the sacrificial pedestal structures 11.

Referring to FIG. 6B, a layer stack including a memory material layer 54 can be conformally deposited. In an illustrative example, the layer stack may comprise an optional blocking dielectric layer 52, the memory material layer 54, and an optional dielectric liner 56. The memory material layer 54 includes a memory material, i.e., a material that can store data bits therein. The memory material layer 54 may comprise a charge storage material (such as silicon nitride), a ferroelectric material, a phase change memory material, or any other memory material that can store data bits by inducing a change in the electrical resistivity, ferroelectric polarization, or any other measurable physical property. In case the memory material layer 54 comprises a charge storage material, the optional dielectric liner 56 may comprise a tunneling dielectric layer.

Figures 6C, 6D:
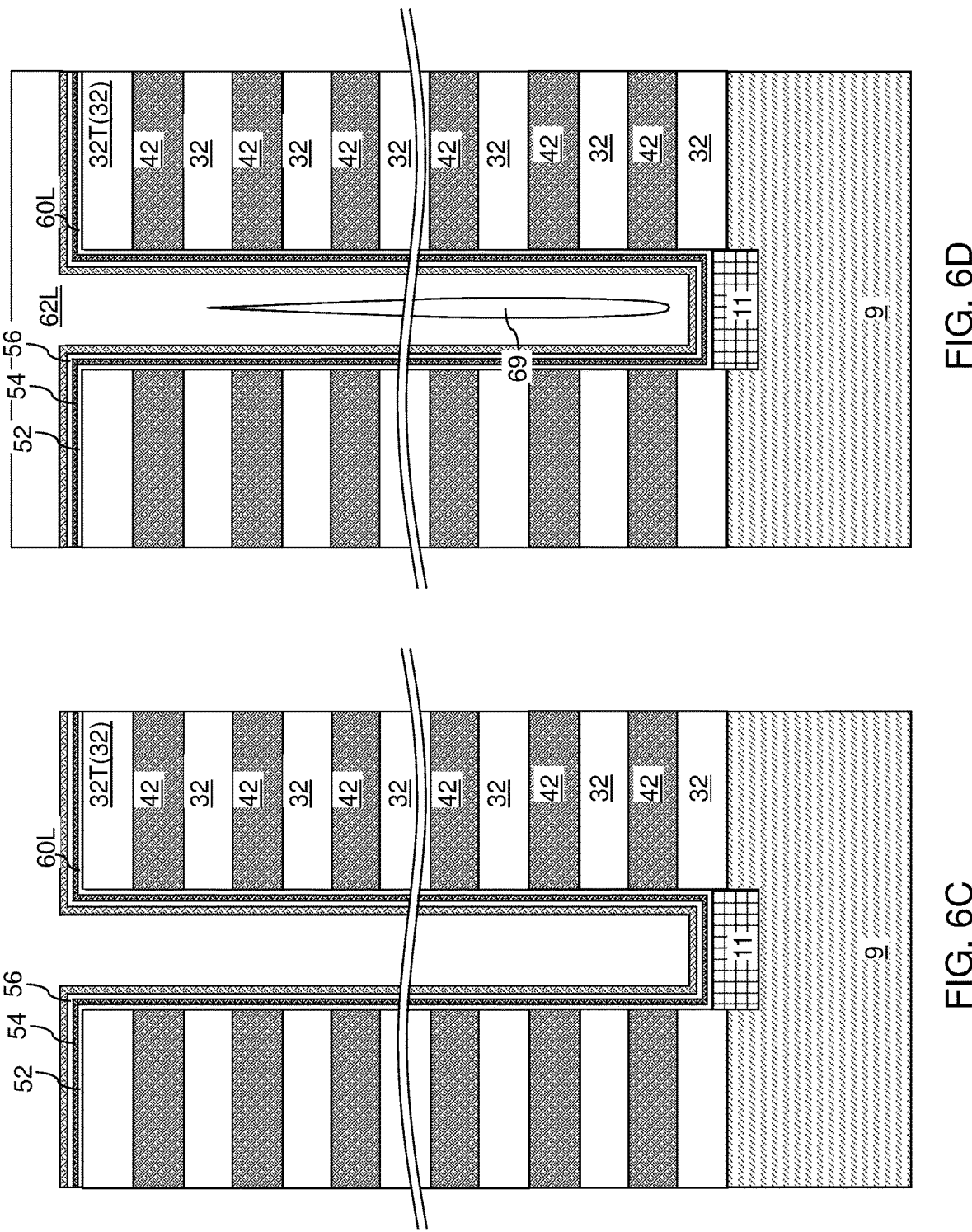

Referring to FIG. 6C, a semiconductor channel material layer 60L can be deposited over each memory film 50 by performing a conformal deposition process. If the semiconductor channel material layer 60L is doped, the semiconductor channel material layer 60L may have a doping of a first conductivity type, which may be p-type or n-type.

Referring to FIG. 6D, a dielectric core layer 62L comprising a dielectric fill material, such as silicon oxide, can be deposited in remaining volumes of the memory openings 49. While the dielectric core layer 62L can be deposited employing a conformal deposition process, such as a chemical vapor deposition process, the conformity of the conformal deposition process may not be perfect. Thus, the thickness of a bottom portion of the dielectric core layer 62L at the bottom of each memory opening 49 may be less than the thickness of an upper portion of the dielectric core layer 62L at the top of each memory opening 49. Cavities or seams can be formed in a bottom portion of each memory opening 49 that is not filled with the dielectric fill material of the dielectric core layer 62L. The cavities are herein referred to as core cavities 69. The core cavities 69 may vertically extend through a subset of layers of the alternating stack (32, 42) located at a bottom portion of the alternating stack (32, 42), and may have a variable lateral extent that generally decreases with a vertical distance from the horizontal plane including the top surface of the carrier substrate 9.

Figures 6E, 6F:
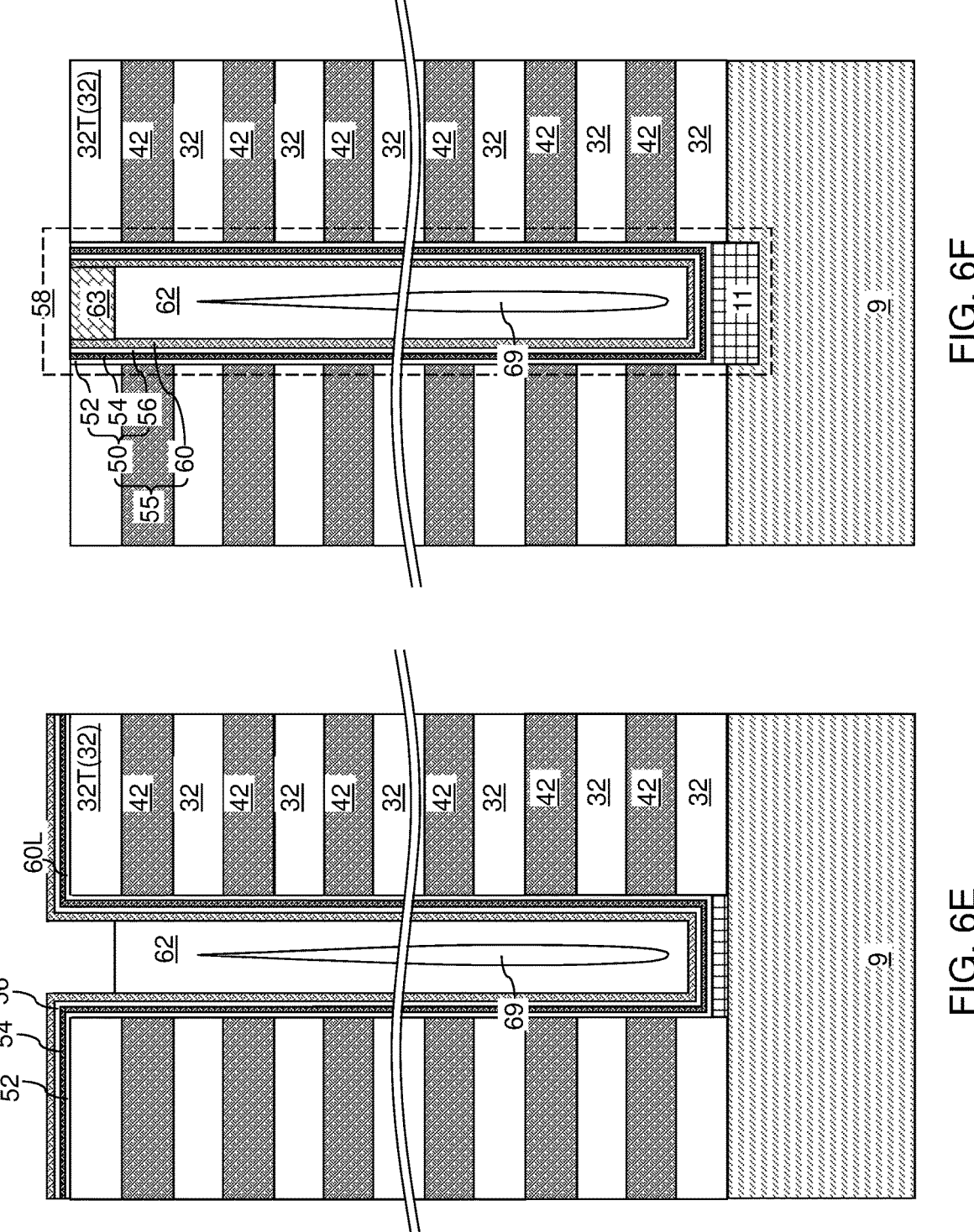

Referring to FIG. 6E, the dielectric core layer 62L can be vertically recessed such that each remaining portion of the dielectric core layer has a top surface at, or about, the horizontal plane including the bottom surface of the topmost insulating layers 32. Each remaining portion of the dielectric core layer constitutes a dielectric core 62.

Referring to FIG. 6F, a doped semiconductor material having a doping of a second conductivity type can be deposited within each recessed region above the dielectric cores 62. The second conductivity type is the opposite of the first conductivity type. For example, if the first conductivity type is p-type, the second conductivity type is n-type, and vice versa. The dopant concentration in the deposited semiconductor material can be in a range from $5.0 \times 10^{18}/\text{cm}^3$ to $2.0 \times 10^{21}/\text{cm}^3$, although lesser and greater dopant concentrations can also be employed. The doped semiconductor material can be, for example, doped polysilicon.

Excess portions of the deposited semiconductor material having a doping of the second conductivity type and a horizontal portion of the semiconductor channel layer 60L can be removed from above the horizontal plane including the top surface of the topmost insulating layer 32T, for example, by chemical mechanical planarization (CMP) or a recess etch process. Each remaining portion of the doped semiconductor material having a doping of the second conductivity type constitutes a drain region 63. Each remaining portion of the semiconductor channel layer 60L (which has a doping of the first conductivity type) constitutes a vertical semiconductor channel 60.

Each portion of the layer stack including the memory material layer 54 that remains in a respective memory opening 49 constitutes a memory film 50. In one embodiment, a memory film 50 may comprise an optional blocking dielectric layer 52, a memory material layer 54, and an optional dielectric liner 56. Each contiguous combination of a memory film 50 and a vertical semiconductor channel 60 constitutes a memory stack structure 55. Each combination of a sacrificial pedestal structure 11 if present), a memory stack structure 55, a dielectric core 62, an optional core cavity 69 (if present), and a drain region 63 within a memory opening 49 constitutes a memory opening fill structure 58. Each memory opening fill structure 58 comprises a respective vertical stack of memory elements, which may comprise portions of the memory material layer 54 located at levels of the sacrificial material layers 42, or generally speaking, at levels of spacer material layers that may be formed as, or may be subsequently replaced at least partly with, electrically conductive layers. In the alternative embodiment, the support pillar structures 20 may be formed in the support openings 19 at the same time as the memory opening fill structures 58 are formed in the memory openings 49. In this case, the support pillar structures 20 comprise the same materials as the memory opening fill structures 58.

Figure 7A:
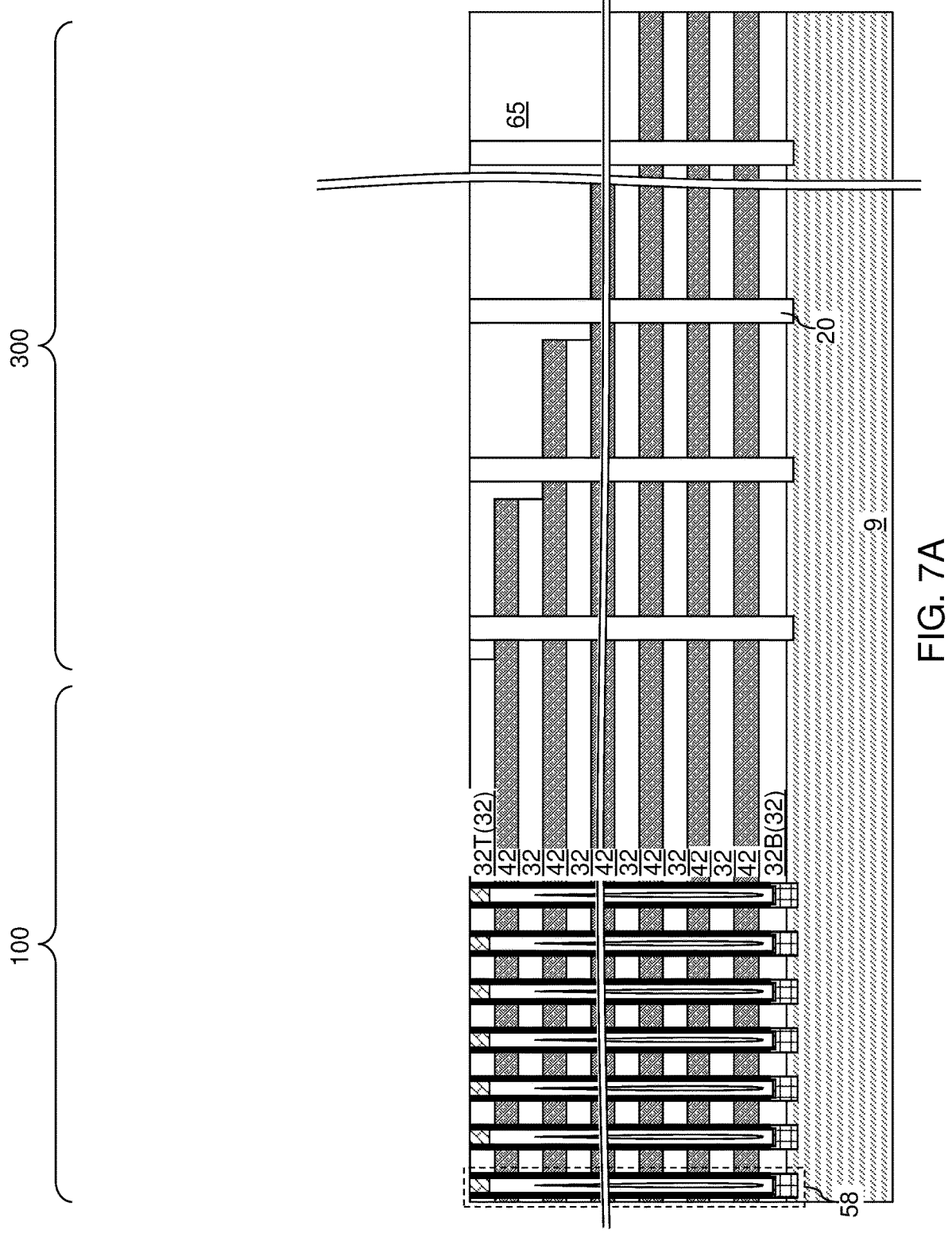
FIG. 7A is a schematic vertical cross-sectional view of the first exemplary structure after formation of memory opening fill structures according to the first embodiment of the present disclosure.
Figure 7B:
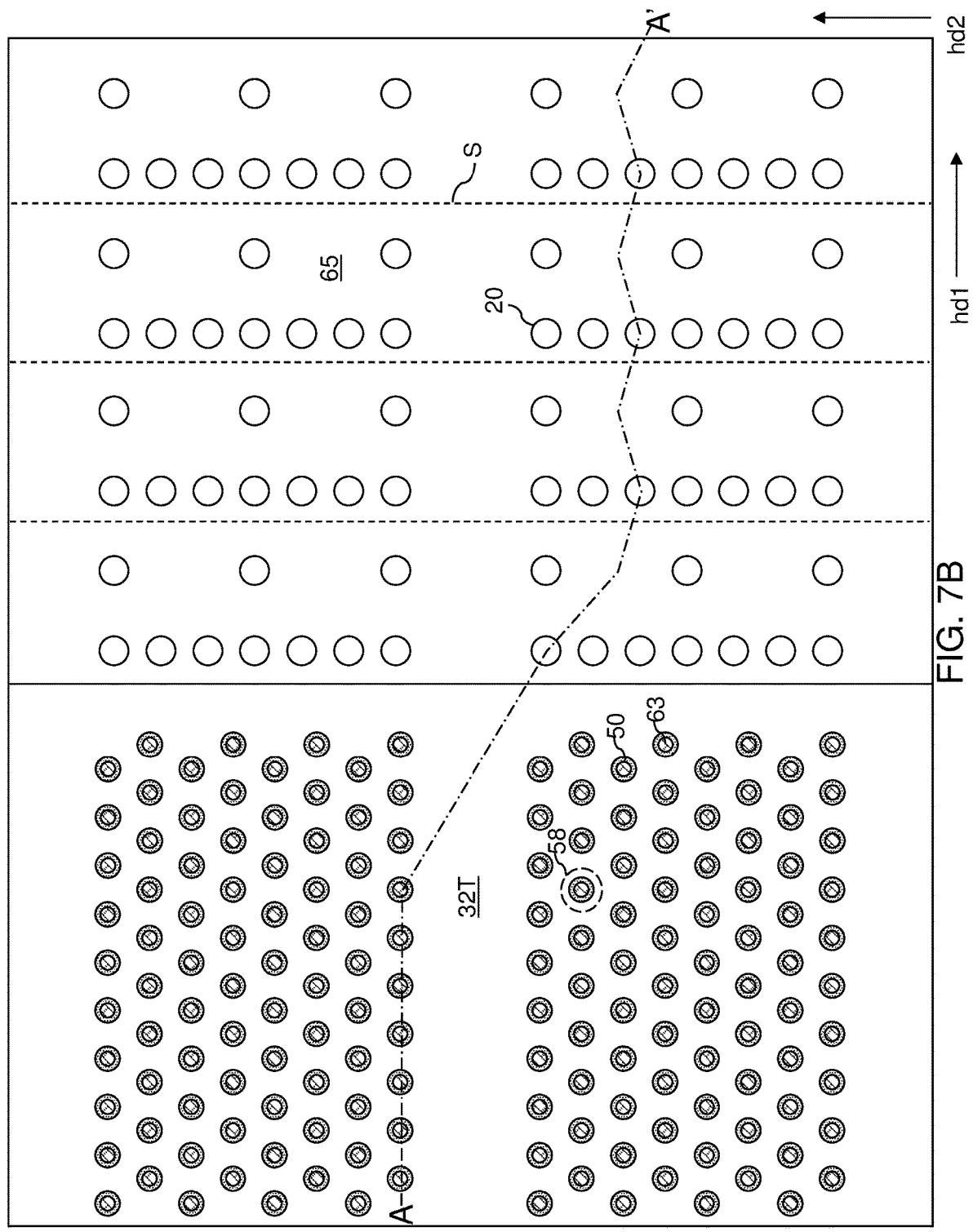
FIG. 7B is a top-down view of the first exemplary structure of FIG. 7A. The vertical plane A-A is the cut plane of the vertical cross-sectional view of FIG. 7A.

Referring to FIGS. 7A and 7B, the first exemplary structure is illustrated after formation of memory opening fill structures 58 within the memory openings 49. The memory opening fill structures 58 are located in the memory openings 49. Each of the memory opening fill structures 58 comprises a respective memory film 50 and a respective vertical semiconductor channel 60.

Figure 8A:
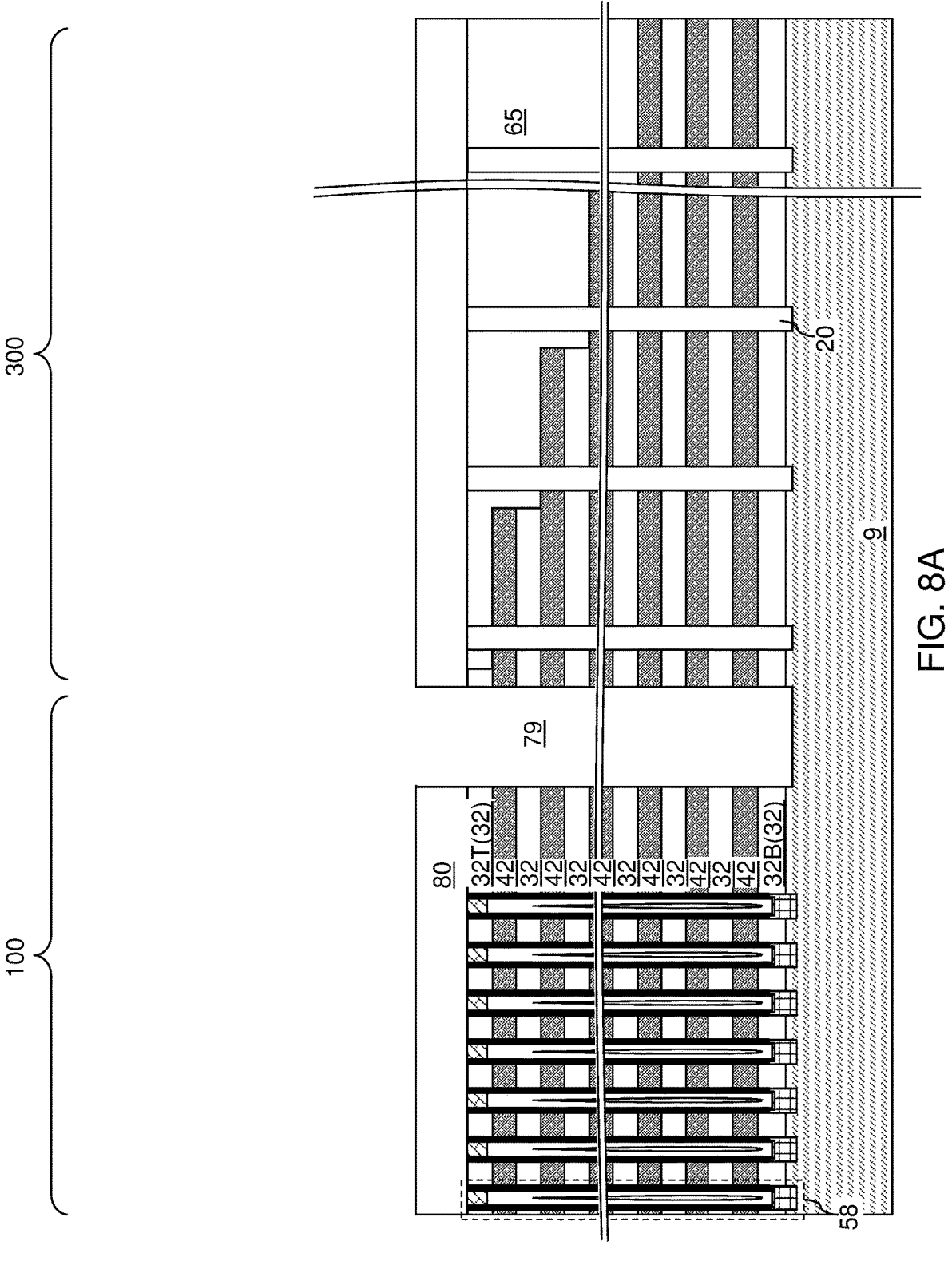
FIG. 8A is a vertical cross-sectional view of the first exemplary structure after formation of lateral isolation trenches according to the first embodiment of the present disclosure.
Figure 8B:
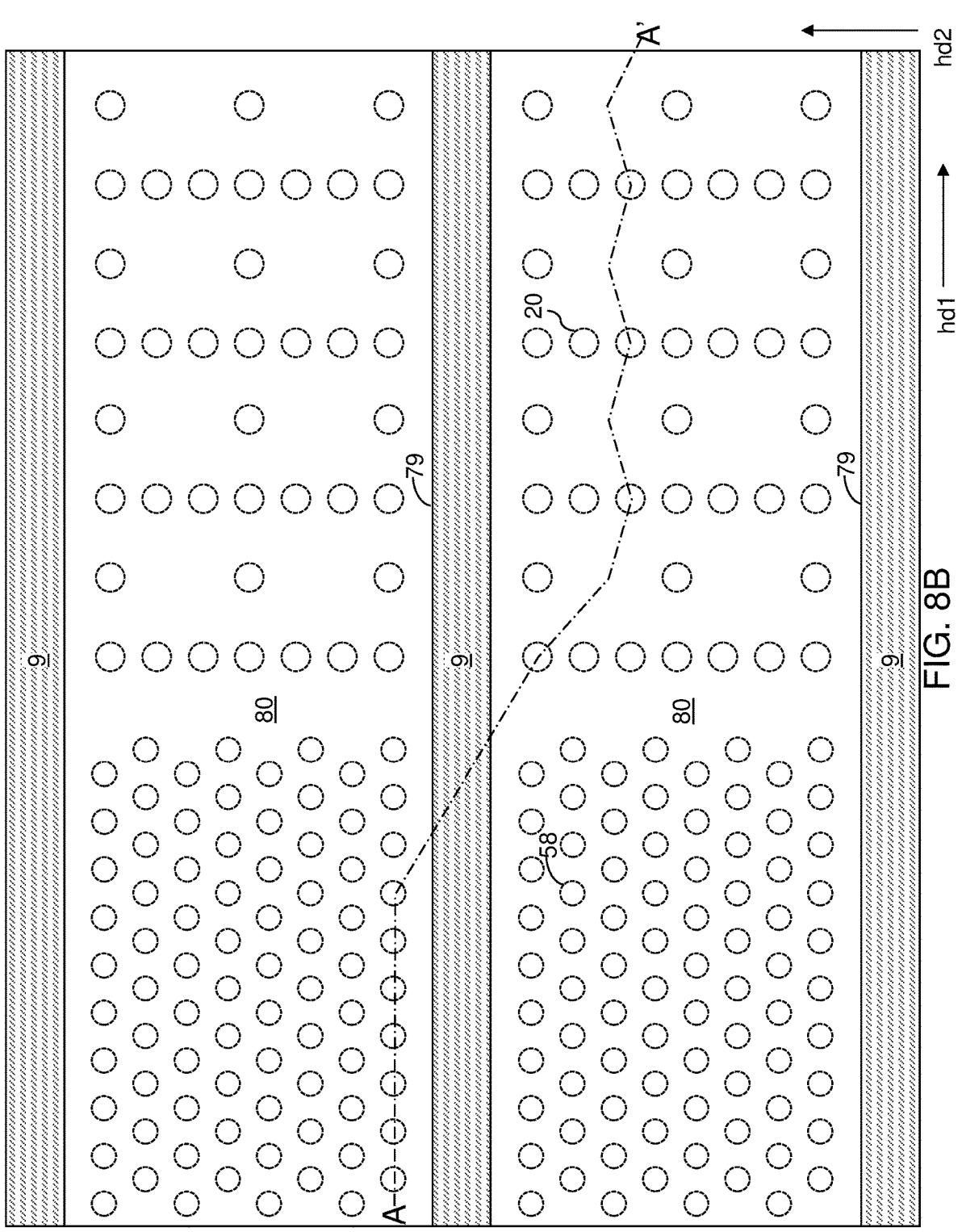
FIG. 8B is a top-down view of the first exemplary structure of FIG. 8A. The vertical plane A-A is the cut plane of the vertical cross-sectional view of FIG. 8A.

Referring to FIGS. 8A and 8B, a dielectric material, such as undoped silicate glass (i.e., silicon oxide) or a doped silicate glass can be deposited over the alternating stack (32, 42) to form a contact-level dielectric layer 80. The thickness of the contact-level dielectric layer 80 may be in a range from 100 nm to 600 nm, such as from 200 nm to 400 nm, although lesser and greater thicknesses may also be employed.

A photoresist layer (not shown) can be applied over the contact-level dielectric layer 80, and can be lithographically patterned to form elongated openings that laterally extend along the first horizontal direction hd1 between neighboring clusters of memory opening fill structures 58. An anisotropic etch process can be performed to transfer the pattern of the openings in the photoresist layer through the contact-level dielectric layer 80, the alternating stack (32, 42), and the stepped dielectric material portion 65, and at least to a top surface of the carrier substrate 9. Lateral isolation trenches 79 laterally extending along the first horizontal direction hd1 can be formed through the alternating stack (32, 42), the stepped dielectric material portion 65, and the contact-level dielectric layer 80. Each of the lateral isolation trenches 79 may comprise a respective pair of lengthwise sidewalls that are parallel to the first horizontal direction hd1 and vertically extend from the carrier substrate 9 to the top surface of the contact-level dielectric layer 80. A surface of the carrier substrate 9 can be physically exposed underneath each lateral isolation trench 79. The photoresist layer can be subsequently removed, for example, by ashing.

Figure 9:
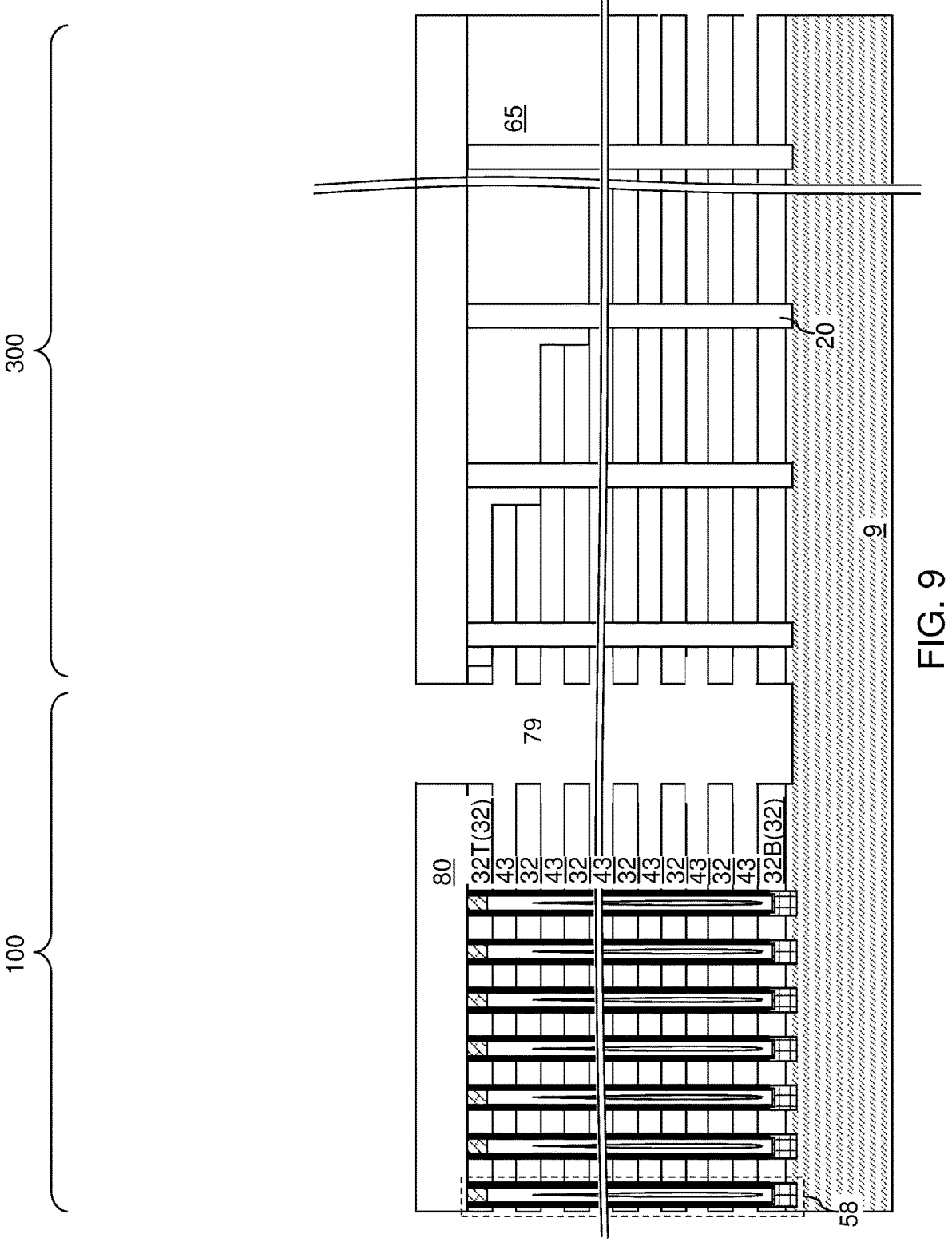
FIG. 9 is a vertical cross-sectional view of the first exemplary structure after formation of laterally-extending cavities according to the first embodiment of the present disclosure.

Referring to FIG. 9, an etchant that selectively etches the material of the sacrificial material layers 42 with respect to the material of the insulating layers 32 can be introduced into the access trenches 79, for example, employing an isotropic etch process. Lateral recesses 43 are formed in volumes from which the sacrificial material layers 42 are removed. The removal of the sacrificial material layers 42 can be selective to the materials of the insulating layers 32, the stepped dielectric material portion 65, and the material of the outermost layer of the memory films 50. In one embodiment, the sacrificial material layers 42 can include silicon nitride, and the materials of the insulating layers 32 and the stepped dielectric material portion 65 can include silicon oxide.

The etch process that removes the second material selective to the first material and the outermost layer of the memory films 50 can be a wet etch process employing a wet etch solution, or can be a gas phase (dry) etch process in which the etchant is introduced in a vapor phase into the access trenches 79. For example, if the sacrificial material layers 42 include silicon nitride, the etch process can be a wet etch process in which the first exemplary structure is immersed within a wet etch tank including phosphoric acid, which etches silicon nitride selective to silicon oxide, silicon, and various other materials employed in the art. The support pillar structure 20, the stepped dielectric material portion 65, and the memory stack structures 55 provide structural support while the lateral recesses 43 are present within volumes previously occupied by the sacrificial material layers 42.

Each lateral recess 43 can be a laterally extending cavity having a lateral dimension that is greater than the vertical extent of the cavity. In other words, the lateral dimension of each lateral recess 43 can be greater than the height of the lateral recess 43. A plurality of lateral recesses 43 can be formed in the volumes from which the second material of the sacrificial material layers 42 is removed. The memory openings in which the memory stack structures 55 are formed are herein referred to as front side openings or front side cavities in contrast with the lateral recesses 43.

Each of the plurality of lateral recesses 43 can extend substantially parallel to the top surface of the carrier substrate 9. A lateral recess 43 can be vertically bounded by a top surface of an underlying insulating layer 32 and a bottom surface of an overlying insulating layer 32. In one embodiment, each lateral recess 43 can have a uniform height throughout.

Figure 10:
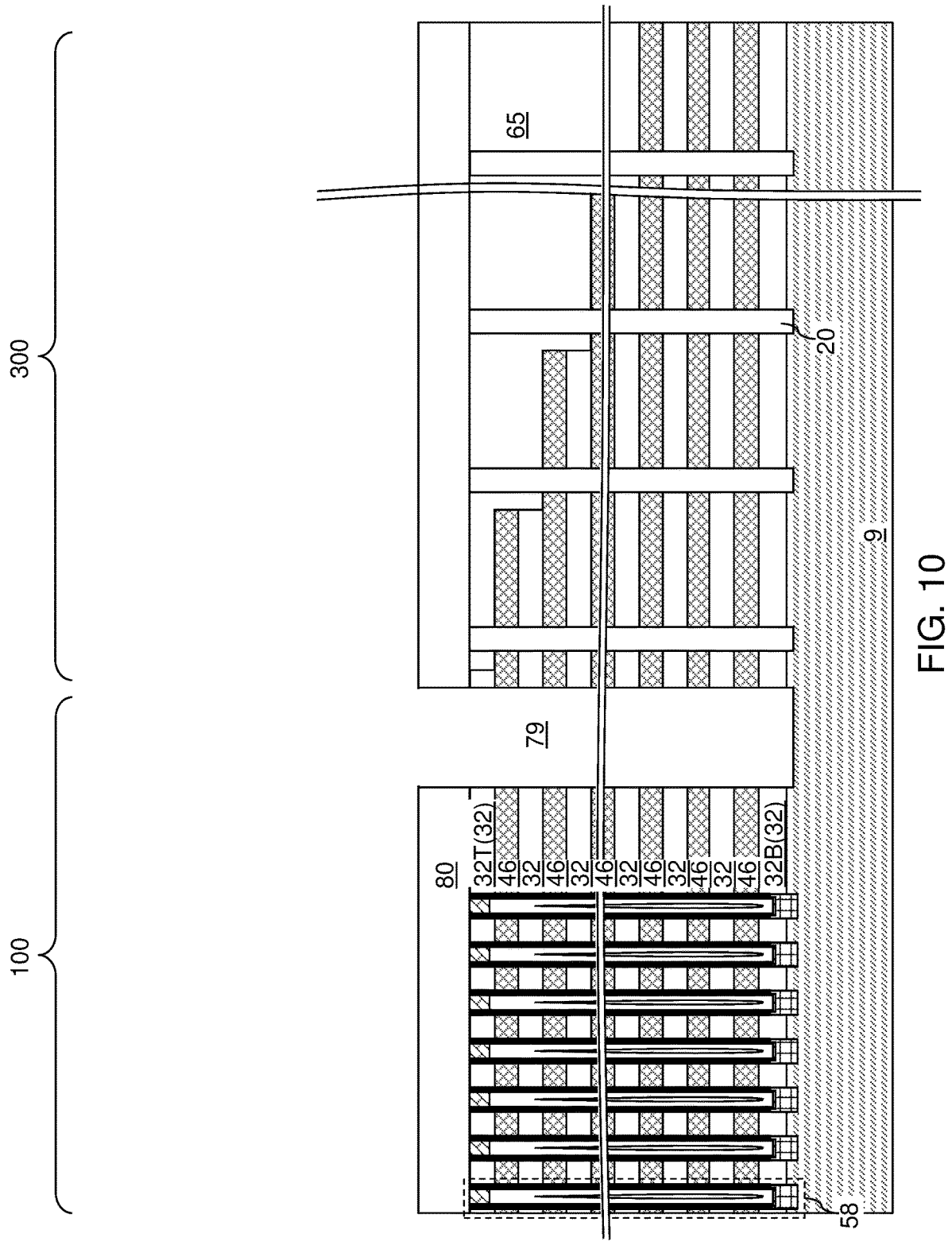
FIG. 10 is a schematic vertical cross-sectional view of the first exemplary structure after formation of electrically conductive layers according to the first embodiment of the present disclosure.

Referring to FIG. 10, an outer blocking dielectric layer (not expressly illustrated in FIG. 10) can be optionally formed. The outer blocking dielectric layer, if present, comprises a dielectric material that functions as a control gate dielectric for the control gates to be subsequently formed in the lateral recesses 43. In case the blocking dielectric layer 52 is present within each memory opening, the outer blocking dielectric layer is optional. In case the blocking dielectric layer 52 is omitted, the outer blocking dielectric layer is present.

At least one conductive material can be deposited in the lateral recesses 43 by providing at least one reactant gas into the lateral recesses 43 through the access trenches 79. A metallic barrier layer can be deposited in the lateral recesses 43. The metallic barrier layer includes an electrically conductive metallic material that can function as a diffusion barrier layer and/or adhesion promotion layer for a metallic fill material to be subsequently deposited. The metallic barrier layer can include a conductive metallic nitride material such as TiN, TaN, WN, or a stack thereof, or can include a conductive metallic carbide material such as TiC, TaC, WC, or a stack thereof. In one embodiment, the metallic barrier layer can be deposited by a conformal deposition process such as chemical vapor deposition (CVD) or atomic layer deposition (ALD). The thickness of the metallic barrier layer can be in a range from 2 nm to 8 nm, such as from 3 nm to 6 nm, although lesser and greater thicknesses can also be employed. In one embodiment, the metallic barrier layer can consist essentially of a conductive metal nitride such as TiN.

A metal fill material is deposited in the plurality of lateral recesses 43, on the sidewalls of the at least one the access trench 79, and over the top surface of the contact-level dielectric layer 80 to form a metallic fill material layer. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer can consist essentially of at least one elemental metal. The at least one elemental metal of the metallic fill material layer can be selected, for example, from tungsten, cobalt, ruthenium, titanium, and tantalum. In one embodiment, the metallic fill material layer can consist essentially of a single elemental metal. In one embodiment, the metallic fill material layer can be deposited employing a fluorine-containing precursor gas such as $WF_6$. In one embodiment, the metallic fill material layer can be a tungsten layer including a residual level of fluorine atoms as impurities. The metallic fill material layer is spaced from the insulating layers 32 and the memory stack structures 55 by the metallic barrier layer, which is a metallic barrier layer that blocks diffusion of fluorine atoms therethrough.

A plurality of electrically conductive layers 46 can be formed in the plurality of lateral recesses 43, and a continuous metallic material layer can be formed on the sidewalls of each access trench 79 and over the contact-level dielectric layer 80. Each electrically conductive layer 46 includes a portion of the metallic barrier layer and a portion of the metallic fill material layer that are located between a vertically neighboring pair of dielectric material layers such as a pair of insulating layers 32. The continuous metallic material layer includes a continuous portion of the metallic barrier layer and a continuous portion of the metallic fill material layer that are located in the access trenches 79 or above the contact-level dielectric layer 80.

The deposited metallic material of the continuous electrically conductive material layer is etched back from the sidewalls of each access trench 79 and from above the contact-level dielectric layer 80 by performing an isotropic etch process that etches the at least one conductive material of the continuous electrically conductive material layer. Each remaining portion of the deposited metallic material in the lateral recesses 43 constitutes an electrically conductive layer 46. Each electrically conductive layer 46 can be a conductive line structure. Thus, the sacrificial material layers 42 are replaced with the electrically conductive layers 46. Generally, the electrically conductive layers 46 can be formed by providing a metallic precursor gas into the lateral isolation trenches 79 and into the lateral recesses 43.

At least one uppermost electrically conductive layer 46 may comprise a drain side select gate electrode. At least one bottommost electrically conductive layer 46 may comprise a source side select gate electrode. The remaining electrically conductive layers 46 may comprise word lines. Each word line functions as a common control gate electrode for the plurality of vertical NAND strings (e.g., memory opening fill structures 58).

Figure 11A:
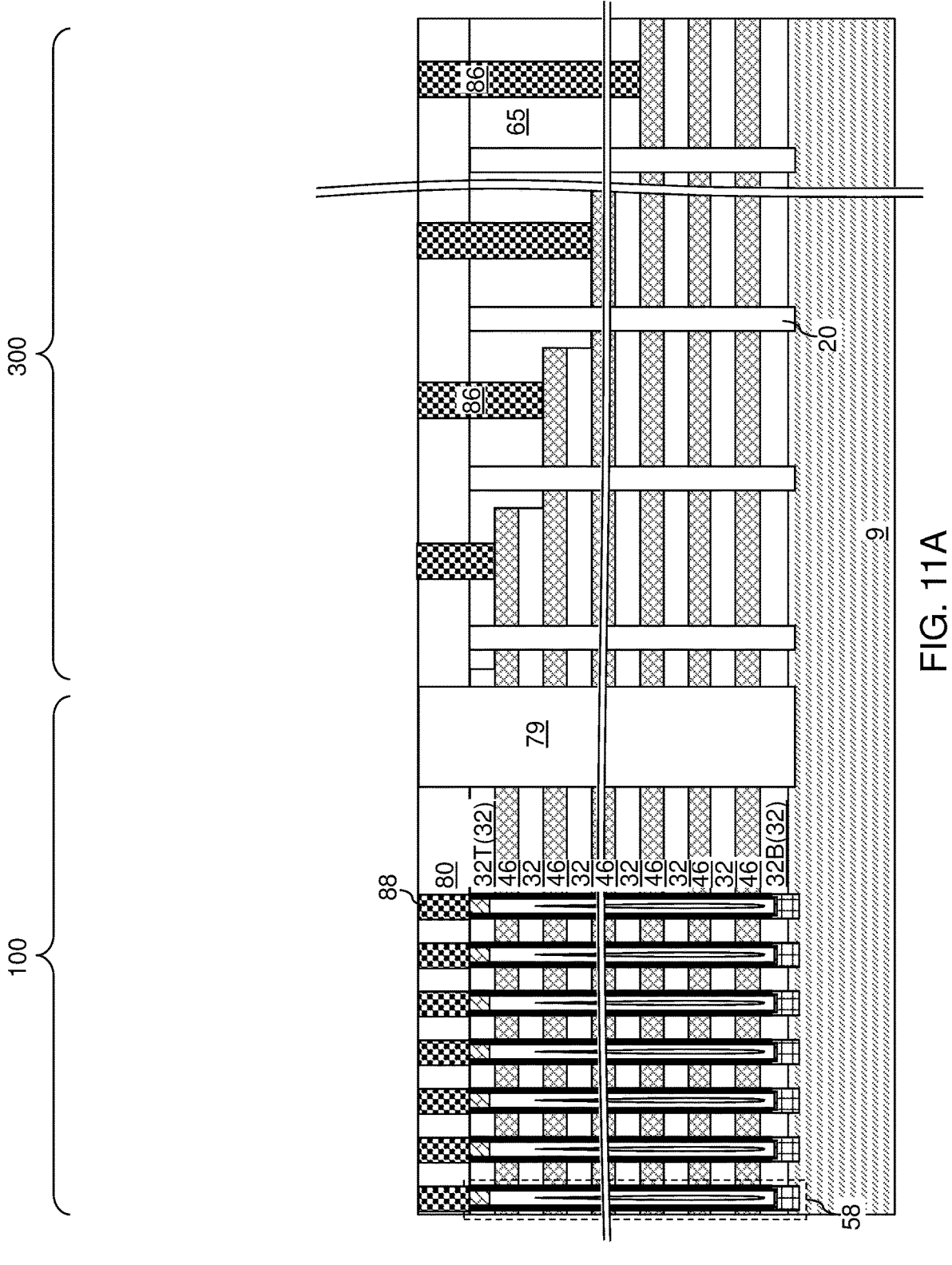
FIG. 11A is a vertical cross-sectional view of the first exemplary structure after formation of lateral isolation trench fill structures, layer contact via structures, and drain contact via structures according to the first embodiment of the present disclosure.
Figure 11B:
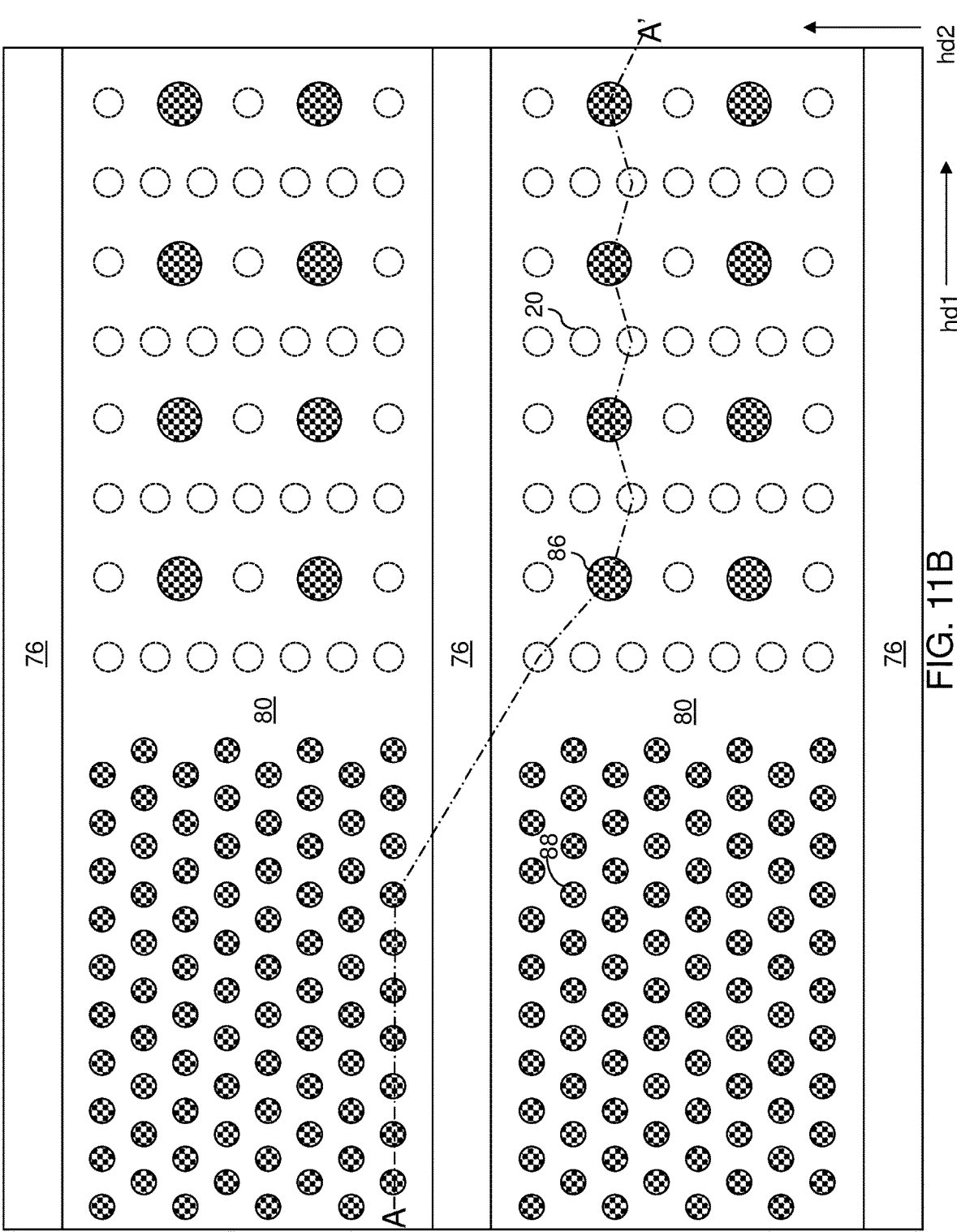
FIG. 11B is a top-down view of the first exemplary structure of FIG. 11A. The vertical plane A-A is the cut plane of the vertical cross-sectional view of FIG. 11A.

Referring to FIGS. 11A and 11B, a dielectric fill material, such as silicon oxide can be deposited in the lateral isolation trenches 79. Excess portions of the dielectric fill material can be removed from above the contact-level dielectric layer 80. Each remaining portion of the dielectric fill material that fills a respective one of the lateral isolation trenches 79 constitutes a lateral isolation trench fill structure 76, which may be a dielectric wall structure. In an alternative embodiment, an insulating spacer having a tubular configuration can be formed in peripheral portions of each of the lateral isolation trenches 79, and a through-stack conductive via structure may be formed within a respective one of the insulating spacers. In this case, each lateral isolation trench fill structure 76 may comprise a combination of a through-stack conductive via structure and an insulating spacer that laterally surrounds the through-stack conductive via structure.

Contact via structures (88, 86) can be formed through the contact-level dielectric layer 80, and optionally through the stepped dielectric material portion 65. For example, drain contact via structures 88 can be formed through the contact-level dielectric layer 80 on each drain region 63. Layer contact via structures 86 can be formed on the electrically conductive layers 46 through the contact-level dielectric layer 80, and through the stepped dielectric material portion 65.

Figure 12:
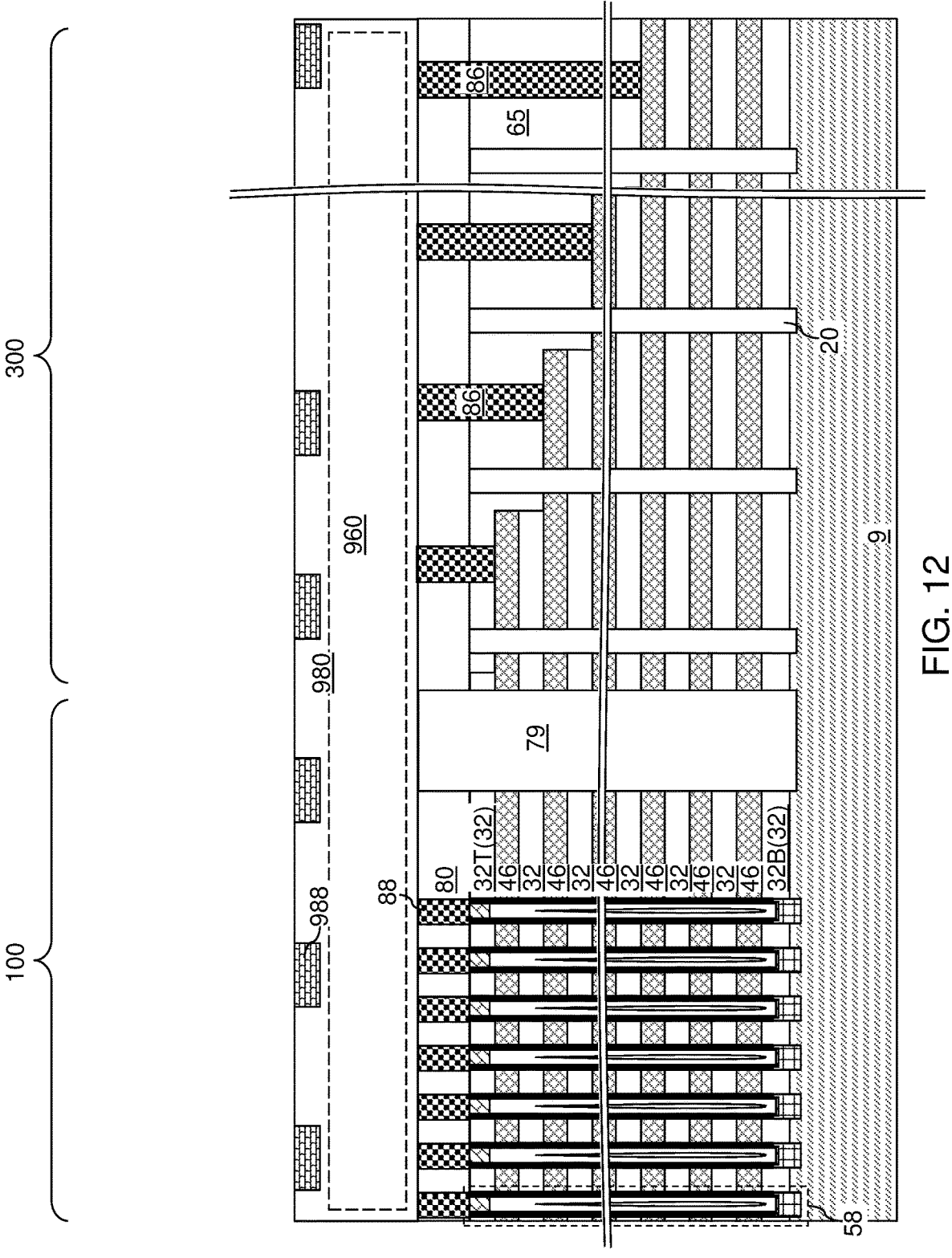
FIG. 12 is a vertical cross-sectional view of the first exemplary structure after formation of a memory die according to the first embodiment of the present disclosure.

Referring to FIG. 12, additional dielectric material layers and additional metal interconnect structures can be formed over the contact-level dielectric layer 80. The additional dielectric material layers may include at least one via-level dielectric layer, at least one additional line-level dielectric layer, and/or at least one additional line-and-via-level dielectric layer. The additional metal interconnect structures may comprise metal via structures, metal line structures, and/or integrated metal line-and-via structures. The additional dielectric material layers that are formed above the contact-level dielectric layer 80 are herein referred to as memory-side dielectric material layers 960. The additional metal interconnect structures are collectively referred to as memory-side dielectric material layers 960. The memory-side dielectric material layers 960 comprise a bit-line-level dielectric material layer embedding bit lines, which are a subset of the memory-side metal interconnect structures 980.

Metal bonding pads, which are herein referred to as upper bonding pads 988, may be formed at the topmost level of the memory-side dielectric material layers 960. The upper bonding pads 988 may be electrically connected to the memory-side metal interconnect structures 980 and various nodes of the three-dimensional memory array including the electrically conductive layers 46 and the memory opening fill structures 58. A memory die 900 can thus be provided.

The memory-side dielectric material layers 960 are formed over the alternating stacks (32, 46). The memory-side metal interconnect structures 980 are embedded in the memory-side dielectric material layers 960. The memory-side bonding pads 988 can be embedded within the memory-side dielectric material layers 960, and specifically, within the topmost layer among the memory-side dielectric material layers 960. The memory-side bonding pads 988 can be electrically connected to the memory-side metal interconnect structures 980.

In one embodiment, the memory die 900 may comprise: a three-dimensional memory array underlying the first dielectric material layer 110 and comprising an alternating stack (32, 46) of insulating layers 32 and electrically conductive layers 46, a two-dimensional array of memory openings 49 vertically extending through the alternating stack (32, 46), and a two-dimensional array of memory opening fill structures 58 located in the two-dimensional array of memory openings 49 and comprising a respective vertical stack of memory elements and a respective vertical semiconductor channel 60; and a two-dimensional array of contact via structures (such as the drain contact via structures 88) overlying the three-dimensional memory array and electrically connected to a respective one of the vertical semiconductor channels 60.

Figure 13:
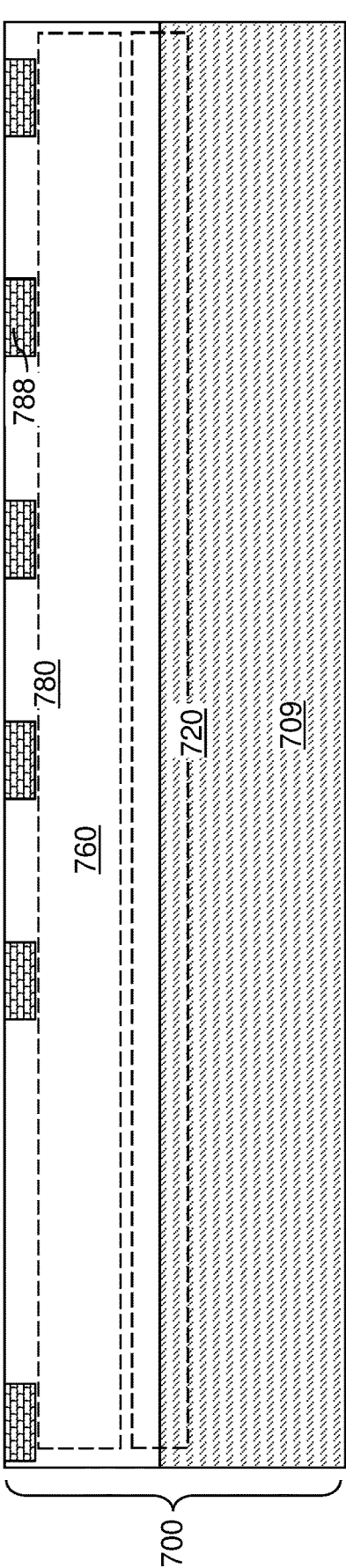
FIG. 13 is a vertical cross-sectional view of a logic die according to the first embodiment of the present disclosure.

Referring to FIG. 13, a logic die 700 can be provided. The logic die 700 includes a logic-side substrate 709, a peripheral circuit 720 located on the logic-side substrate 709 and comprising logic-side semiconductor devices (such as field effect transistors), logic-side metal interconnect structures 780 embedded within logic-side dielectric material layers 760, and logic-side bonding pads 778. The peripheral circuit 720 can be configured to control operation of the memory array within the memory die 900. Specifically, the peripheral circuit 720 can be configured to drive various electrical components within the memory array including, but not limited to, the electrically conductive layers 46, the drain regions 63, and a source contact structure to be subsequently formed. The peripheral circuit 720 can be configured to control operation of the vertical stack of memory elements in the memory array in the memory die 900.

Figure 14:
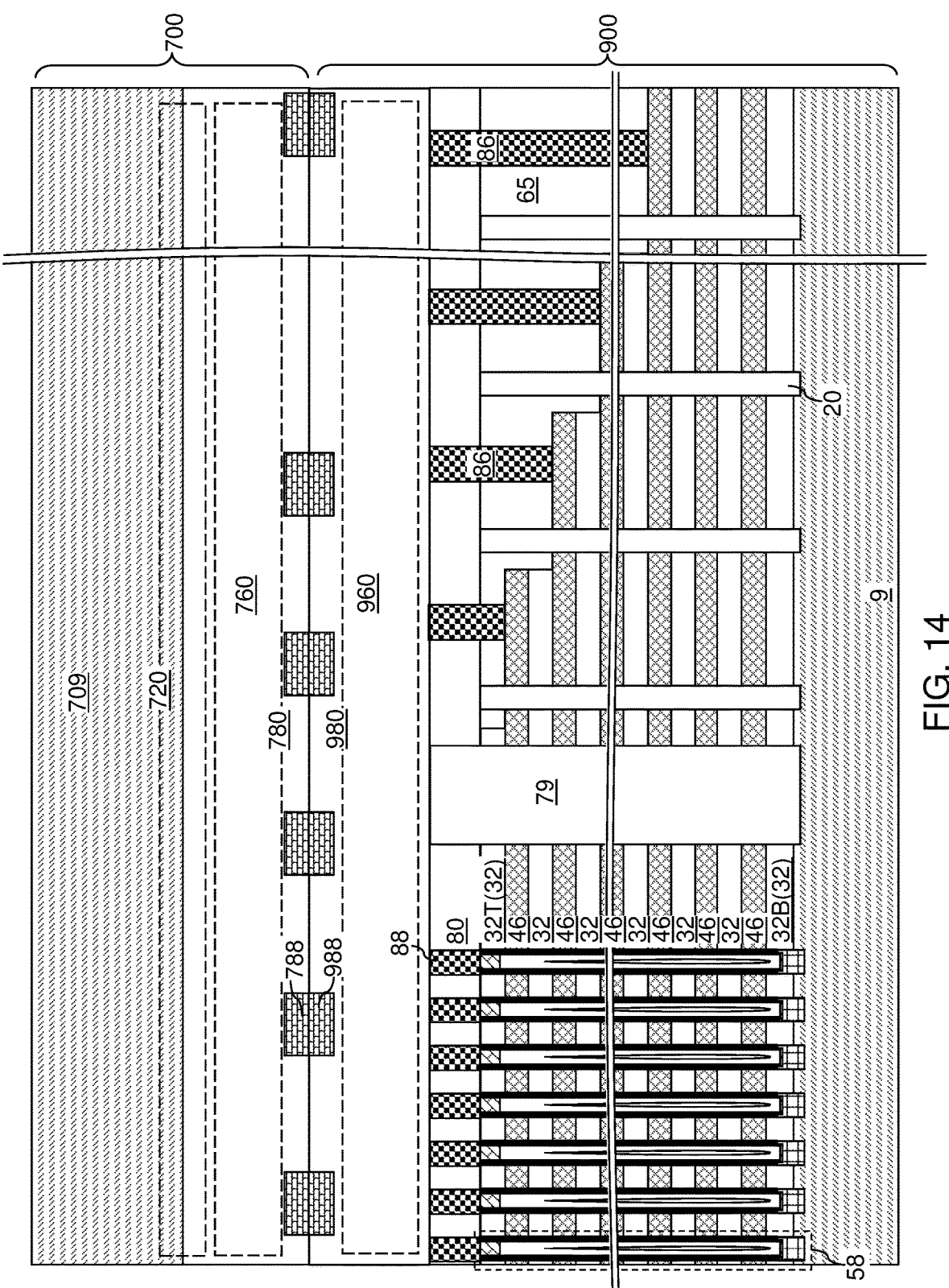
FIG. 14 is a vertical cross-sectional view of the first exemplary structure after attaching the logic die to the memory die according to the first embodiment of the present disclosure.

Referring to FIG. 14, the logic die 700 can be attached to the memory die 900, for example, by bonding the logic-side bonding pads 788 to the memory-side bonding pads 988 at a bonding interface. The bonding between the memory die 900 and the logic die 700 may be performed employing a wafer-to-wafer bonding process in which a two-dimensional array of memory dies 900 is bonded to a two-dimensional array of logic dies 700, by a die-to-bonding process, or by a die-to-die bonding process. The logic-side bonding pads 788 within each logic die 700 can be bonded to the memory-side bonding pads 988 within a respective memory die 900.

Figure 15A:
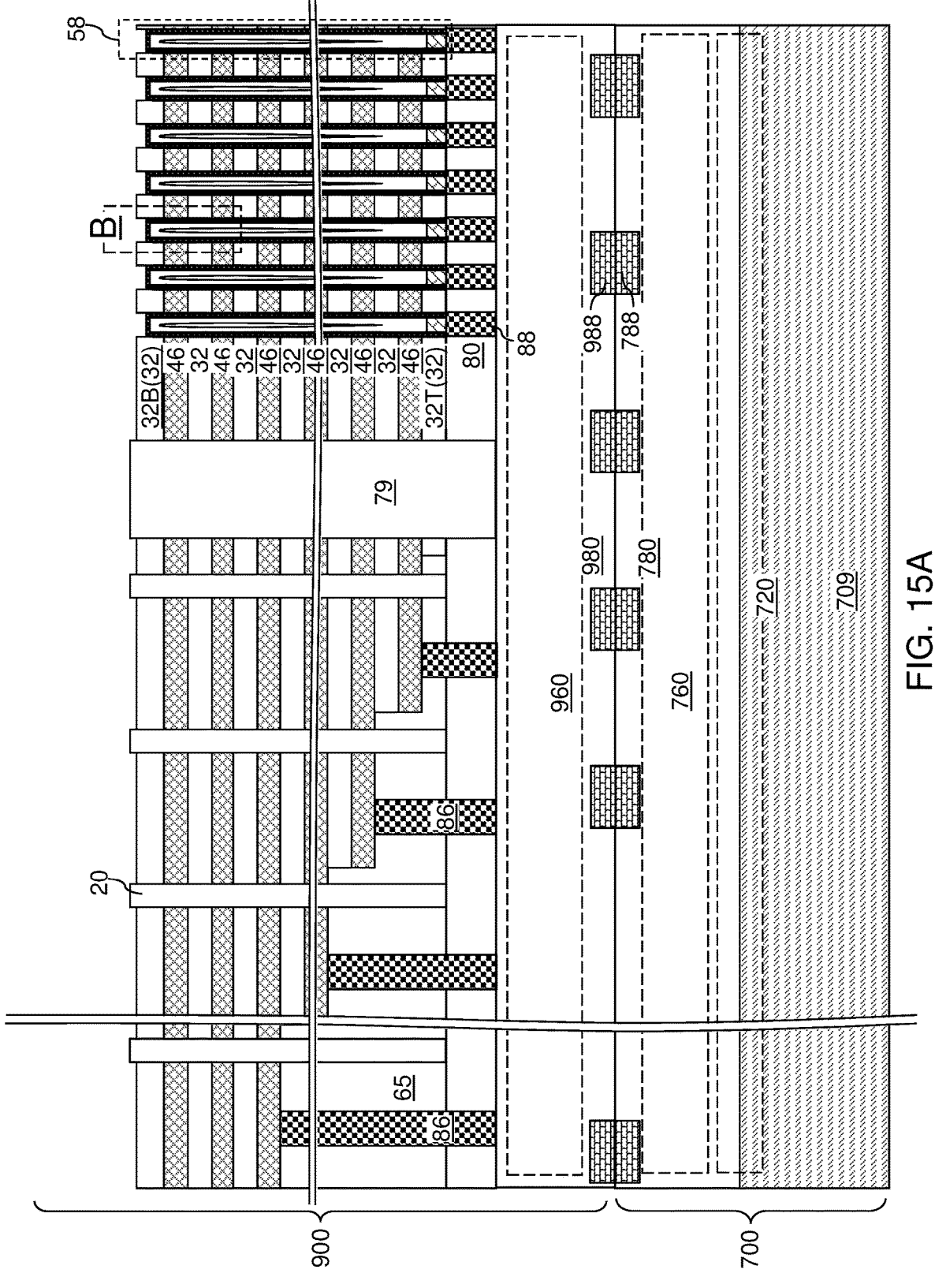
FIG. 15A is a vertical cross-sectional view of the first exemplary structure after removal of the carrier substrate according to the first embodiment of the present disclosure.
Figure 15B:
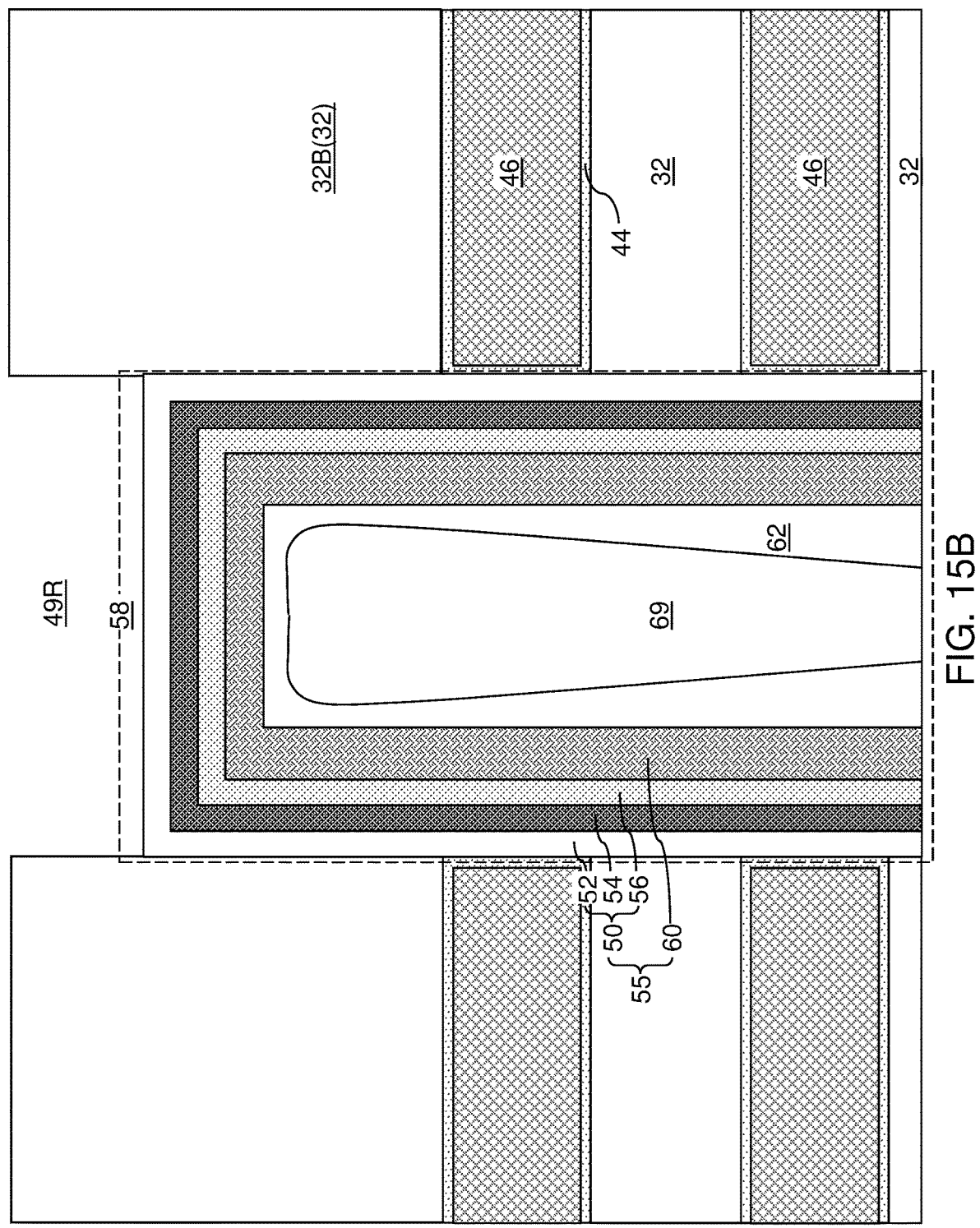
FIG. 15B is a magnified view of region B of FIG. 15A.

Referring to FIGS. 15A and 15B, the carrier substrate 9 and the sacrificial pedestal structures 11 can be removed, for example, by grinding, polishing, cleaving, an isotropic etch process, and/or an anisotropic etch process. If a polishing process such as a chemical mechanical polishing process is employed to remove the carrier substrate 9, the bottommost insulating layer 32B may be employed as a polishing stopper material layer. If an etch process such as a wet etch process is employed to remove the carrier substrate 9 and the sacrificial pedestal structures 11, and the bottommost insulating layer 32B may be employed as an etch stop material layer.

In one embodiment, at least a terminal step of at least one removal process that is employed to remove the carrier substrate 9 and the sacrificial pedestal structures 11 may comprise a selective wet etch process that etches the semiconductor materials (e.g., silicon) selective to dielectric materials of the memory films 50 and the dielectric cores 62. In an illustrative example, the terminal step of the at least one removal process may comprise a wet etch process using hot trimethyl-2 hydroxyethyl ammonium hydroxide ("hot TMY") or tetramethyl ammonium hydroxide (TMAH). The entirety of the carrier substrate 9 and the entirety of each of the sacrificial pedestal structures 11 can be removed by the selective wet etch process. Backside end surfaces of the support pillar structures 20 can be physically exposed upon removal of the carrier substrate 9.

Generally, the process that removes the carrier substrate 9 can collaterally remove a first end portion of each of the memory opening fill structures 58. The first end portion of each memory opening fill structure 58 that is collaterally removed during the process that removes the carrier substrate 9 may include collateral removal of the sacrificial pedestal structure 11. The entirety of the sacrificial pedestal structure 11 can be collaterally removed during the etch process employed to remove the carrier substrate 9. A recess 49R comprising a bottom portion of the memory opening 49 is formed after removal of the sacrificial pedestal structure 11. End surfaces of the memory films 50 can be physically exposed in the recess 49R after the selective wet etch process.

FIGS. 16A-16F are sequential vertical cross-sectional views of a region of the first exemplary structure during formation of a channel cap structure in a first configuration according to the first embodiment of the present disclosure. The first exemplary structure is illustrated upside down, and thus, a bottom portion of each structural element is illustrated above a top portion of the respective structural element.

Figure 16A:
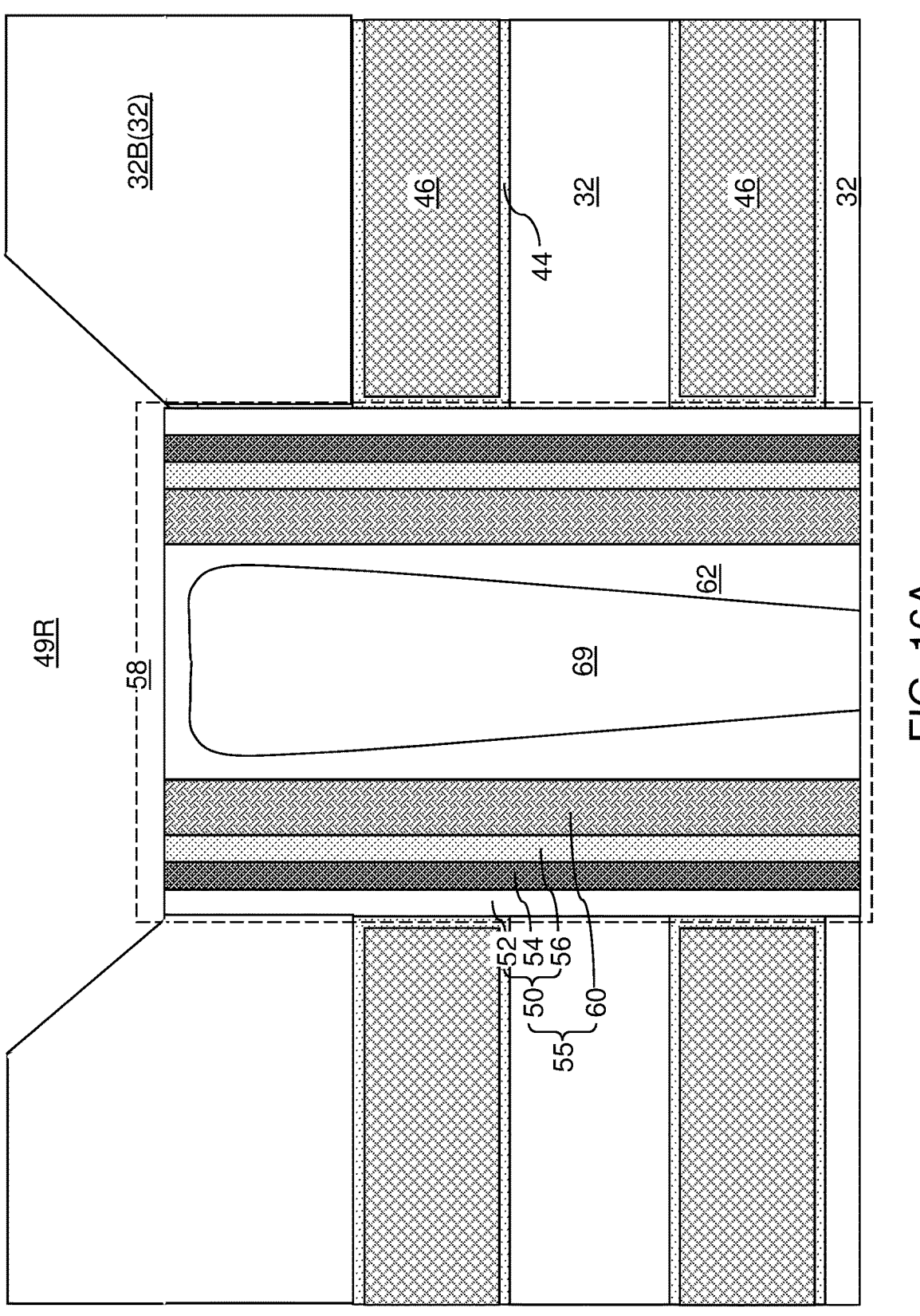
FIGS. 16A-16F are sequential vertical cross-sectional views of a region of a first configuration of the first exemplary structure during formation of a channel cap structure according to the first embodiment of the present disclosure.

Referring to FIG. 16A, a second end portion of each memory opening fill structure 58 exposed in the recess 49R can be removed by any suitable etch back process. The width of the recess 49R may also be increased during the etch back process. For example, the sidewalls of the recess 49R may become tapered such that the recess 49R is narrower at the memory opening fill structure 58 than at the exposed bottom surface of the bottommost insulating layer 32B, Generally, an end portion of each vertical semiconductor channel 60 can be removed such that each vertical semiconductor channel 60 has a tubular configuration with an opening at an end portion thereof. The annular end surfaces of the vertical semiconductor channels 60 may be formed entirely between a first horizontal plane including a top surface of the bottommost insulating layer 32B and a second horizontal plane including a bottom surface of the bottommost insulating layer 32B.

Figure 16B:
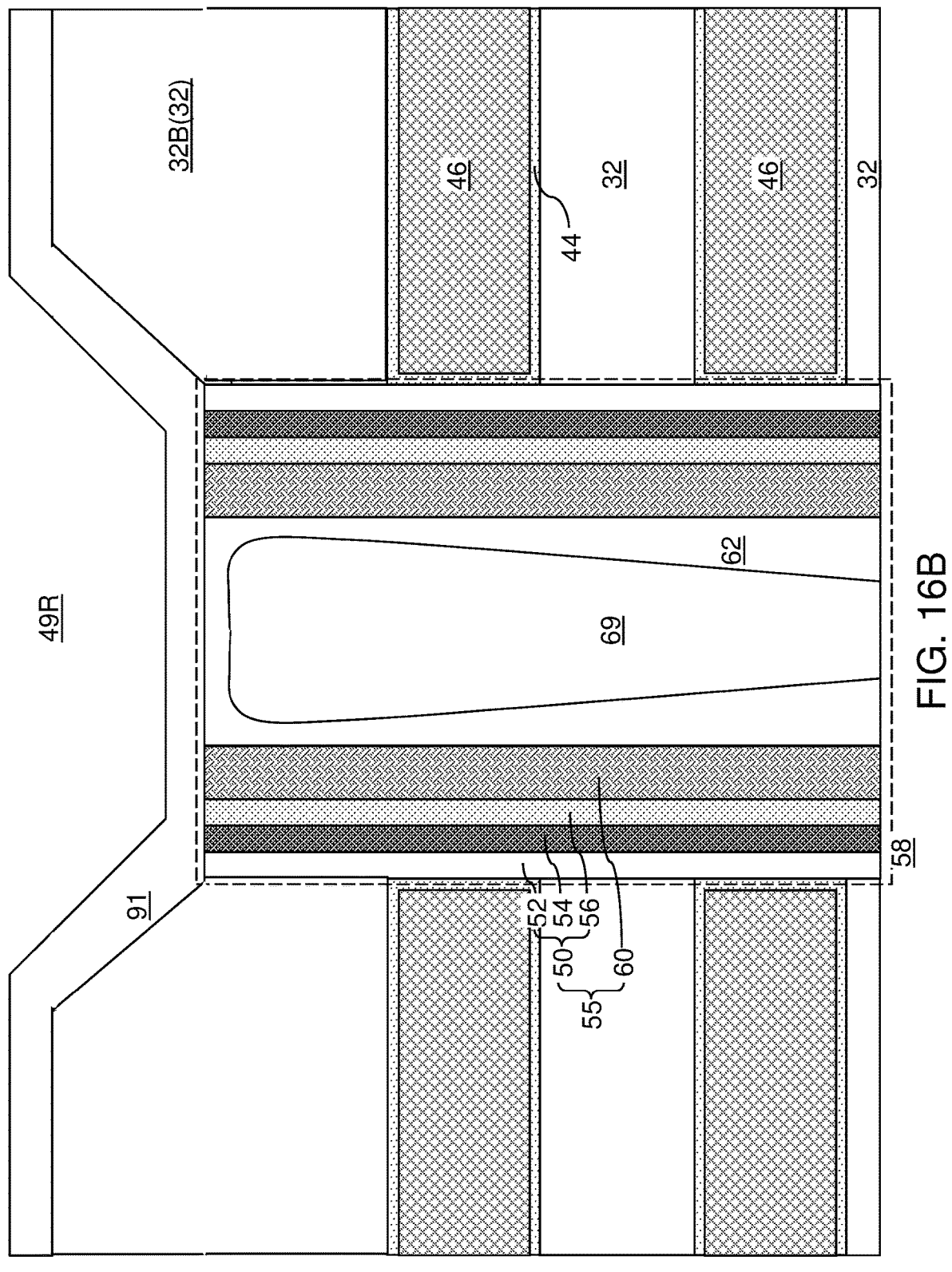

Referring to FIG. 16B, on optional dielectric spacer layer 91 is formed over the bottom surface of the bottommost insulating layer 32B, the sidewalls of the recess 49R in the bottommost insulating layer 32B and the bottom surface of the memory opening fill structure 58 exposed in the recess 49R. The dielectric spacer layer 91 may comprise any suitable insulating layer, such as a silicon oxide layer, formed by a conformal deposition process.

Figure 16C:
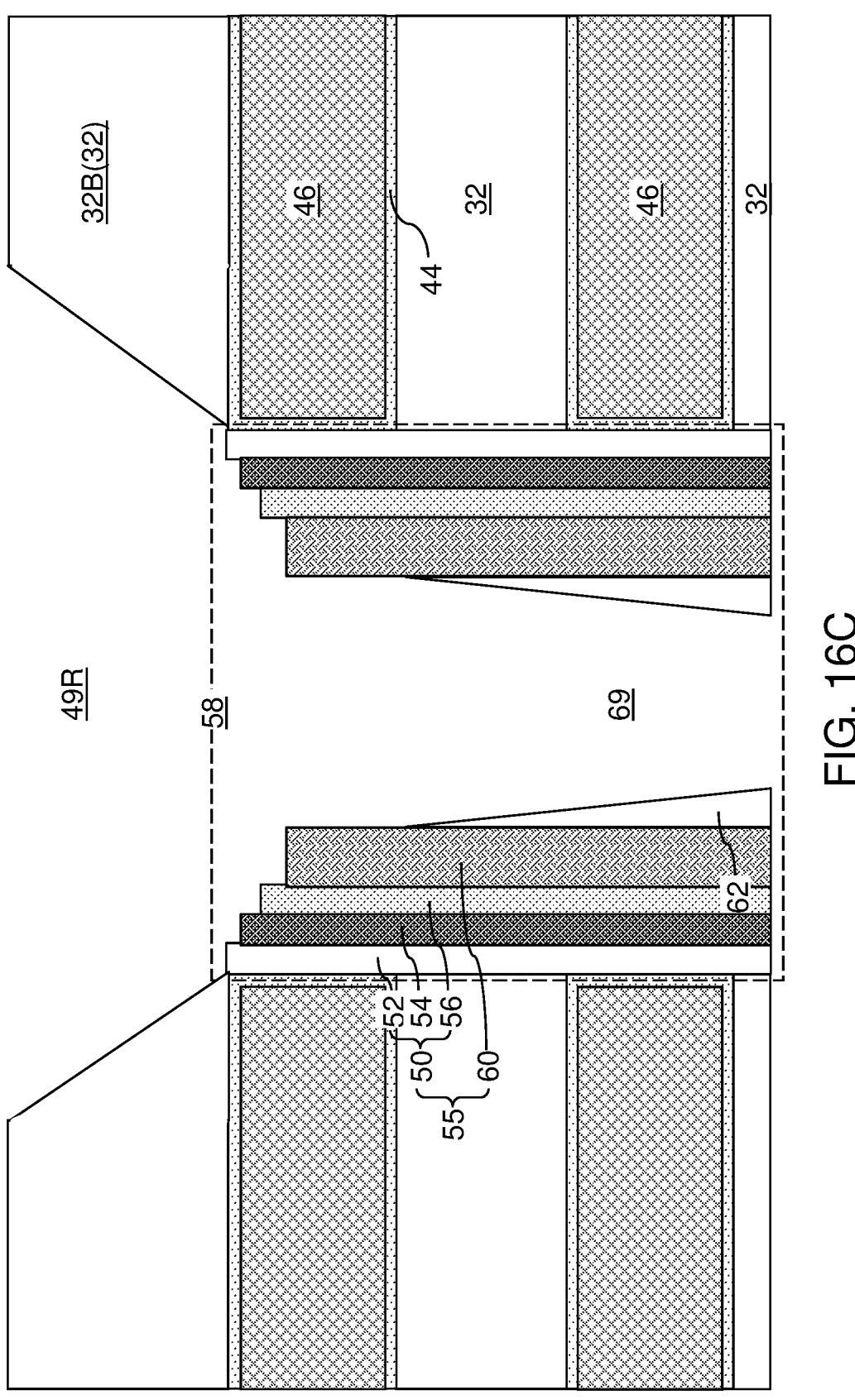

Referring to FIG. 16C, a third end portion of each memory opening fill structure 58 and the dielectric spacer layer 91 can be removed by performing at least one etch process. The at least one etch process may comprise a reactive ion etch process followed by one or more wet etch processes. The at least one etch process removes the horizontal portion of the dielectric core 62 to expose the core cavity 69 in the recess. Each core cavity 69 is laterally surrounded by a remaining portion of a respective dielectric core 62, and is laterally surrounded by a respective vertical semiconductor channel 60. The dielectric spacer layer 91 assists in providing the tapered shape of the recess 49R extending into the core cavity 69. In one embodiment, the steps described above with respect to FIGS. 16B and 16C may be cycled two or more times to arrive at the structure shown in FIG. 16C.

Figure 16D:
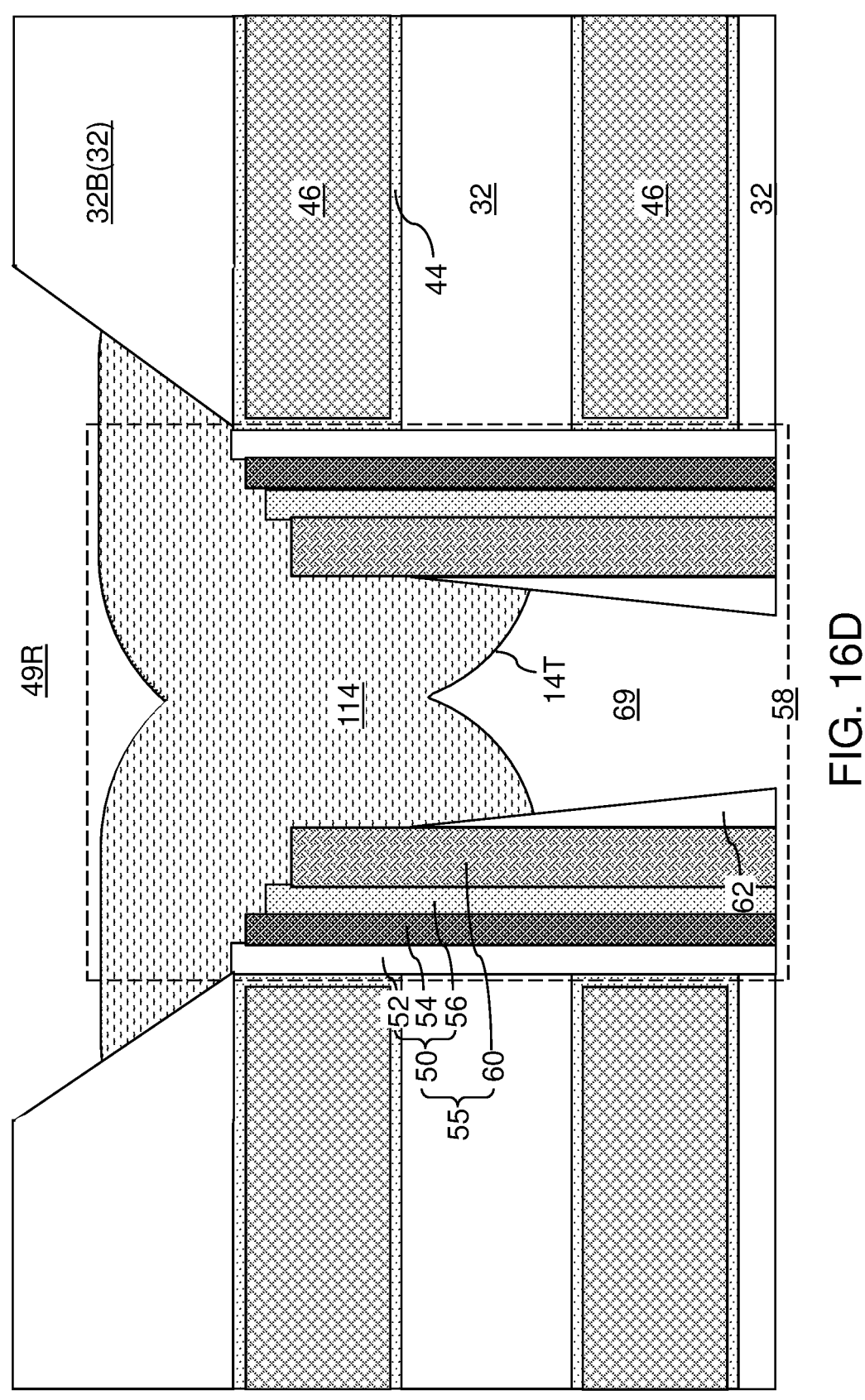

Referring to FIG. 16D, a selective semiconductor deposition process can be performed to grow a semiconductor material from physically exposed semiconductor surfaces of the vertical semiconductor channels 60. The selective semiconductor deposition process employs concurrent or alternating flow of a reactant gas and an etchant gas during the deposition process. The reactant gas comprises a semiconductor-containing precursor gas such as $SiH_4$, $SiH_2Cl_2$, $SiHCl_3$, $Si_2H_6$, $Ge_2H_6$, etc. In one embodiment, the reactant gas may comprise at least one silicon-containing precursor gas, and the deposited semiconductor material may comprise silicon. In another embodiment, the reactant gas may comprise at least one germanium-containing precursor gas, and the deposited semiconductor material may comprise germanium. In another embodiment, the reactant gas may comprise at least one silicon-containing precursor gas and at least one germanium-containing precursor gas, and the deposited semiconductor material may comprise silicon-germanium. A suitable dopant gas, such as diborane, phosphene, or arsine, may be optionally flowed as needed. Thus, the semiconductor material may be intrinsic, p-type doped or n-type doped.

During the selective semiconductor deposition process, the reaction rate of the reactant gas can be limited by the deposition temperature. In one embodiment, the deposition temperature is below 400 degrees Celsius, such as 180 to 375 degrees Celsius may be used to avoid damage to the bonding pads in the bonded assembly of the logic die 700 and the memory die 900, and to limit the reaction rate. For example, epitaxial silicon growth on underlying silicon has been achieved in the art at 180 degrees Celsius by PECVD deposition using silane and hydrogen source gasses. The nucleation rate of the semiconductor material on semiconductor surfaces is higher than the nucleation rate of the semiconductor material on dielectric surfaces because the incubation time for clusters of semiconductor atoms on the dielectric surfaces is longer than the incubation time for clusters of semiconductor atoms on semiconductor surfaces (which is close to zero). Thus, the deposition rate of the semiconductor material on the semiconductor surfaces is higher than the deposition rate of the semiconductor material on the dielectric surfaces. The etch rate of the etchant gas is generally proportional to the flow rate of the etchant gas. According to an aspect of the present disclosure, the flow rate of the etchant gas is set such that the etch rate of the etchant gas is less than the deposition rate of the semiconductor material on semiconductor surfaces, and is greater than the deposition rate of the semiconductor material on dielectric surfaces. Under such process conditions, the deposited semiconductor material grows only from the physically exposed semiconductor surfaces of the vertical semiconductor channels 60, and does not grow from any dielectric surface. Thus, the semiconductor material can be selectively grown only from the physically exposed surfaces of the vertical semiconductor channels 60.

The duration of the selective semiconductor deposition process can be selected such that deposited portions of the semiconductor material plug a bottom end of a respective vertical semiconductor channel 60 and form a respective semiconductor portion 114. Generally, the selective semiconductor deposition process can grow a semiconductor material from the physically exposed surfaces of each vertical semiconductor channel 60 while suppressing growth of the semiconductor material from dielectric surfaces. In one embodiment, each semiconductor portion 114 comprises a Si, Ge or SiGe material portion contacting at least a cylindrical surface segment of an inner sidewall of a respective vertical semiconductor channel 60.

In one embodiment, each vertical semiconductor channel 60 has a doping of the first conductivity type, and each semiconductor material portion, i.e., each semiconductor portion 114, may be undoped or may have a doping of the first conductivity type. In case the semiconductor portion 114 comprises and/or consist essentially of an intrinsic semiconductor material or a semiconductor material having a doping of the first conductivity type, then the semiconductor portion 114 may function as a channel cap structure that is formed at a bottom end of a respective vertical semiconductor channel 60. In case the semiconductor portion 114 comprises and/or consist essentially of a semiconductor material having a doping of the second conductivity type, then the semiconductor portion 114 may function as a doped source region. The atomic concentration of dopants of the first or second conductivity type may be in a range from $1.0 \times 10^{14}/cm^3$ to $1.0 \times 10^{18}/cm^3$, although lesser and greater atomic concentrations may also be employed.

In one embodiment, each semiconductor portion 114 can plug an opening at a bottom end of a respective vertical semiconductor channel 60 such that a remaining portion of the core cavity 69 is encapsulated by a respective dielectric core 62 and the semiconductor portion 114. Thus, the semiconductor portion 114 separates the core cavity 69 from the recess 49R. In one embodiment, each semiconductor portion 114 can be in contact with an end segment of an inner sidewall of a respective dielectric core 62 that is exposed to a respective core cavity 69. In one embodiment, each semiconductor portion 114 can be in contact with a respective memory film 50, and can be laterally spaced from each of the insulating layers 32 except the bottommost insulating layer 32B in the alternating stack (32, 46) by a respective memory film 50.

Generally, each memory opening fill structure 58 can be located in a respective memory opening 49, and comprises a respective memory film 50 and a respective vertical semiconductor channel 60 that laterally surrounds a respective core cavity 69 that is free of any solid-phase material therein. In one embodiment, each vertical semiconductor channel 60 can have a tubular configuration, and each semiconductor portion 114 may be formed within an end portion of a cylindrical cavity 69 within a respective vertical semiconductor channel 60. Each semiconductor portion 114 can contact an end portion of a respective vertical semiconductor channel 60, and can have a top surface 14T exposed in a respective core cavity 69. In one embodiment, the top surface 14T the semiconductor portions 114 comprises a tapered convex surface having a lowest point at a center region thereof.

Figure 16E:
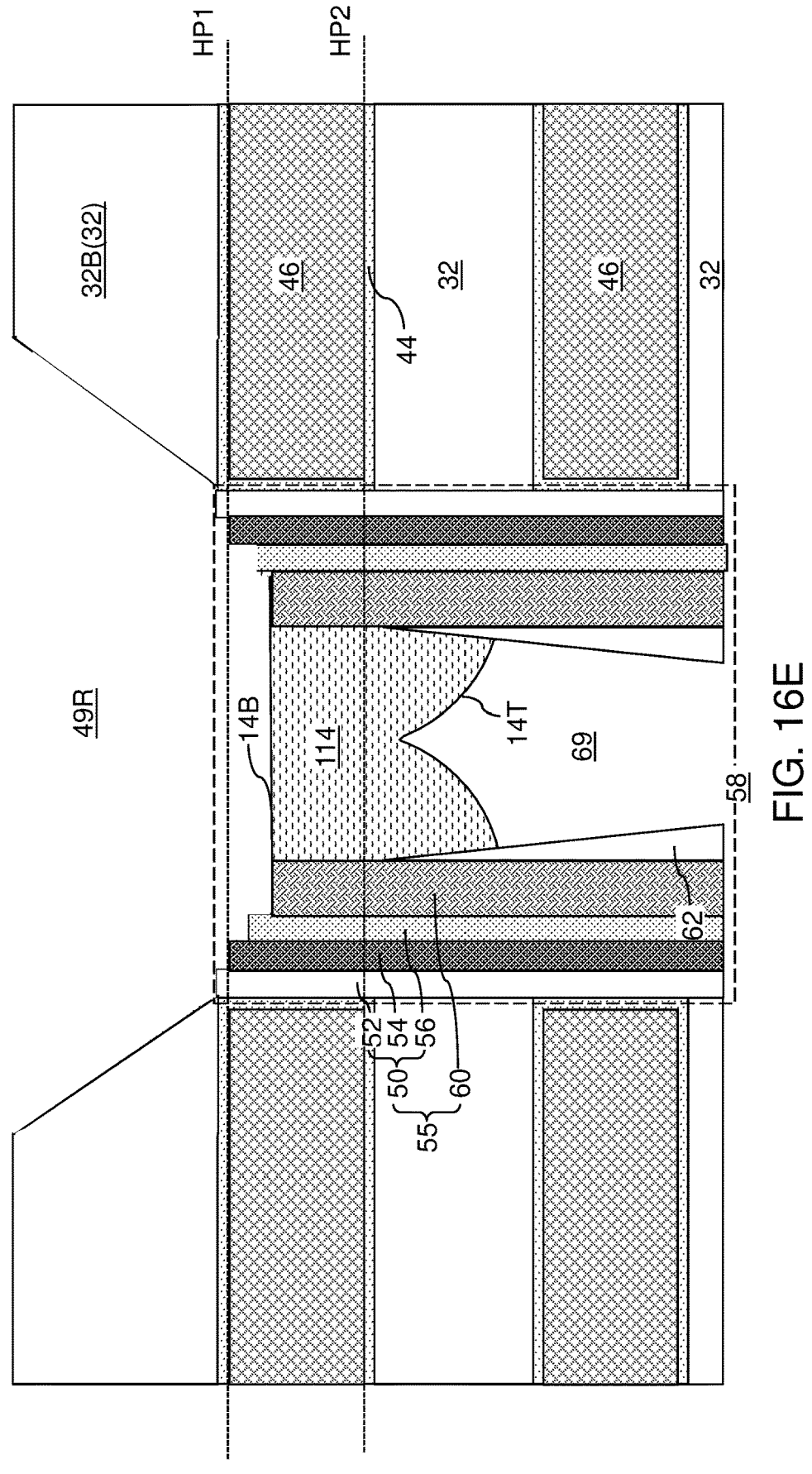

Referring to FIG. 16E, a recess etch process can be optionally performed to recess the semiconductor portions 114. The recess etch process may comprise an isotropic etch process such as a wet etch process, or may comprise an anisotropic etch process such as a reactive ion etch process. In one embodiment, the recess etch process may comprise a wet etch process employing hot trimethyl-2 hydroxyethyl ammonium hydroxide ("hot TMY") or tetramethyl ammonium hydroxide (TMAH). In one embodiment, the recess etch process can be continued until the bottom surface 14B of the semiconductor portion 114 is located parallel to the bottommost electrically conductive layer 46 which functions as the bottom source side select gate electrode. For example, the bottom surface 14B of the semiconductor portion 114 may be located between a first horizontal plane HP1 including the bottom surface of the bottommost electrically conductive layer 46S and a second plane HP2 including the top surface of the bottommost electrically conductive layer 46S. The bottom surface 14B may be flat after the recess etch.

Figure 16F:
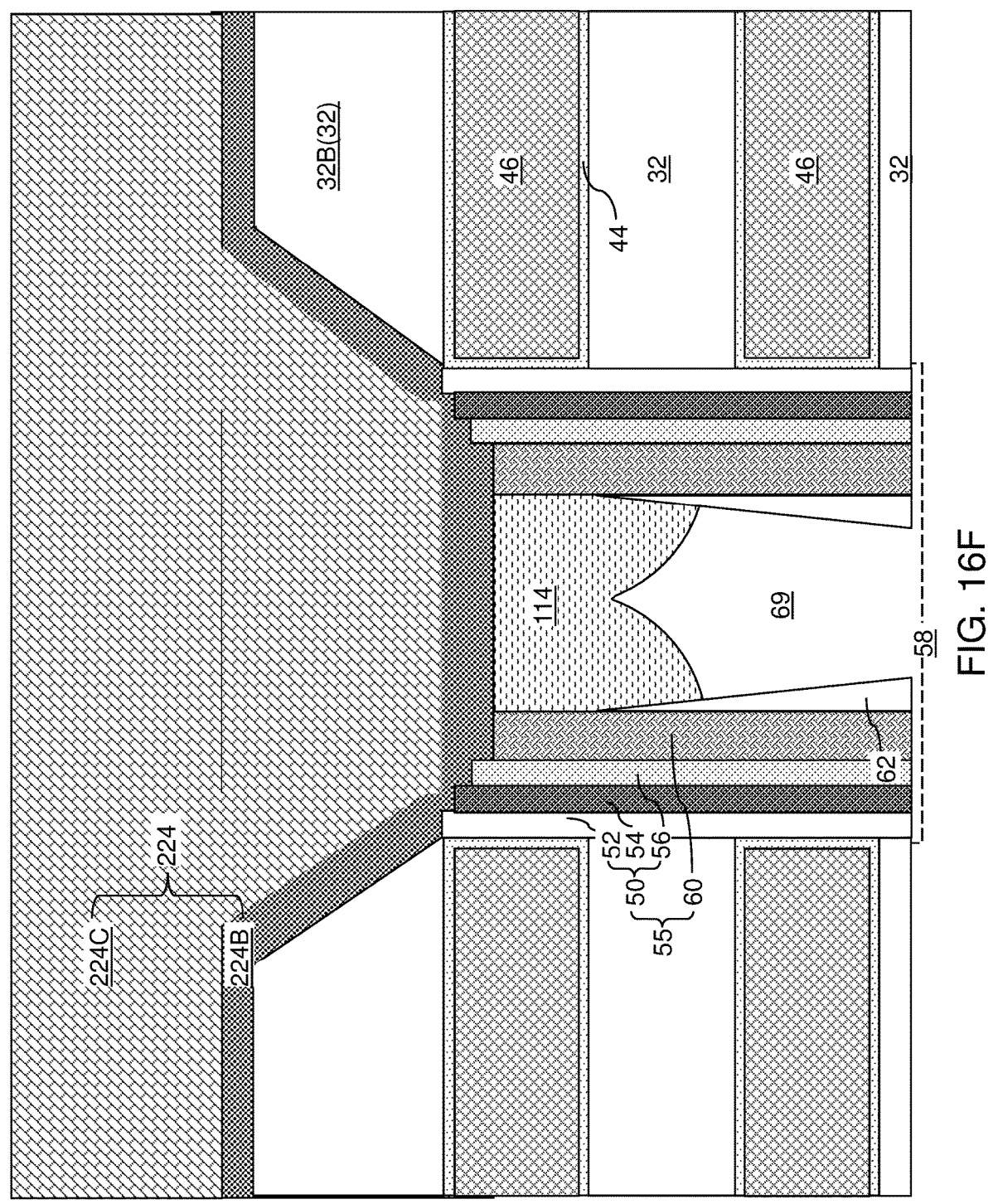

Referring to FIG. 16F, a source contact structure 224 can be formed on the bottom surface 14B of the semiconductor portions 114. In one embodiment, the source contact structure 224 may comprise and/or may consist of at least one metallic material. In an illustrative example, a metallic barrier material can be conformally deposited directly on the bottom surface 14B of each of the semiconductor portions 114. The metallic barrier material may comprise a metallic nitride material such as titanium nitride, tantalum nitride, tungsten nitride, or molybdenum nitride, and/or may comprise a metallic carbide material such as titanium carbide, tantalum carbide, or tungsten carbide. The metallic barrier material can be deposited by a conformal deposition process, such as a chemical vapor deposition process. A metallic barrier liner 224B can be formed on physically exposed end surfaces of the semiconductor portions 114, the dielectric cores 62, the vertical semiconductor channels 60, and the memory films 50, and over the bottommost insulating layer 32B.

A metal layer 224M can be formed over the metallic barrier liner 224B. The metal layer may comprise any suitable metal, such as tungsten, tantalum, titanium, molybdenum, cobalt, ruthenium, copper, etc. Subsequently, the metal layer 224M and the metallic barrier liner 224B can be patterned, for example, by applying and patterning a photoresist layer over the metal layer 224M, and by removing portions of the metal layer 224M and the metallic barrier liner 224B that are not masked by patterned portions of the photoresist layer. A source contact structure 224 can be formed. The photoresist layer can be subsequently removed, for example, by ashing.

In the first configuration, the source contact structure 224 can be formed on the semiconductor portions 114. In one embodiment, the source contact structure 224 can be in contact with the bottom surfaces 14B of the semiconductor portions 114 and a bottom surface of the bottommost layer in the alternating stack (32, 46), i.e., the bottom surface of the bottommost insulating layer 32B. In one embodiment, each of the vertical semiconductor channels 60 may have an annular end surface that contacts the source contact structure 224.

FIGS. 17A-17D are sequential vertical cross-sectional views of a region of the first exemplary structure during formation of a channel cap structure in a second configuration according to the first embodiment of the present disclosure.

Figure 17A:
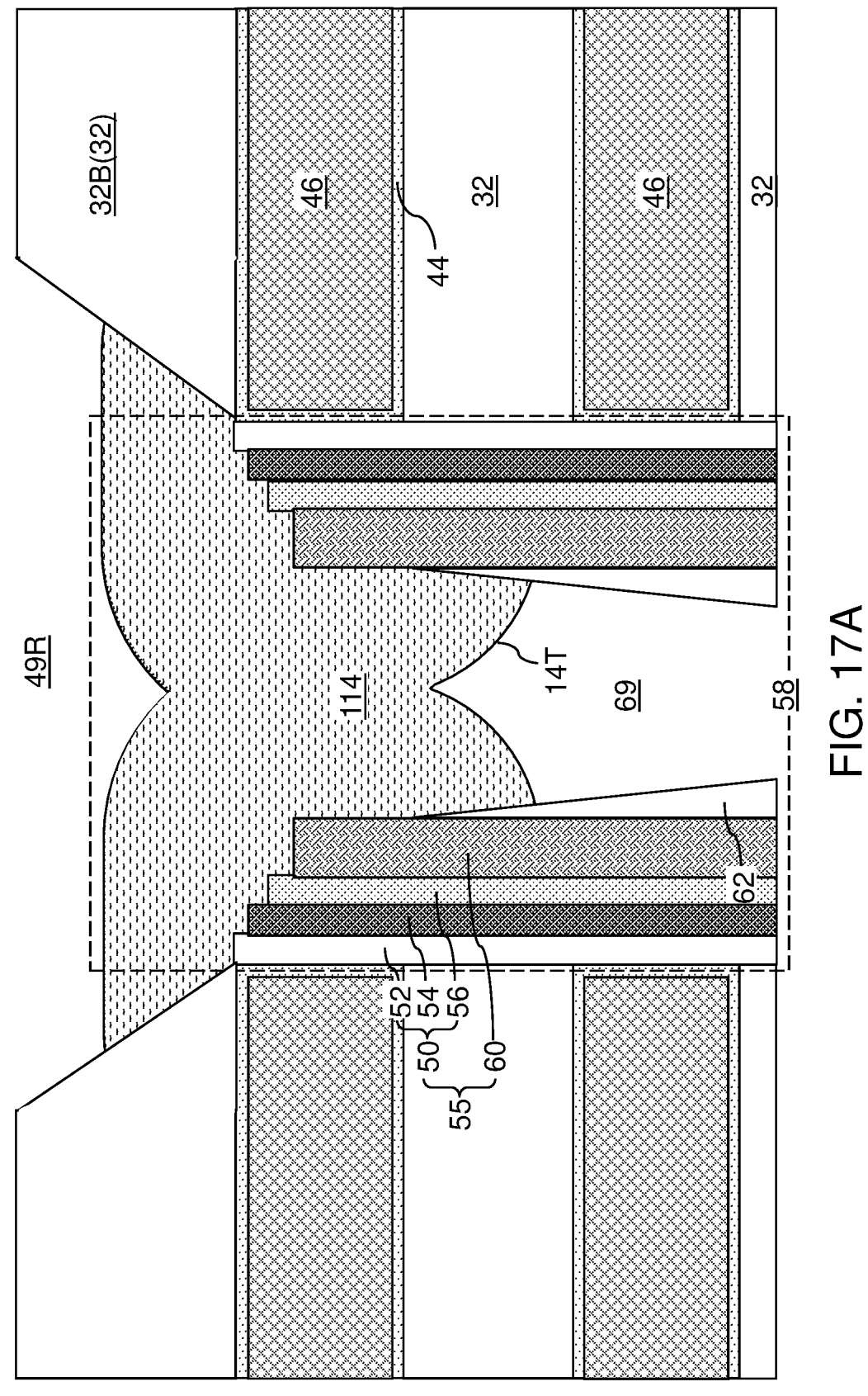
FIGS. 17A-17D are sequential vertical cross-sectional views of a region of a second configuration of the first exemplary structure during formation of a channel cap structure according to the first embodiment of the present disclosure.

Referring to FIG. 17A, a region of a first exemplary structure in a second configuration is illustrated. The second configuration of the first exemplary structure at this processing step can be the same as the first configuration of the first exemplary structure illustrated in FIG. 16D.

Figure 17B:
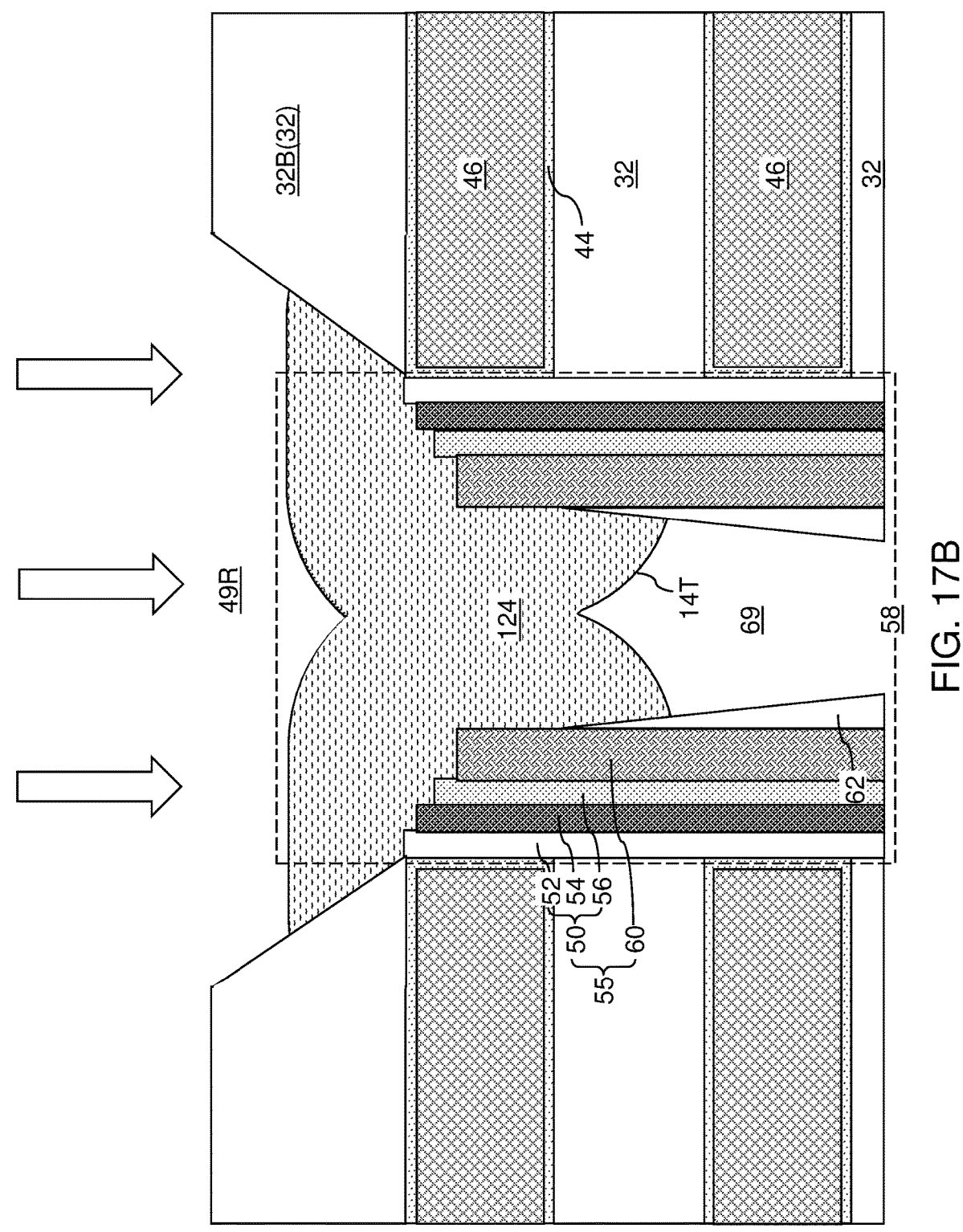

Referring to FIG. 17B, an ion implantation process can be performed to implant dopants of the first or second conductivity type into the semiconductor portions 114 and into end portions of the vertical semiconductor channels 60 that are proximal to the bottommost insulating layer 32B. The implanted ions may be activated by an anneal, such as a laser anneal. An entirety of each semiconductor portion 114 and optionally portions of the vertical semiconductor channels 60 that are proximal to the semiconductor portions 114 are converted into doped semiconductor portions 124 having a doping of the first or second conductivity type.

Figure 17C:
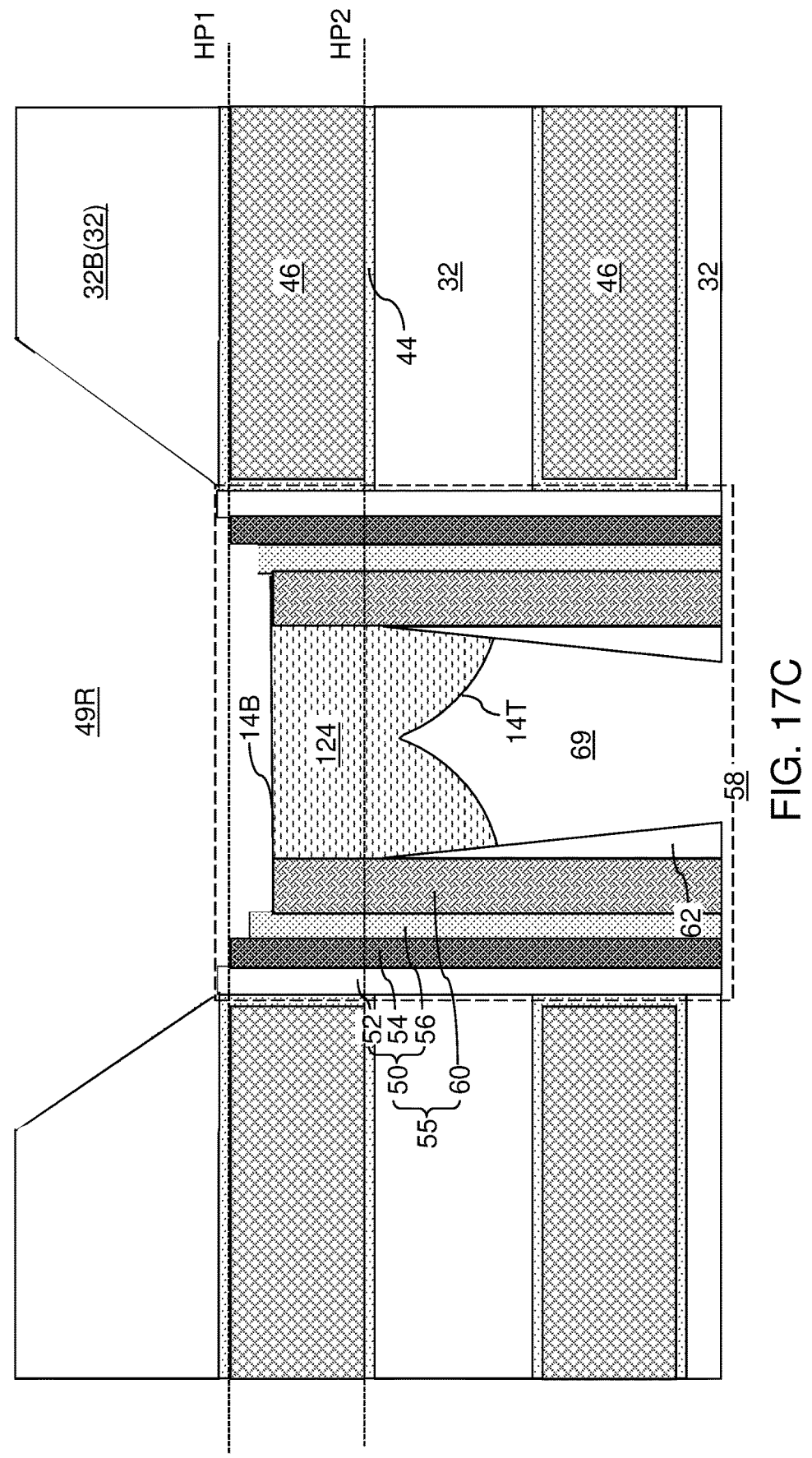

Referring to FIG. 17C, the recess etch process of FIG. 16E is performed on the doped semiconductor portions 124.

Figure 17D:
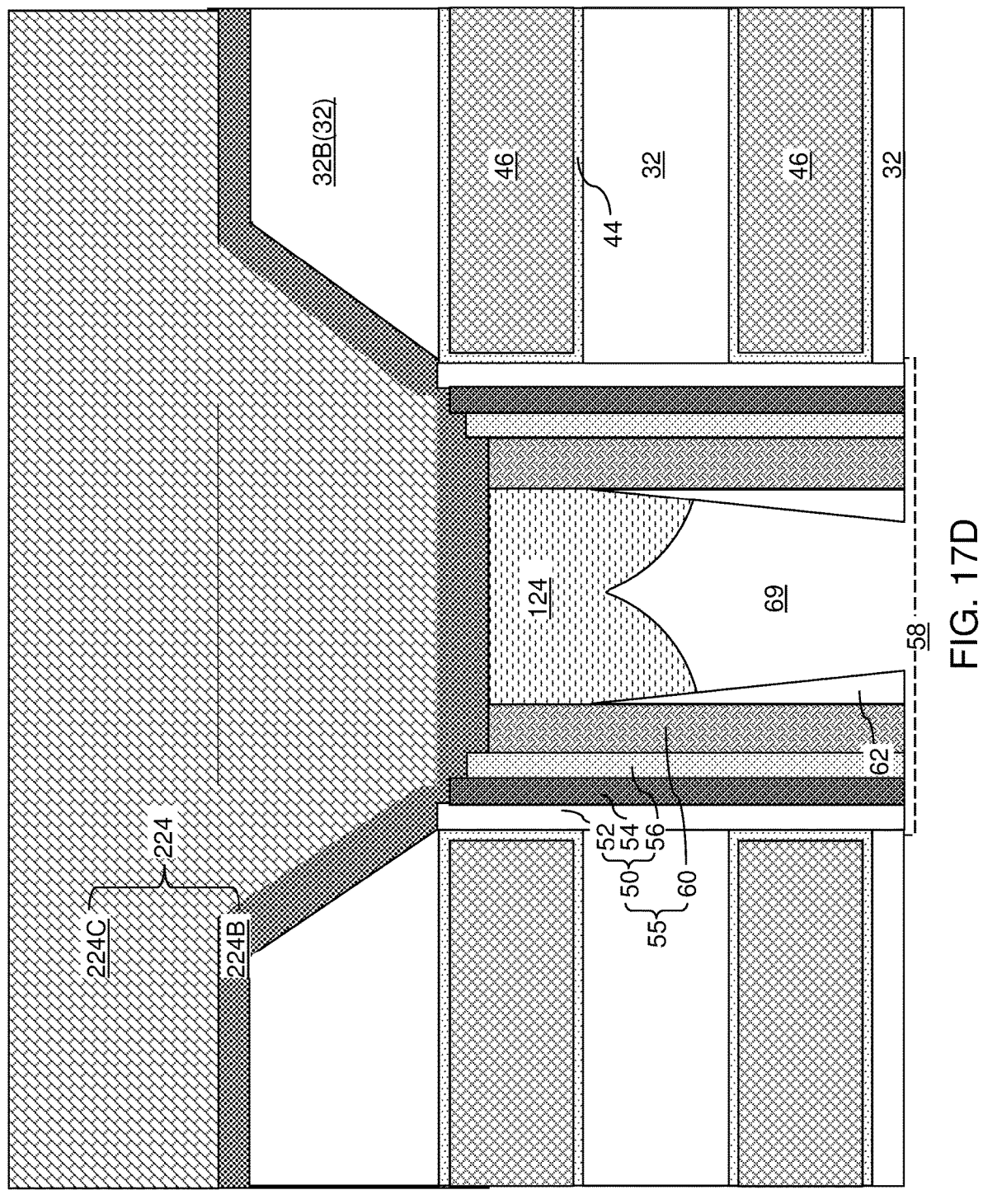

Referring to FIG. 17D, the source contact structure 224 is formed on doped semiconductor portions 124, as described above with respect to FIG. 16F.

Figure 18A:
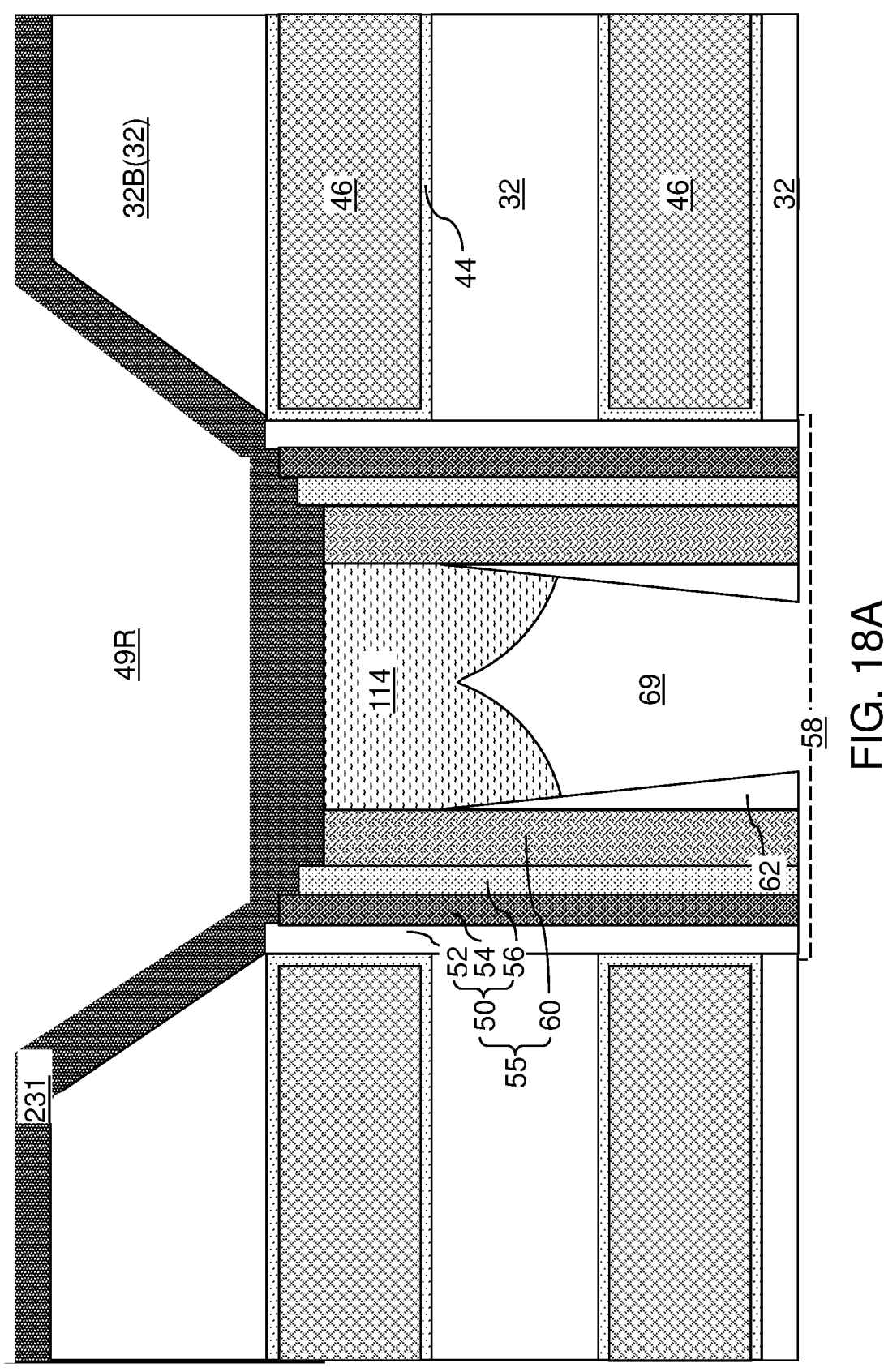
FIGS. 18A-18C are sequential vertical cross-sectional views of a region of a third configuration of the first exemplary structure during formation of a backside semiconductor cap structure according to the first embodiment of the present disclosure.
Figure 18B:
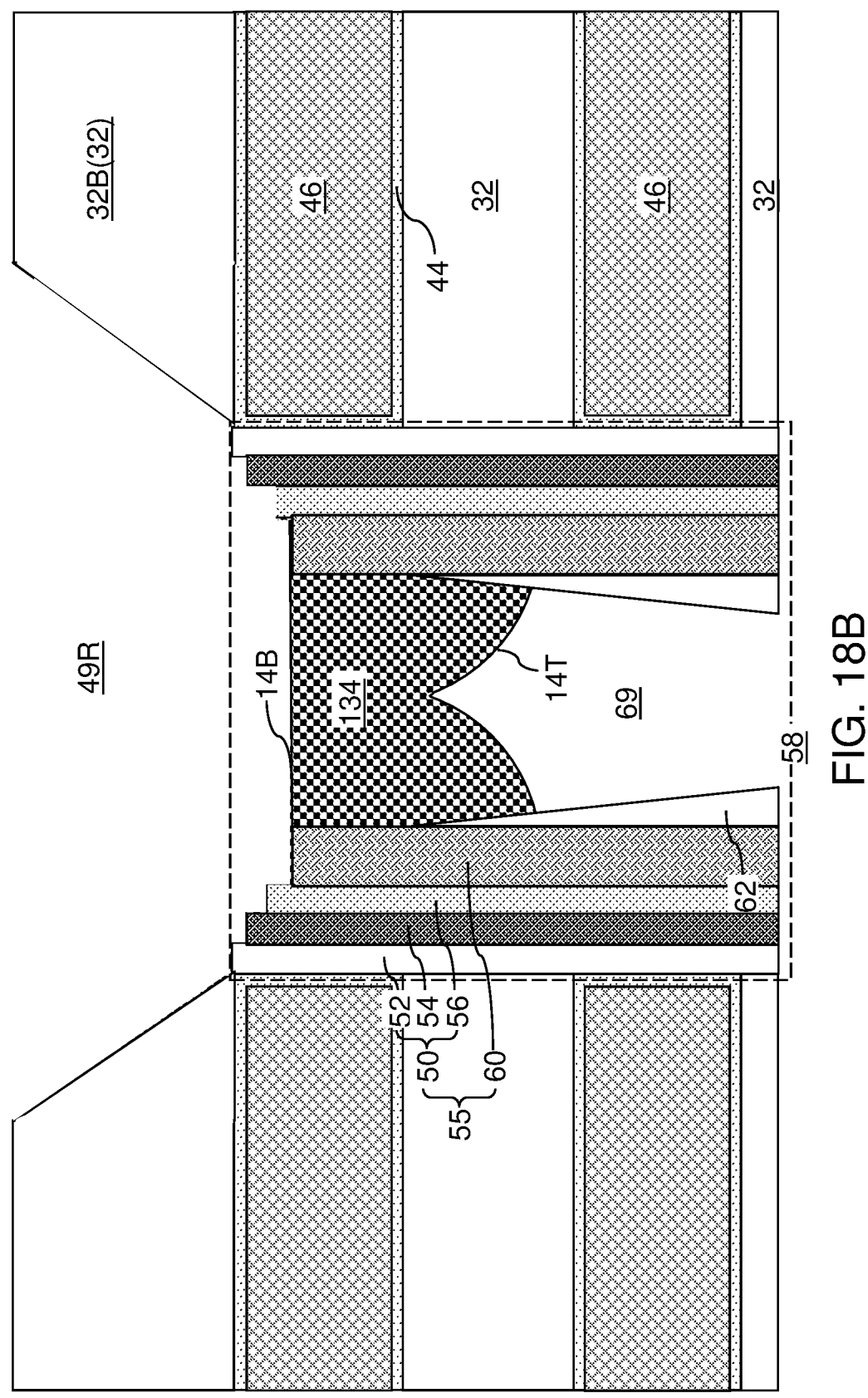
Figure 18C:
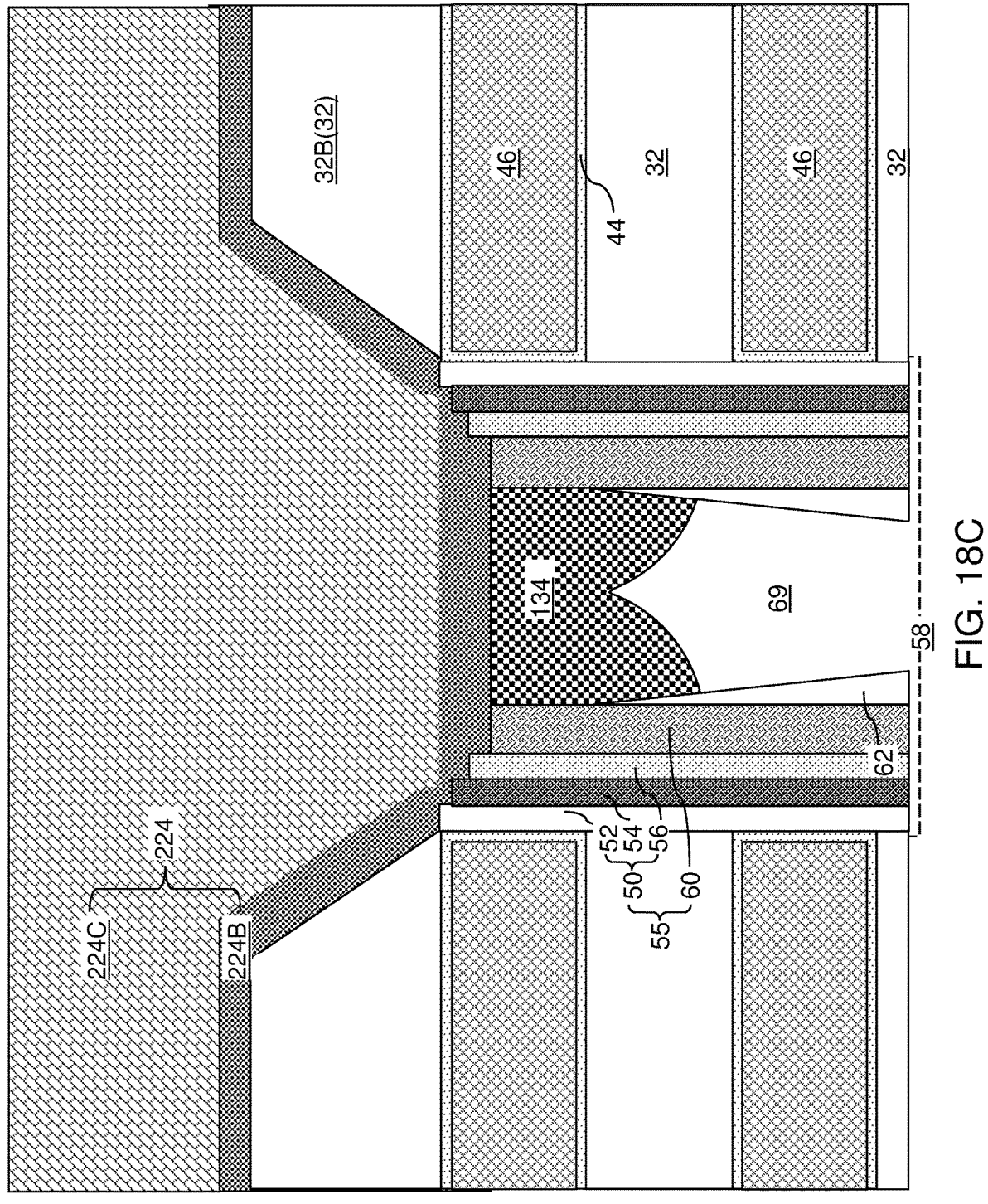

FIGS. 18A-18C are sequential vertical cross-sectional views of a region of the first exemplary structure during formation of a channel cap structure in a third configuration according to the first embodiment of the present disclosure.

Referring to FIG. 18A, a third configuration of the first exemplary structure can be derived from the first configuration of the first exemplary structure illustrated in FIG. 16E by depositing a metal layer into the recesses 49R that reacts with a semiconductor material to form a metal-semiconductor alloy. For example, a metal layer 231 comprising and/or consisting essentially of at least one metal selected from titanium, tungsten, nickel, cobalt, molybdenum, platinum, and/or palladium can be deposited on the bottom surfaces of the 14B of the semiconductor portions 114 and the bottom surface of the bottommost layer in the alternating stack (32, 46). The metal layer 231 may be deposited by a non-conformal deposition process such as a physical vapor deposition process, or by a conformal deposition process such as a chemical vapor deposition process.

Referring to FIG. 18B, a thermal anneal process can be performed to induce reaction between the semiconductor material (e.g., Si, Ge or SiGe) of the semiconductor portions (114 or 124) with the metal in the metal layer 231. Metal-semiconductor alloy portions such as a metal silicide, metal germanide or metal silicide-germanide can be formed by reaction of the semiconductor material of the semiconductor portions 114 with the metal in the metal layer 231. Thus, the semiconductor portions 114 are converted to metal-semiconductor alloy portions 134. The metal-semiconductor alloy portions 134 comprise titanium, tungsten, nickel, cobalt, molybdenum, platinum, or palladium silicide, germanite or silicide-germanide.

Unreacted portions of the metal layer 231 can be subsequently removed by performing an etch process, such as a wet etch process, that selectively etches the metal layer 231 selective to the metal-semiconductor alloy portions 134.

Referring to FIG. 18C, the processing steps described with reference to FIG. 16F can be performed to form a source contact structure 224 on the metal-semiconductor alloy portions 134.

In an alternative embodiment, the metal-semiconductor alloy portions 134 are formed by selective deposition. In this alternative embodiment, the metal deposition, annealing and metal removal steps described above with respect to FIGS. 18A and 18B are omitted. Instead, a metal silicide, germanide or silicide-germanide is selectively grown from exposed portions of the vertical semiconductor channel instead of the semiconductor portion 114 at the step of FIG. 16D. Subsequently, the recess etch step of FIG. 16E is performed on the metal silicide, germanide or silicide-germanide, to form the metal-semiconductor alloy portions 134. Then, the processing steps described with reference to FIG. 16F can be performed to form the source contact structure 224 on the metal-semiconductor alloy portions 134, as shown in FIG. 18C.

Figure 19:
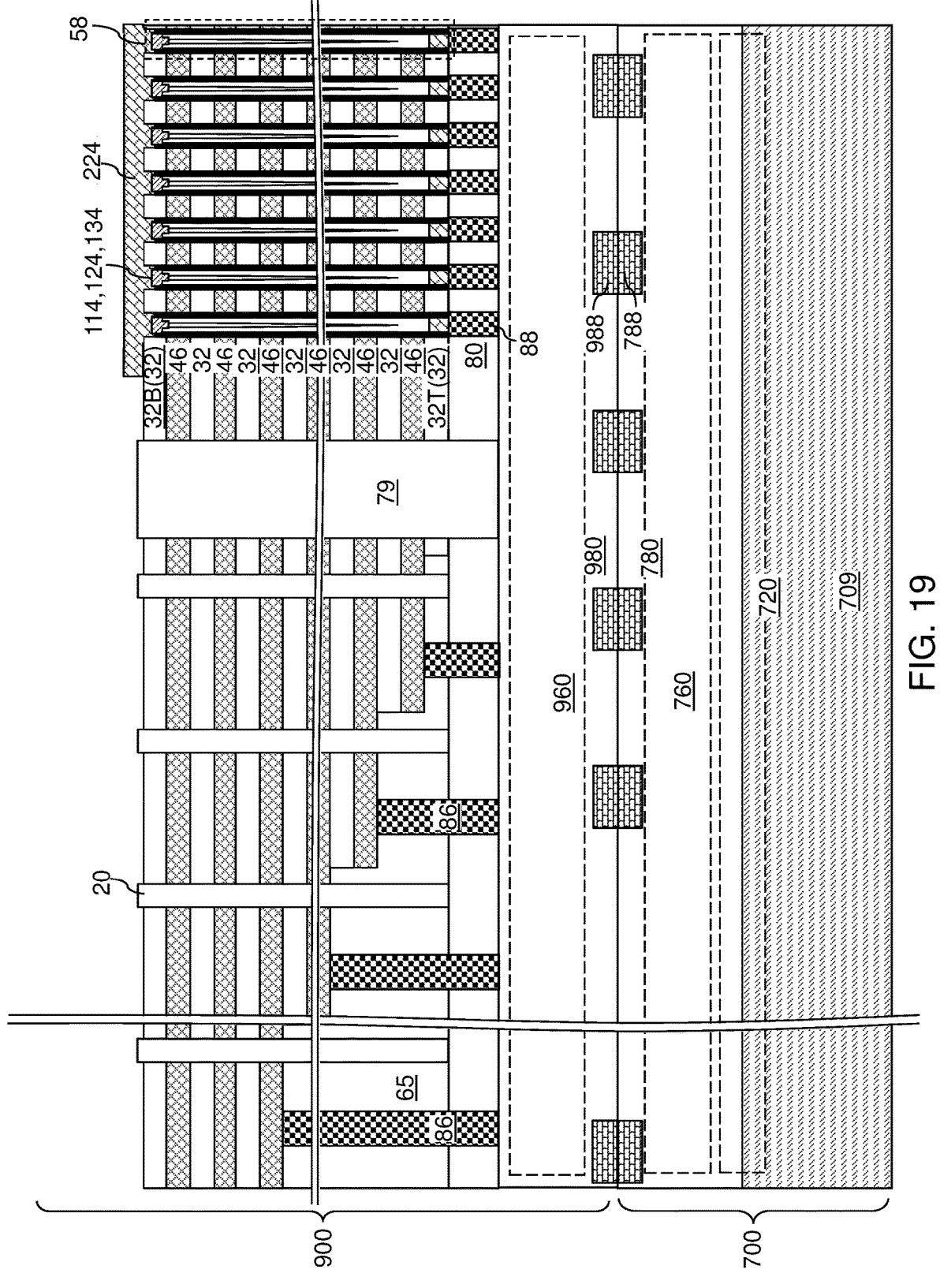
FIG. 19 is a vertical cross-sectional view of the first exemplary structure after formation of a source contact structure according to the first embodiment of the present disclosure.

Referring to FIG. 19, the first exemplary structure is illustrated after formation of a source contact structure 224. A Group IV-containing material portion (114, 124, 134) is located between the source contact structure 224 and the vertical semiconductor channel 60. The Group IV-containing material portion may contain at least one element from Group IVA (also known as Group 14) of the Periodic Table of Elements, such as silicon and/or germanium. In one embodiment, the Group IV-containing material portion (114, 124, 134) comprises the intrinsic Si, Ge or SiGe semiconductor portion 114. In another embodiment, the Group IV-containing material portion (114, 124, 134) comprises the doped Si, Ge or SiGe doped semiconductor portion 124. In another embodiment, the Group IV-containing material portion (114, 124, 134) comprises the metal-silicide, metal germanide or metal silicide-germanide metal-semiconductor alloy portion 134.

Referring to FIGS. 1-19 and according to the first embodiment of the present disclosure, a semiconductor structure comprises: an alternating stack (32, 46) of insulating layers 32 and electrically conductive layers 46; a memory opening 49 vertically extending through the alternating stack (32, 46); a memory opening fill structure 58 located in the memory opening 49 and comprising a memory film 50 and a vertical semiconductor channel 60 that laterally surrounds a core cavity 69 that is free of any solid-phase material therein; a Group IV-containing material portion (114, 124, 134) contacting an end portion of the vertical semiconductor channel 60 and exposed in the core cavity 69; and a source contact structure 224 in contact with a bottom surface 14B of the Group IV-containing material portion (114, 124, 134) and a bottom surface of a bottommost layer in the alternating stack (32, 46).

In one embodiment, the memory opening fill structure 58 further comprises a dielectric core 62 that laterally surrounds the core cavity 69 and is laterally surrounded by the vertical semiconductor channel 60. In one embodiment, the Group IV-containing material portion (114, 124, 134) is in contact with an end segment of an inner sidewall of the dielectric core 62 that is exposed to the core cavity 69. In one embodiment, a lateral thickness of the dielectric core 62, as measured between the inner sidewall of the dielectric core 62 and an outer sidewall of the dielectric core 62, increase with an vertical distance from the source contact structure 224 around an end portion of the core cavity 69.

In one embodiment, a top surface 14T of the Group IV-containing material portion (114, 124, 134) comprises a tapered convex surface having a lowest point at a center region thereof.

In one embodiment, the vertical semiconductor channel 60 has a tubular configuration, and the Group IV-containing material portion (114, 124, 134) is located within an end portion of a cylindrical cavity within the vertical semiconductor channel 60.

In one embodiment, the Group IV-containing material portion comprises at least one silicon or germanium. In one embodiment, the Group IV-containing material portion comprises a semiconductor portion 114 consisting essentially of silicon, germanium or silicon-germanium.

In another embodiment, the Group IV-containing material portion comprises a doped semiconductor portion 124 consisting essentially of silicon, germanium or silicon-germanium doped with at least one p-type or n-type dopant. In one embodiment, the vertical semiconductor channel 60 has a doping of a first conductivity type; and the doped semiconductor portion 124 has a doping of the first conductivity type. Alternatively, the vertical semiconductor channel 60 has a doping of a first conductivity type; and the doped semiconductor portion 124 has a doping of a second conductivity type that is an opposite of the first conductivity type.

In another embodiment, the Group IV-containing material portion comprises a metal-semiconductor alloy portion 134. The metal-semiconductor alloy portion 134 comprises a metal silicide, a metal germanide or a metal silicide-germanide. In one embodiment, an annular end surface of the vertical semiconductor channel 60 is in contact with the source contact structure 224.

In the first embodiment, the Group IV-containing material portion (114, 124, 134) (e.g., the channel cap structure) can be formed at a relatively low temperature (e.g., below 400 degrees Celsius) to avoid negatively affecting the bonding pads and the quality of the bond between the logic die 700 and the memory die 900. The channel cap structure provides low contact resistance between the source contact structure 224 and the vertical semiconductor channel 60. Furthermore, the channel cap structure extends into the alternating stack at least to a vertical level of the bottommost source side select gate electrode 46 to improve hole injection into the vertical semiconductor channel 60 from the source contact structure 224 during a gate induced leakage type erase operation of the memory device.

Figure 20A:
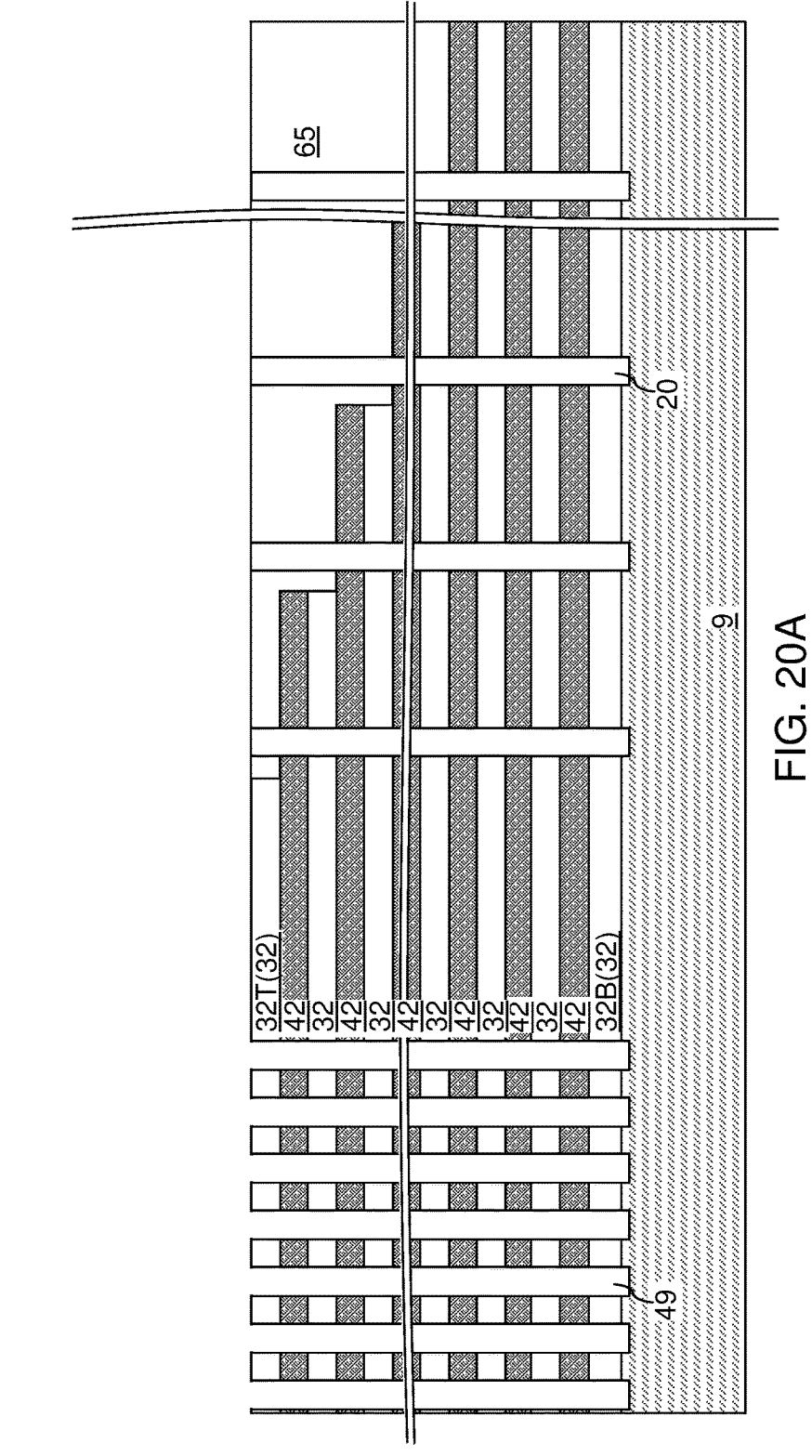
FIG. 20A is a schematic vertical cross-sectional view of a second exemplary structure after formation of memory openings according to the second embodiment of the present disclosure.
Figure 20B:
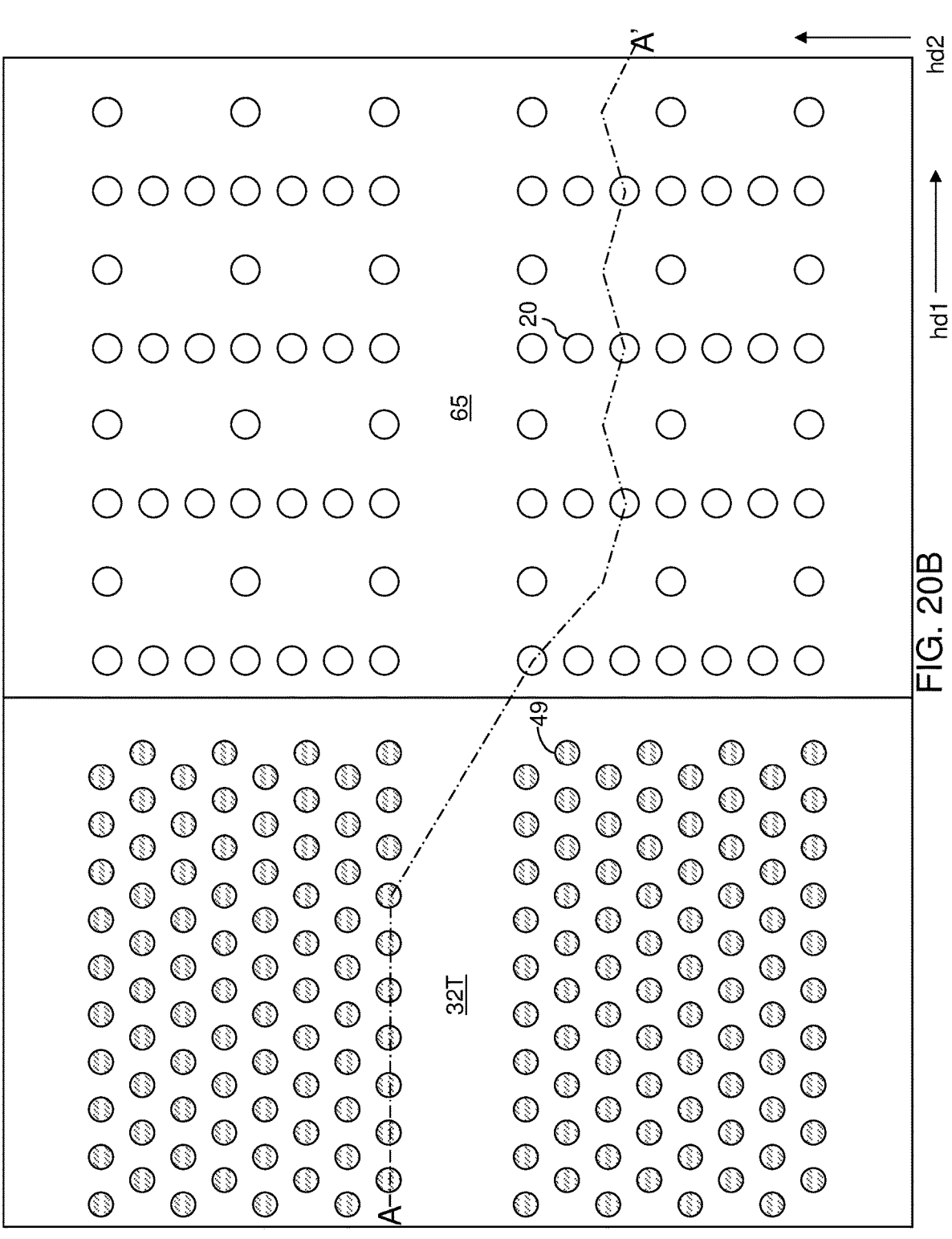
FIG. 20B is a top-down view of the second exemplary structure of FIG. 20A. The vertical plane A-A is the cut plane of the vertical cross-sectional view of FIG. 20A.

Referring to FIGS. 20A and 20B, a second exemplary structure according to the second embodiment of the present disclosure can be the same as the first exemplary structure illustrated in FIGS. 5A and 5B. In one embodiment, the recess etch distance of the memory openings 49 into the carrier substrate 9 may be not greater than the sum of the thicknesses of a memory film 50 and a vertical semiconductor channel 60 to be subsequently formed in each memory opening 49. Alternatively, the recess etch distance of the memory openings 49 into the carrier substrate 9 may be greater than the sum of the thicknesses of a memory film 50 and a vertical semiconductor channel 60 to be subsequently formed in each memory opening 49.

Referring to FIGS. 21A-21D, the processing steps described with reference to FIGS. 6B-6F can be performed to form a memory opening fill structure 58 within each memory opening 49, but without forming the sacrificial pedestal structures 11.

Figures 21A, 21B:
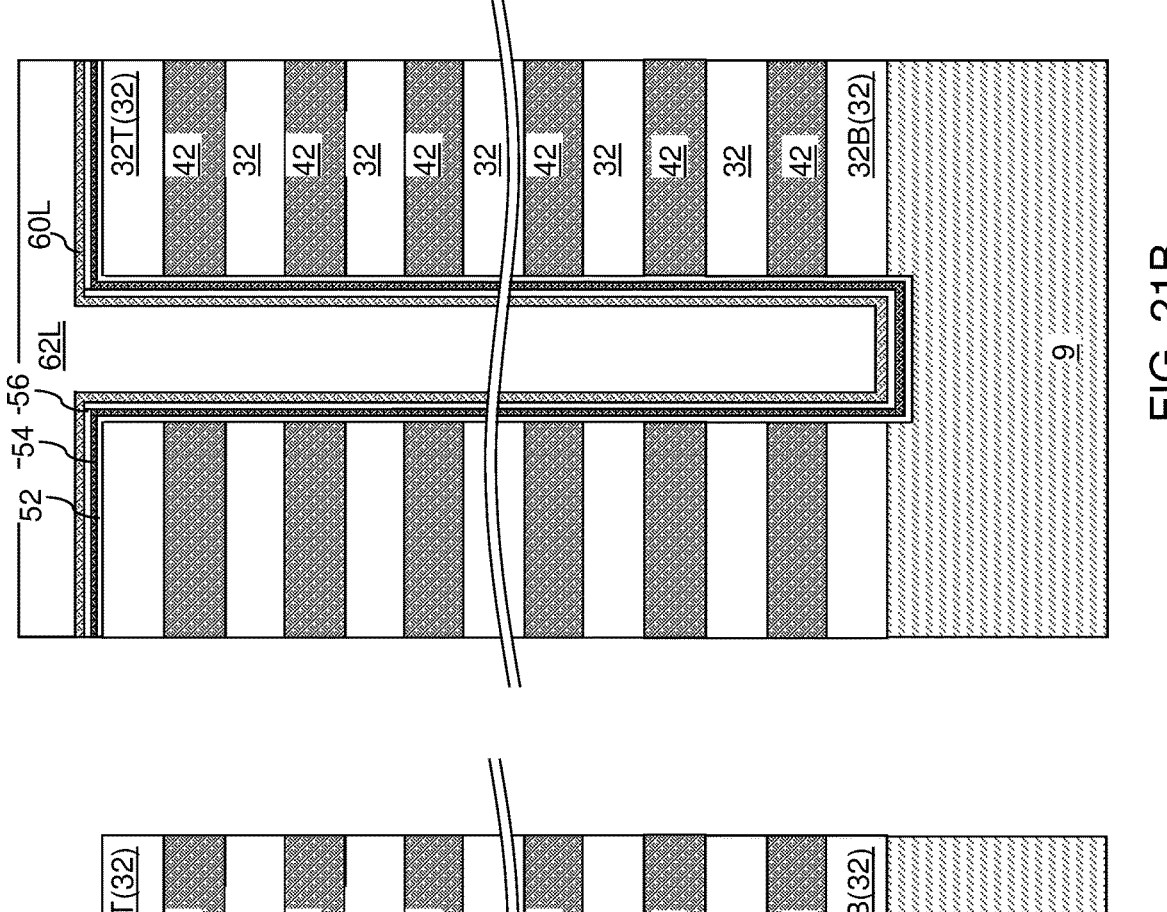
FIGS. 21A-21D are sequential vertical cross-sectional views of a memory opening during formation of a memory opening fill structure according to an embodiments of the present disclosure.
Figures 21C, 21D:
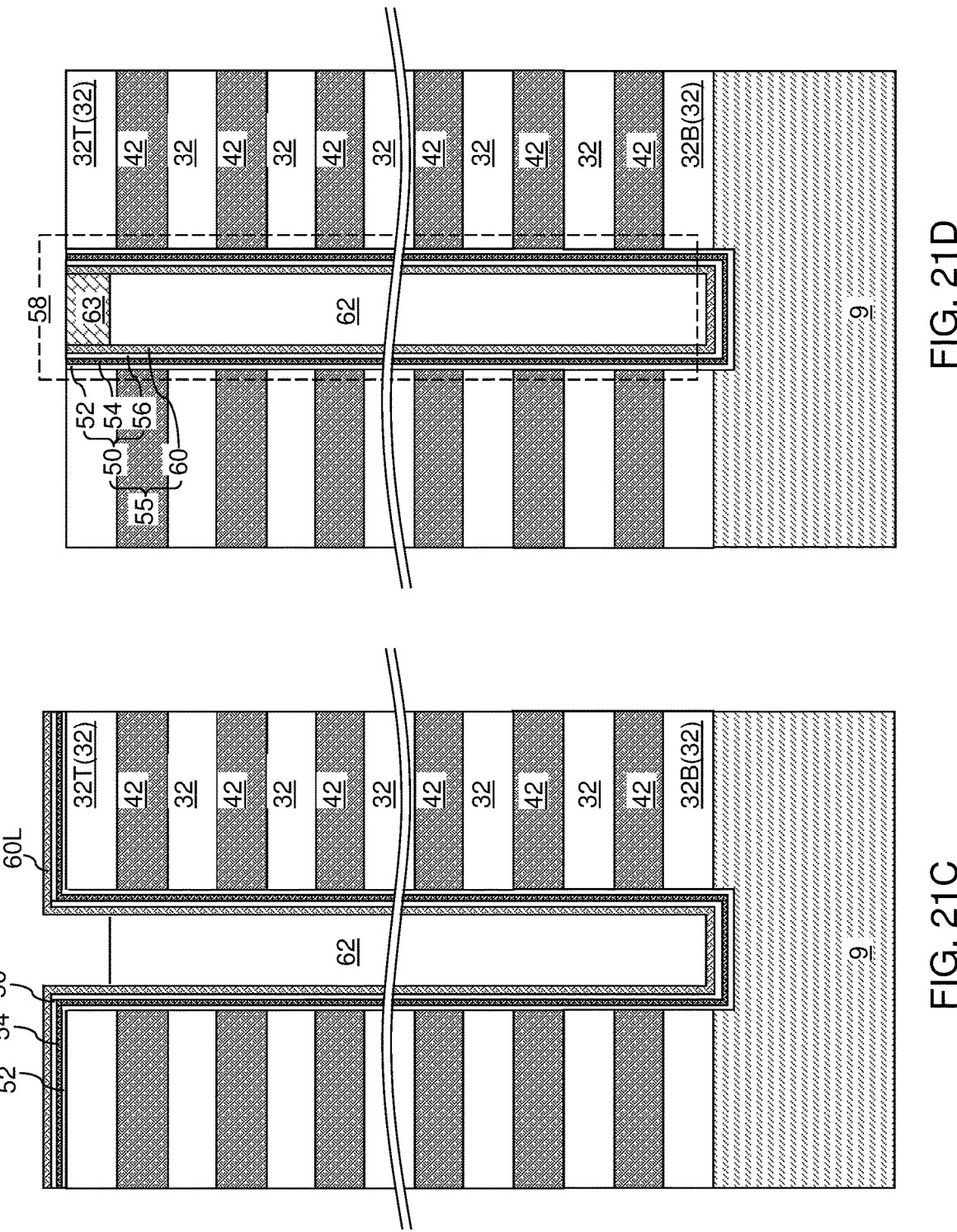

Referring to FIG. 21A, a memory opening 49 in the second exemplary structure illustrated in FIGS. 20A and 20B is illustrated.

Figure 22A:
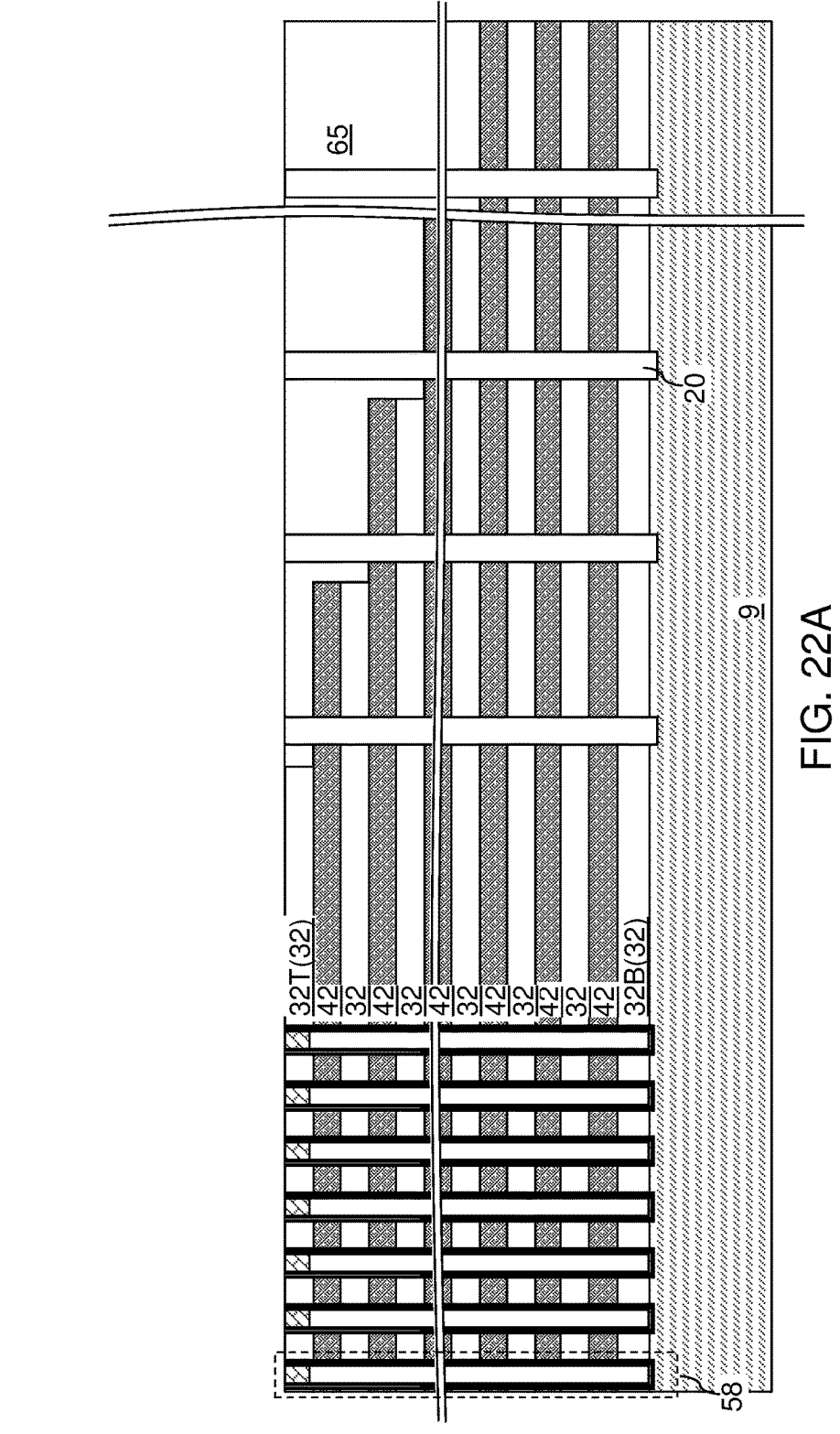
FIG. 22A is a schematic vertical cross-sectional view of the second exemplary structure after formation of memory opening fill structures according to the second embodiment of the present disclosure.
Figure 22B:
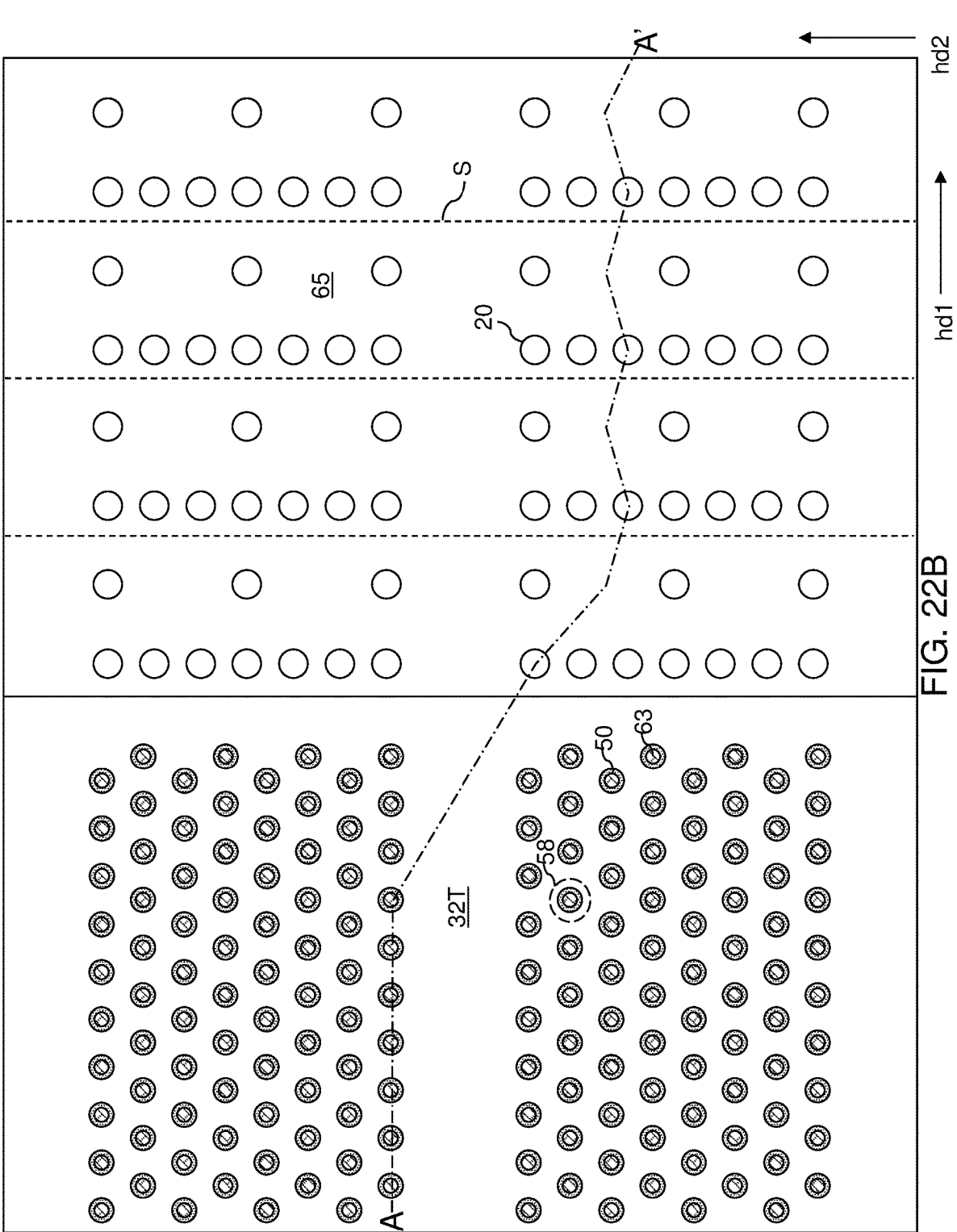
FIG. 22B is a top-down view of the second exemplary structure of FIG. 22A. The vertical plane A-A is the cut plane of the vertical cross-sectional view of FIG. 22A.

Referring to FIG. 22B, the processing steps described with reference to FIGS. 6B, 6C, and 6D can be performed to sequentially deposit an optional blocking dielectric layer 52, a memory material layer 54, an optional dielectric liner 56, a semiconductor channel material layer 60L, and a dielectric core layer 62L. Formation of sacrificial pedestal structures 11, illustrated in FIG. 6A, is omitted during the processing steps employed to form the second exemplary structure.

Referring to FIG. 22C, the processing steps described with reference to FIG. 6E can be performed to form a dielectric core 62 in each memory opening 49.

Referring to FIG. 22D, the processing steps described with reference to FIG. 6F can be performed to form a memory opening fill structure 58 in each memory opening 49.

Referring to FIGS. 22A and 22B, the second exemplary structure is illustrated after formation of the memory opening fill structures 58.

Figure 23A:
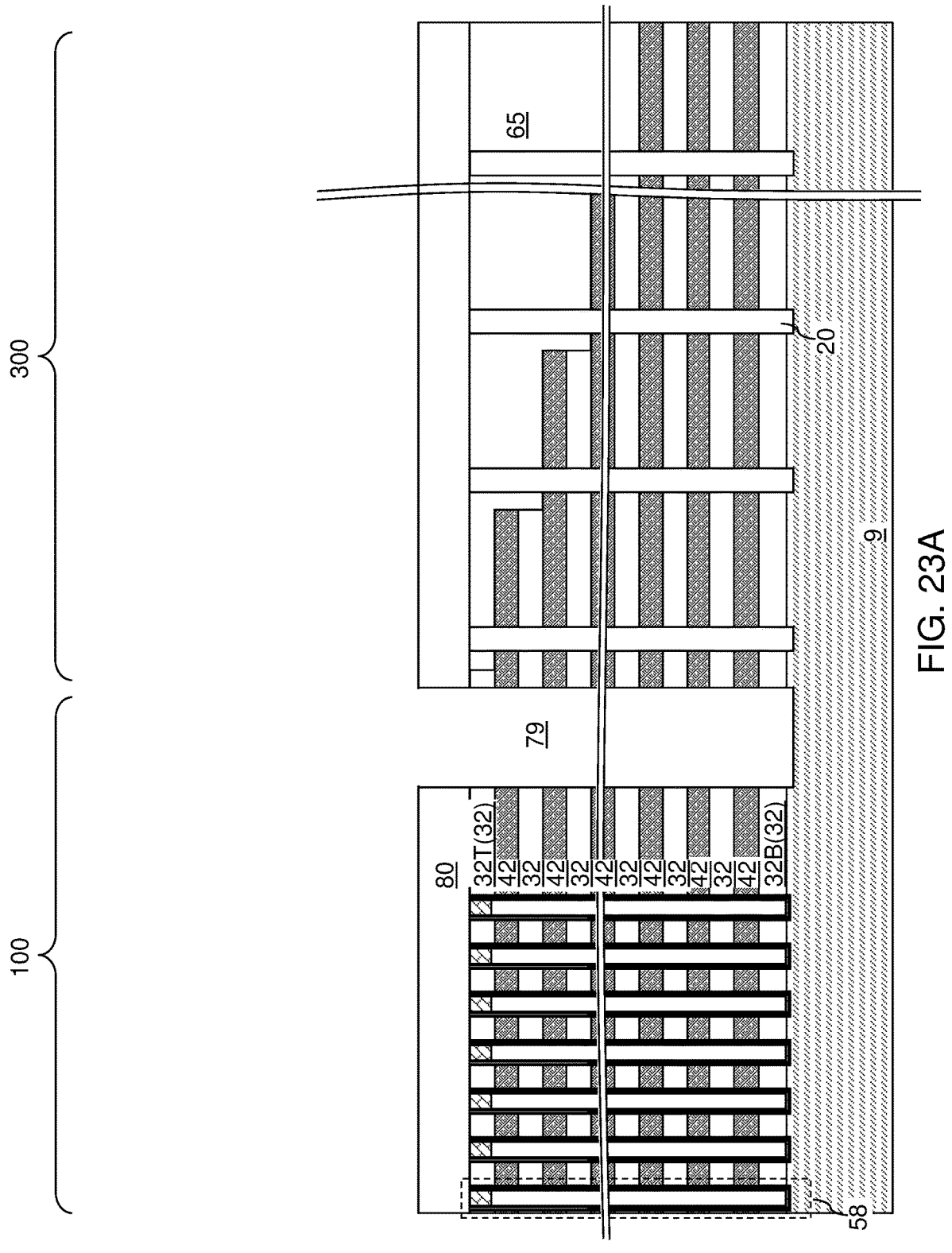
FIG. 23A is a vertical cross-sectional view of the second exemplary structure after formation of lateral isolation trenches according to the second embodiment of the present disclosure.
Figure 23B:
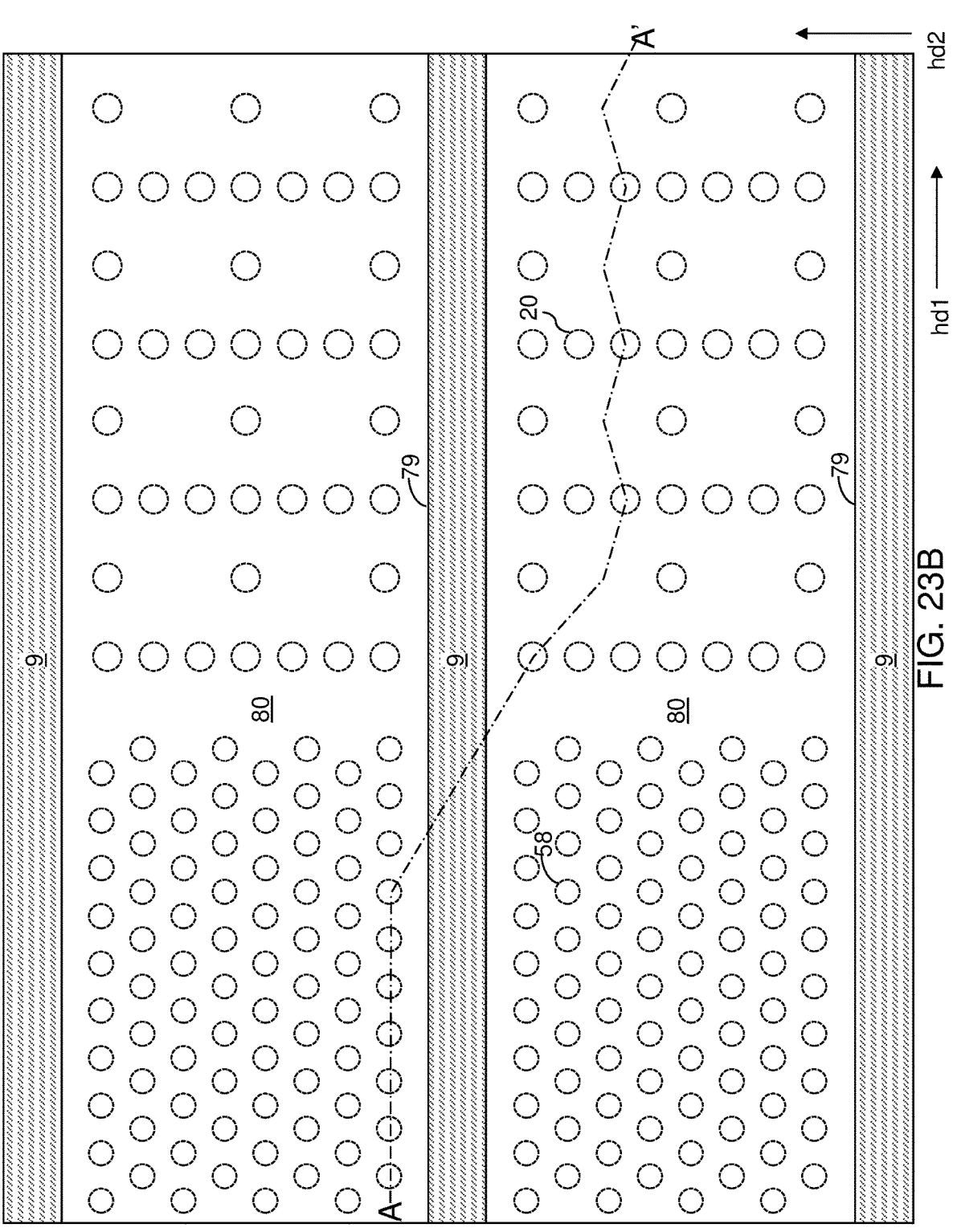
FIG. 23B is a top-down view of the second exemplary structure of FIG. 23A. The vertical plane A-A is the cut plane of the vertical cross-sectional view of FIG. 23A.

Referring to FIGS. 23A and 23B, the processing steps described with reference to FIGS. 8A and 8B can be performed to form a contact-level dielectric layer 80 and lateral isolation trenches 79.

Figure 24:
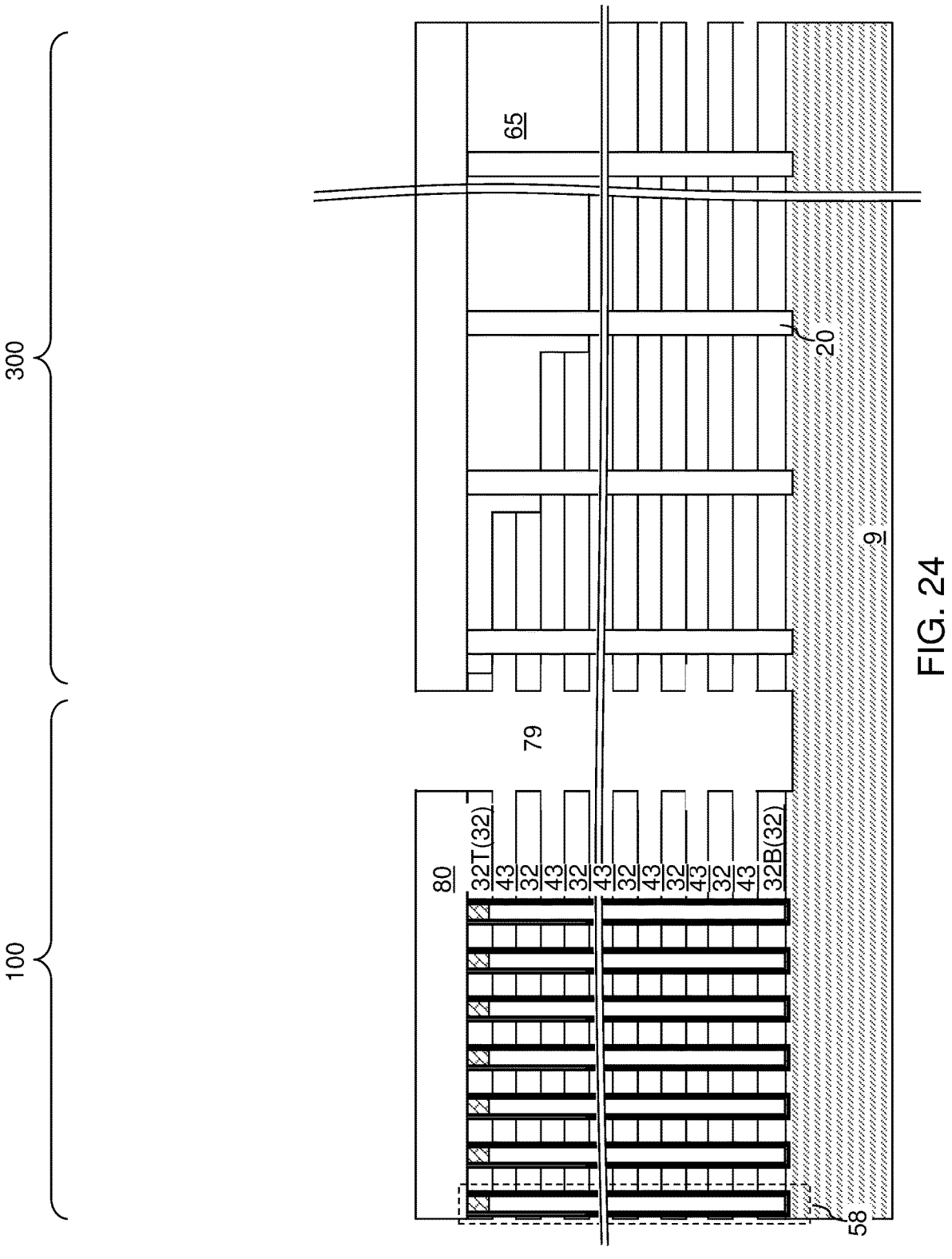
FIG. 24 is a vertical cross-sectional view of the second exemplary structure after formation of laterally-extending cavities according to the second embodiment of the present disclosure.

Referring to FIG. 24, the processing steps described with reference to FIG. 9 can be performed to form laterally-extending cavities 43.

Figure 25:
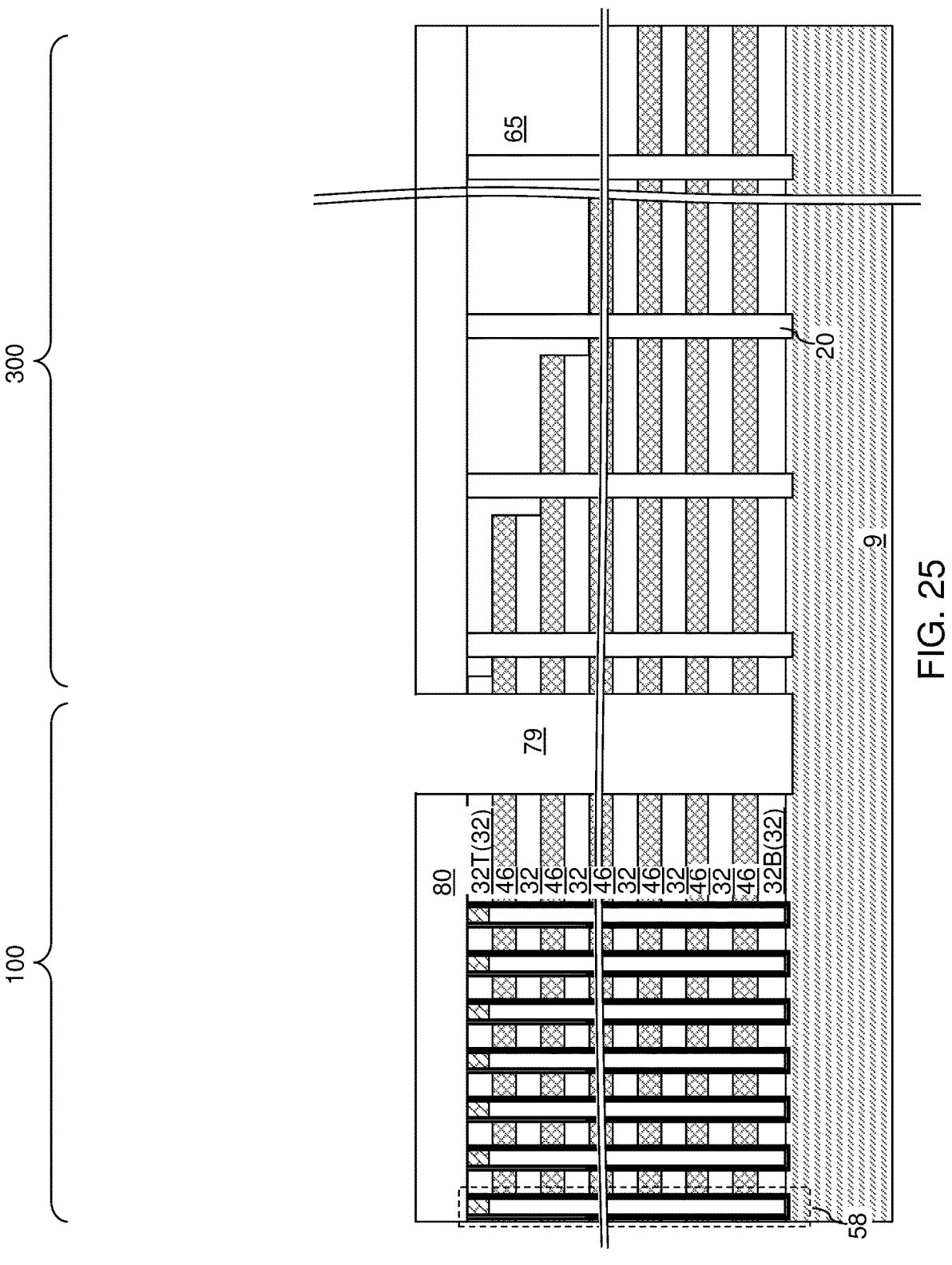
FIG. 25 is a schematic vertical cross-sectional view of the second exemplary structure after formation of electrically conductive layers according to the second embodiment of the present disclosure.

Referring to FIG. 25, the processing steps described with reference to FIG. 10 can be performed to form electrically conductive layers 46.

Figure 26A:
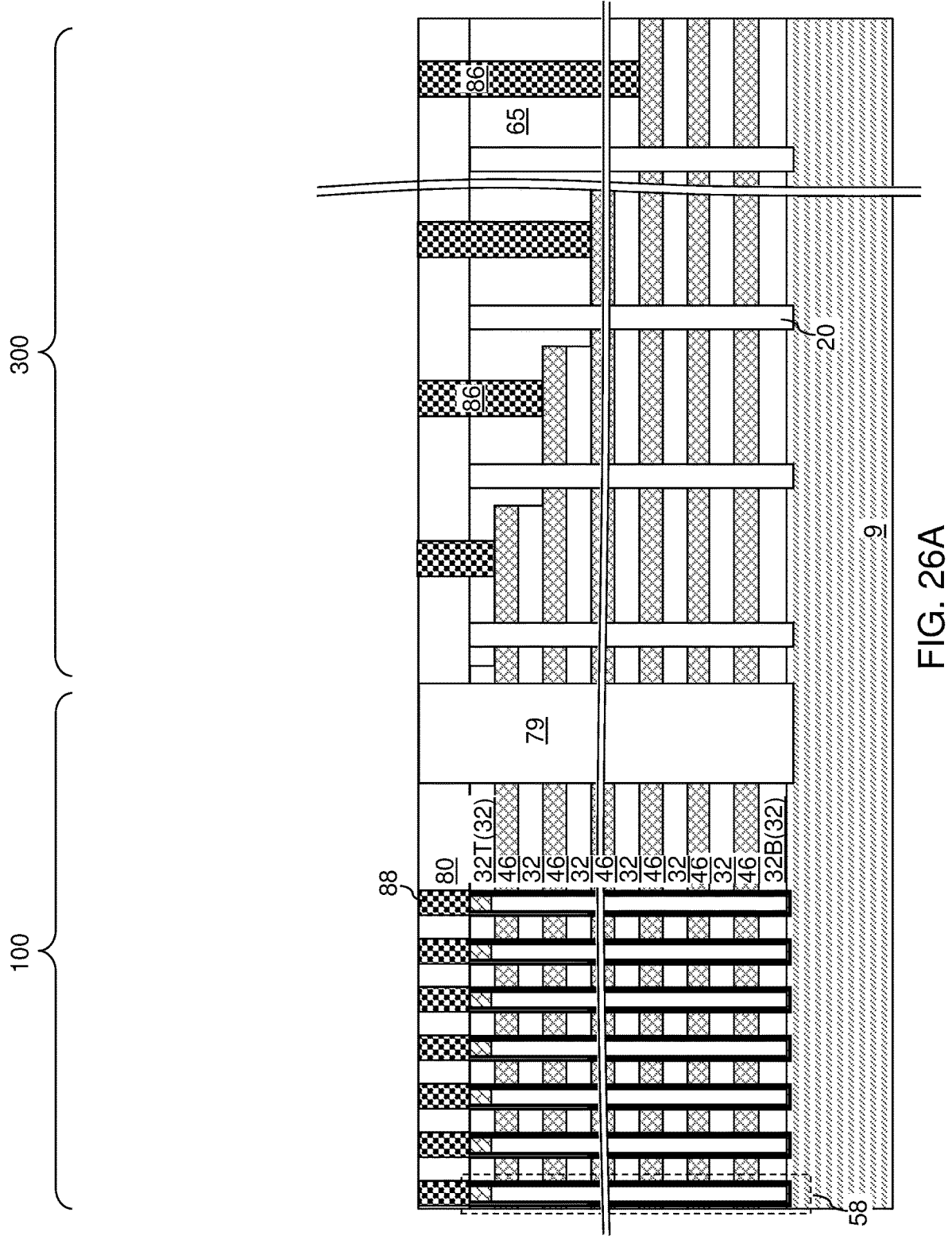
FIG. 26A is a vertical cross-sectional view of the second exemplary structure after formation of lateral isolation trench fill structures, layer contact via structures, and drain contact via structures according to the second embodiment of the present disclosure.
Figure 26B:
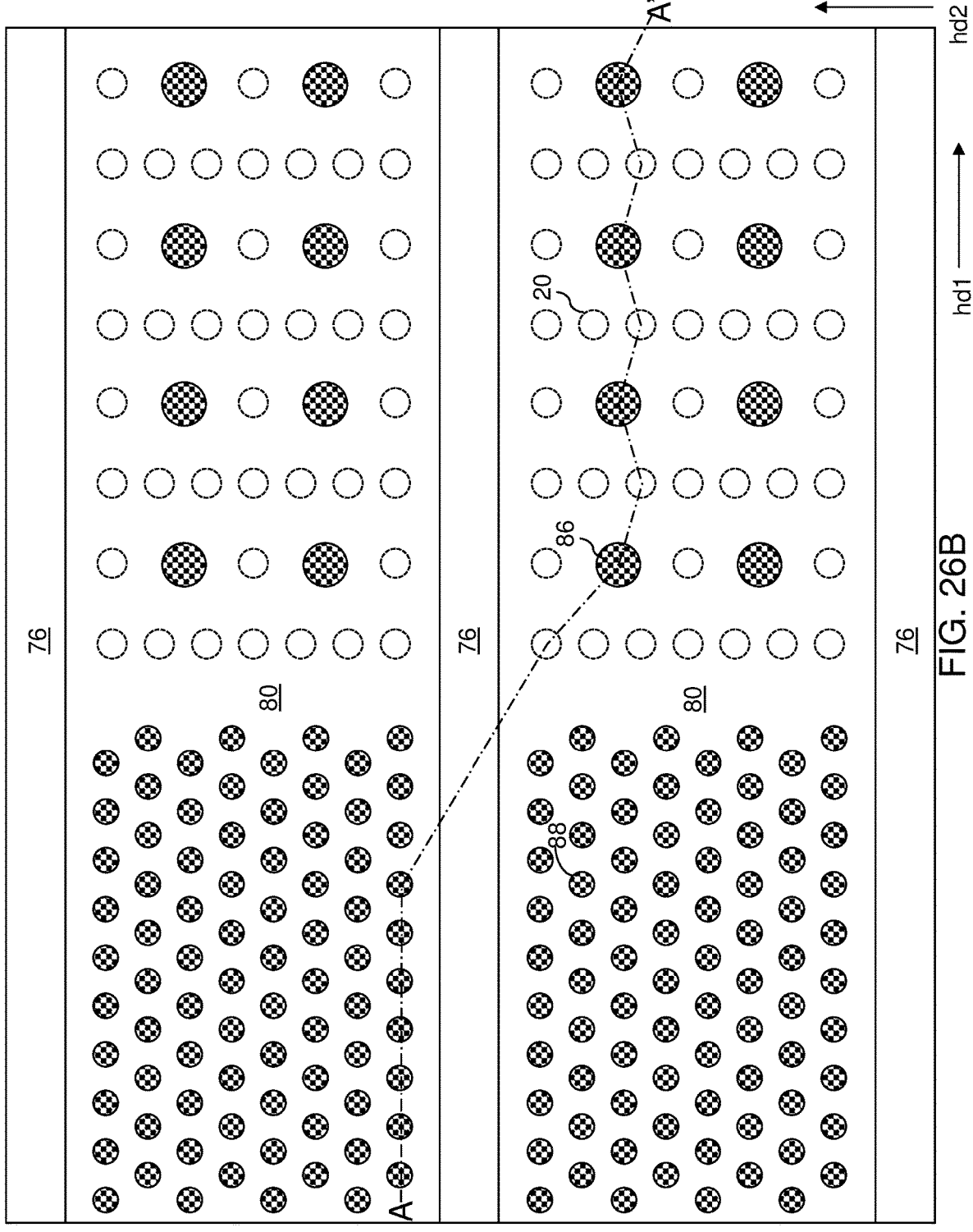
FIG. 26B is a top-down view of the second exemplary structure of FIG. 26A. The vertical plane A-A is the cut plane of the vertical cross-sectional view of FIG. 26A.

Referring to FIGS. 26A and 26B, the processing steps described with reference to FIGS. 11A and 11B can be performed to form lateral isolation trench fill structures 76, layer contact via structures 86, and drain contact via structures 88.

Figure 27:
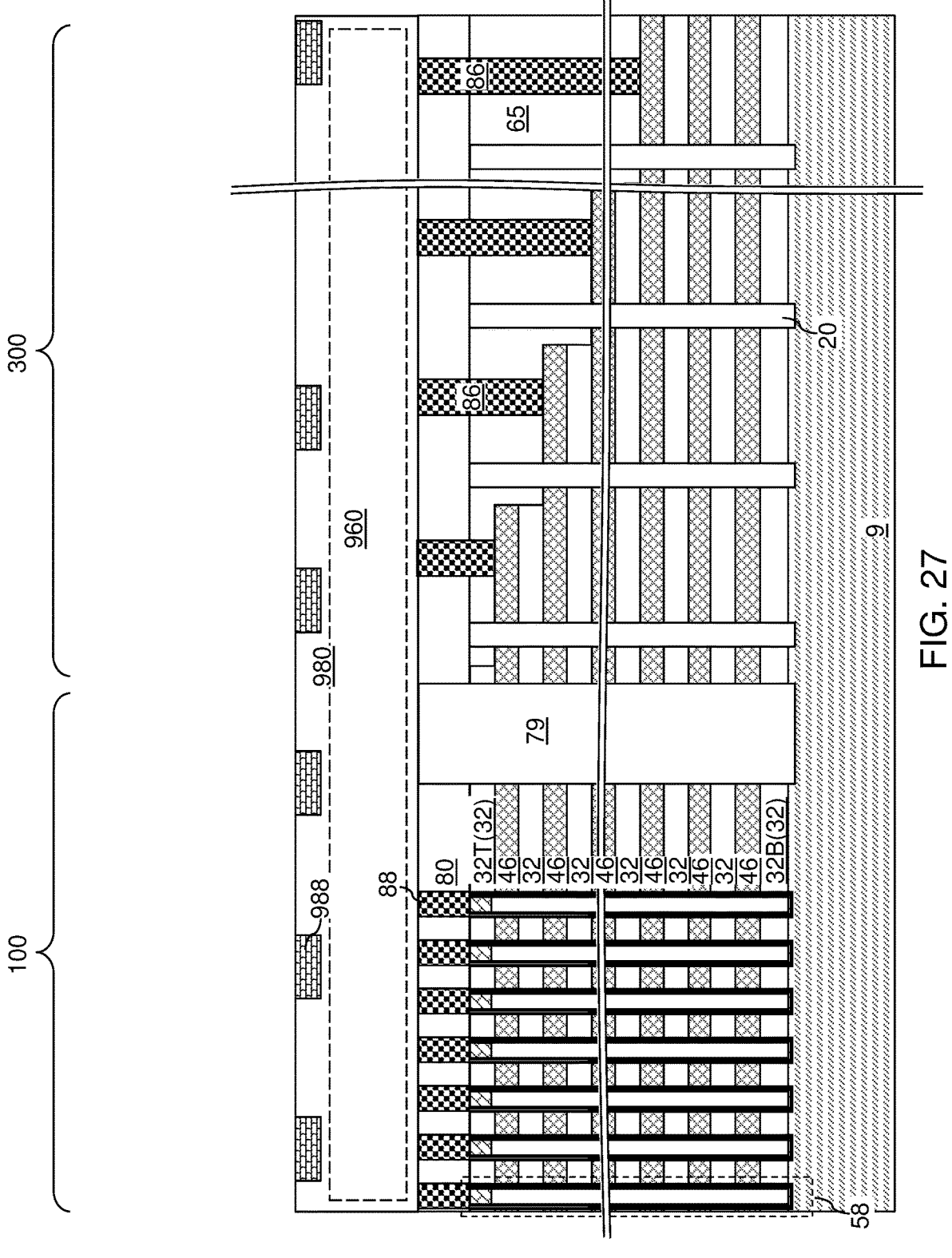
FIG. 27 is a vertical cross-sectional view of the second exemplary structure after formation of a memory die according to the second embodiment of the present disclosure.

Referring to FIG. 27, the processing steps described with reference to FIG. 12 can be performed to form a memory die 900.

Figure 28:
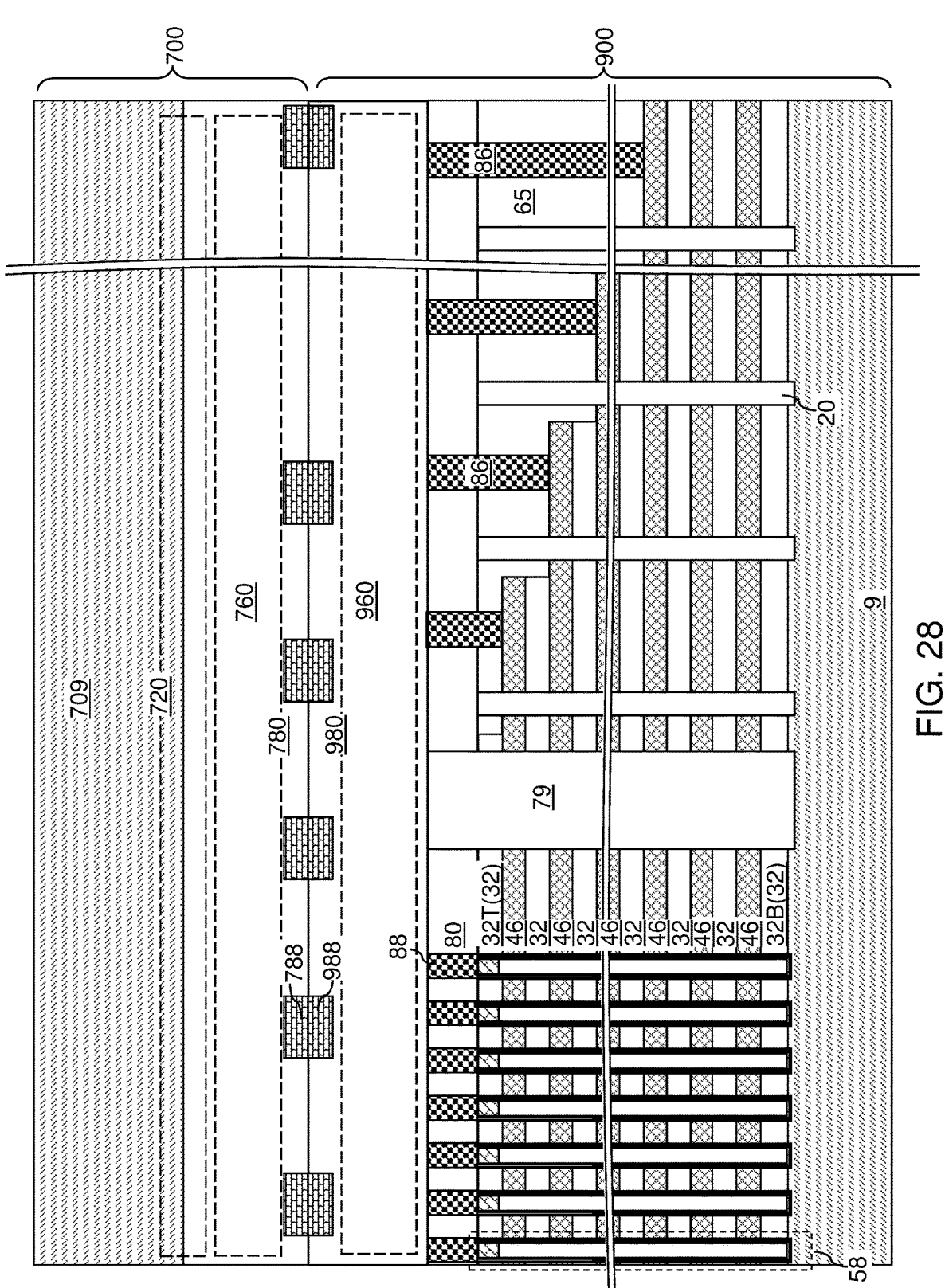
FIG. 28 is a vertical cross-sectional view of the second exemplary structure after attaching the logic die to the memory die according to the second embodiment of the present disclosure.

Referring to FIG. 28, the processing steps described with reference to FIG. 14 can be performed to form a bonded assembly of a logic die 700 to the memory die 900.

Figure 29A:
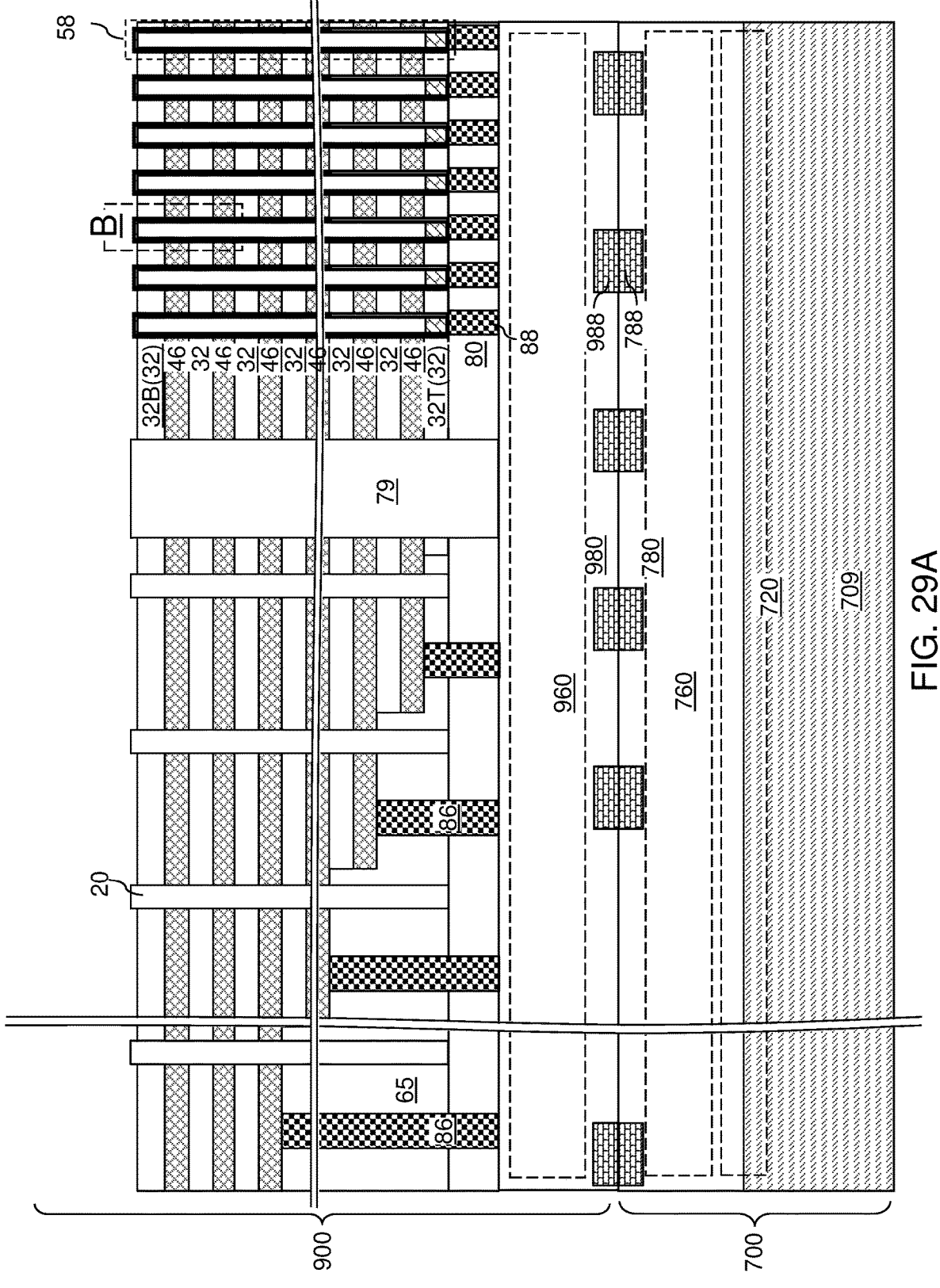
FIG. 29A is a vertical cross-sectional view of the second exemplary structure after removal of the carrier substrate according to the second embodiment of the present disclosure.
Figure 29B:
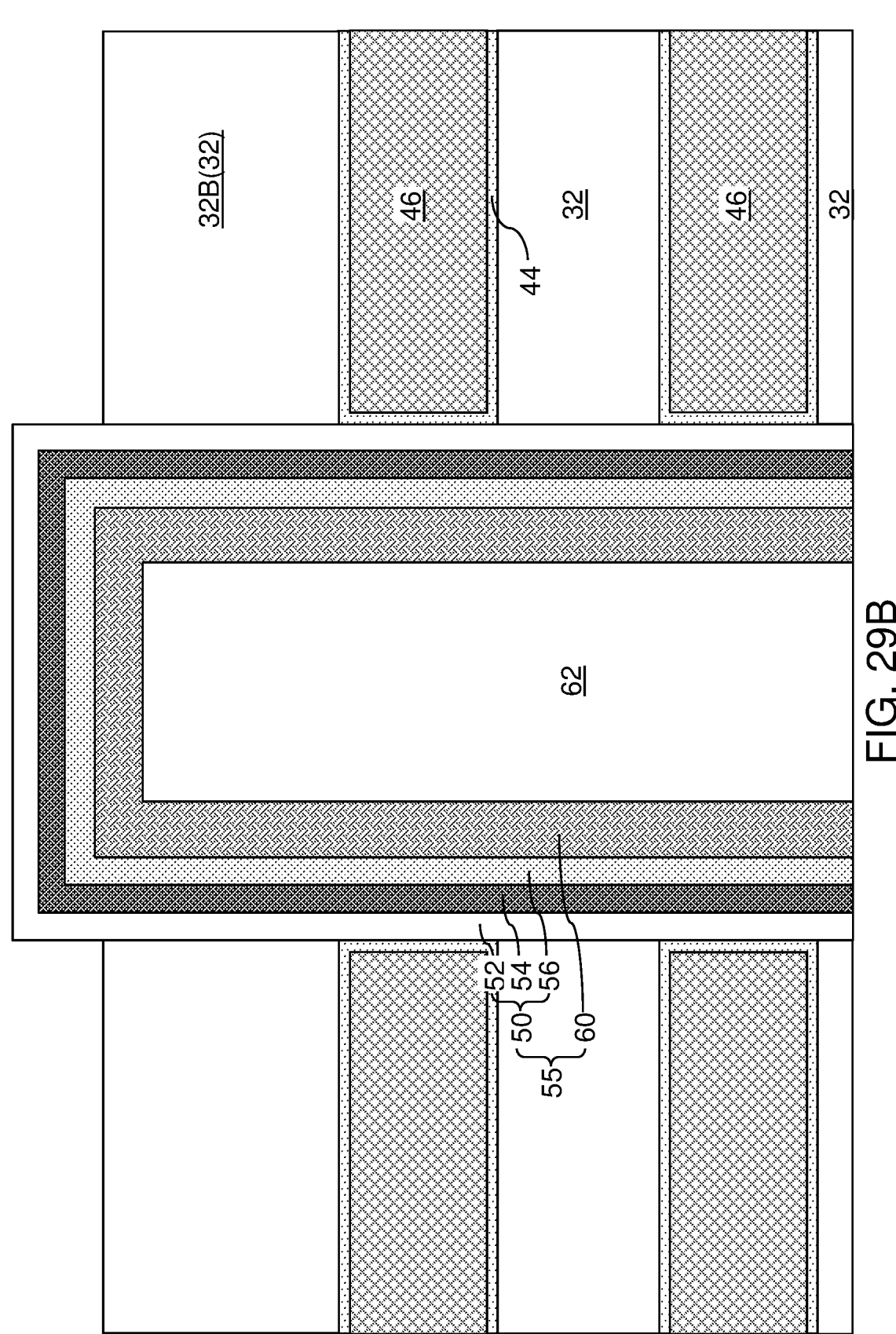
FIG. 29B is a magnified view of region B of FIG. 29A.

Referring to FIGS. 29A and 29B, the processing steps described with reference to FIGS. 15A and 15B may be performed to remove the carrier substrate 9 selective to the bottommost insulating layer 32B. In one embodiment, the carrier substrate 9 can be removed, for example, by grinding, polishing, cleaving, an isotropic etch process, and/or an anisotropic etch process. In one embodiment, at least a terminal step of at least one removal process that is employed to remove the carrier substrate 9 may comprise a selective wet etch process that etches the semiconductor materials selective to dielectric materials of the bottommost insulating layer 32B, the memory films 50, and the dielectric cores 62. In an illustrative example, the terminal step of the at least one removal process may comprise a wet etch process using hot trimethyl-2 hydroxyethyl ammonium hydroxide ("hot TMY") or tetramethyl ammonium hydroxide (TMAH). The entirety of the carrier substrate 9 can be removed by the selective wet etch process. Backside end surfaces of the support pillar structures 20 can be physically exposed upon removal of the carrier substrate 9. End surfaces of the memory films 50 can be physically exposed after the selective wet etch process. End portions of the memory opening fill structures 58 may protrude outward from the horizontal plane including a physically-exposed planar bottom surface of the bottommost insulating layer 32B.

Figure 30A:
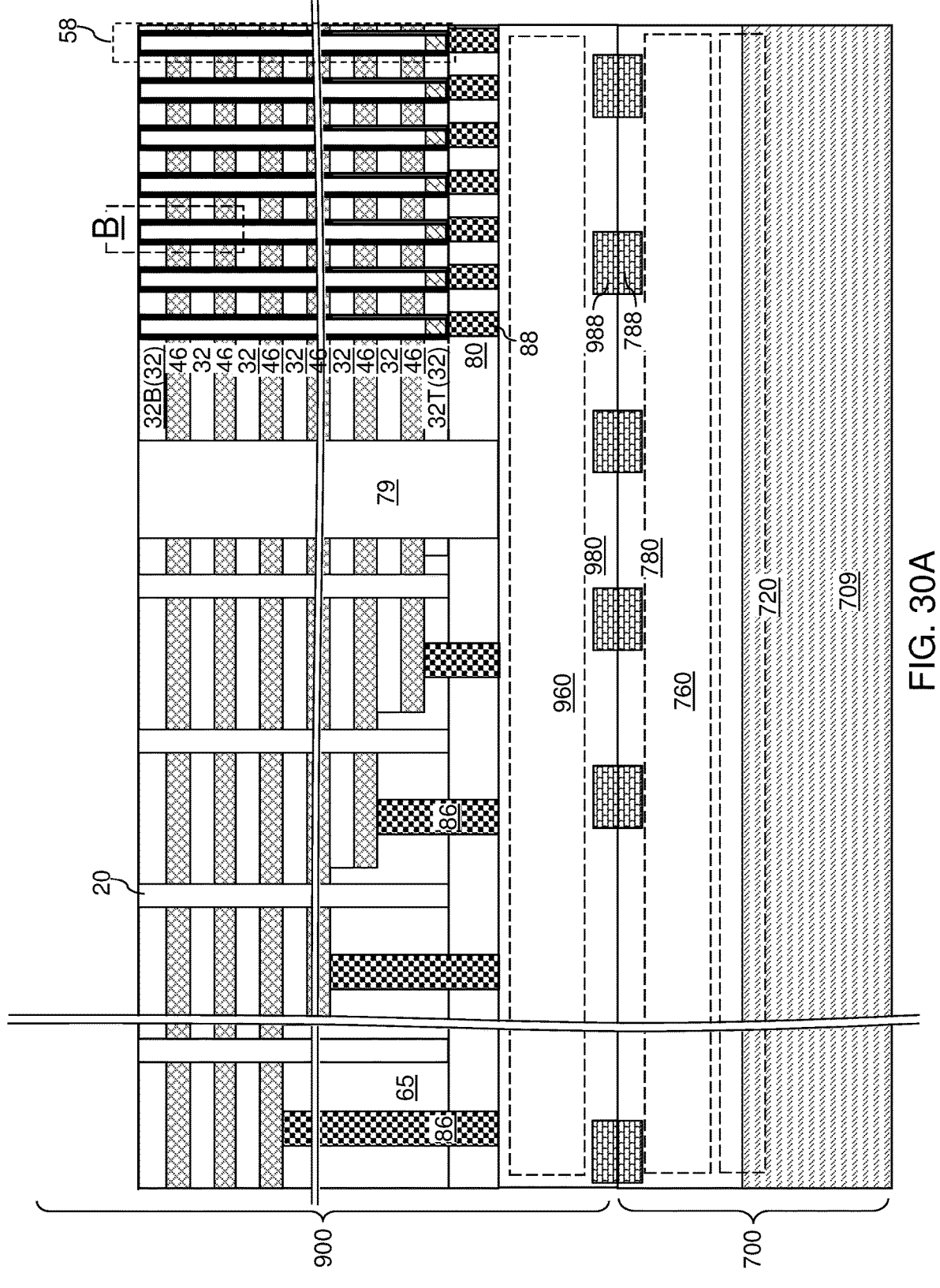
FIG. 30A is a vertical cross-sectional view of the second exemplary structure after performing a chemical mechanical polishing process according to the second embodiment of the present disclosure.
Figure 30B:
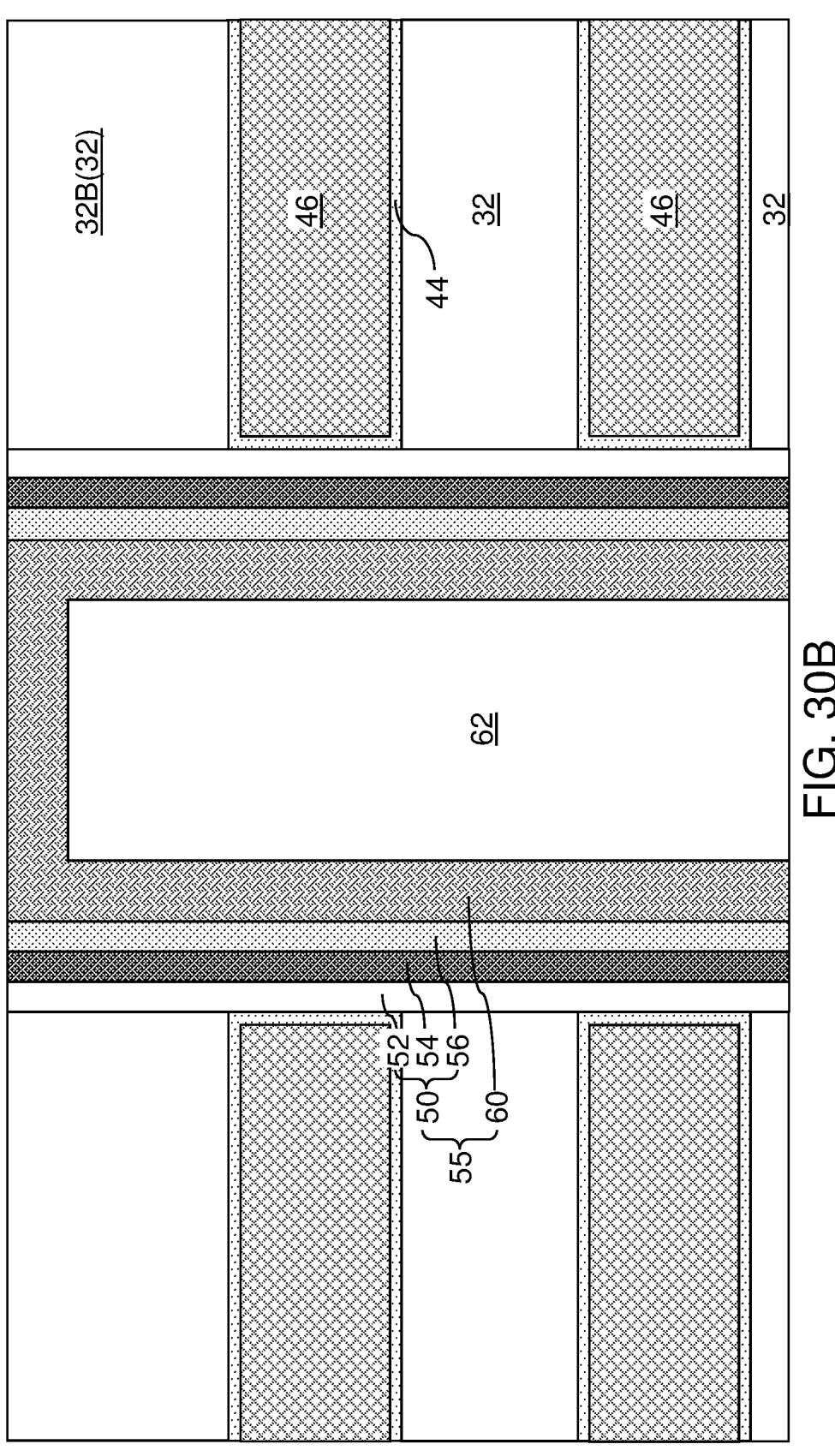
FIG. 30B is a magnified view of region B of FIG. 30A.

Referring to FIGS. 30A and 30B, an optional chemical mechanical polishing process can be performed to remove any portions of the memory opening fill structures 58 that protrude outward from the horizontal plane including the physically-exposed planar bottom surface of the bottommost insulating layer 32B. Remaining portion of the memory opening fill structures 58 may have physically exposed planar surfaces that are coplanar with the bottom surface of the bottommost insulating layer 32B. According to an embodiment of the present disclosure, the physically-exposed surfaces of the memory opening fill structures 58 may comprise end surfaces of vertical semiconductor channels 60. In one embodiment, each physically-exposed end surface of the vertical semiconductor channels 60 may comprise a planar horizontal surface that is free of any opening therein. For example, each physically-exposed end surface of the vertical semiconductor channels 60 may be a circular horizontal surface.

FIGS. 31A-31D are sequential vertical cross-sectional views of a region of a first configuration of the second exemplary structure during formation of a backside semiconductor cap structure 111 and a source contact structure according to the second embodiment of the present disclosure.

Figure 31A:
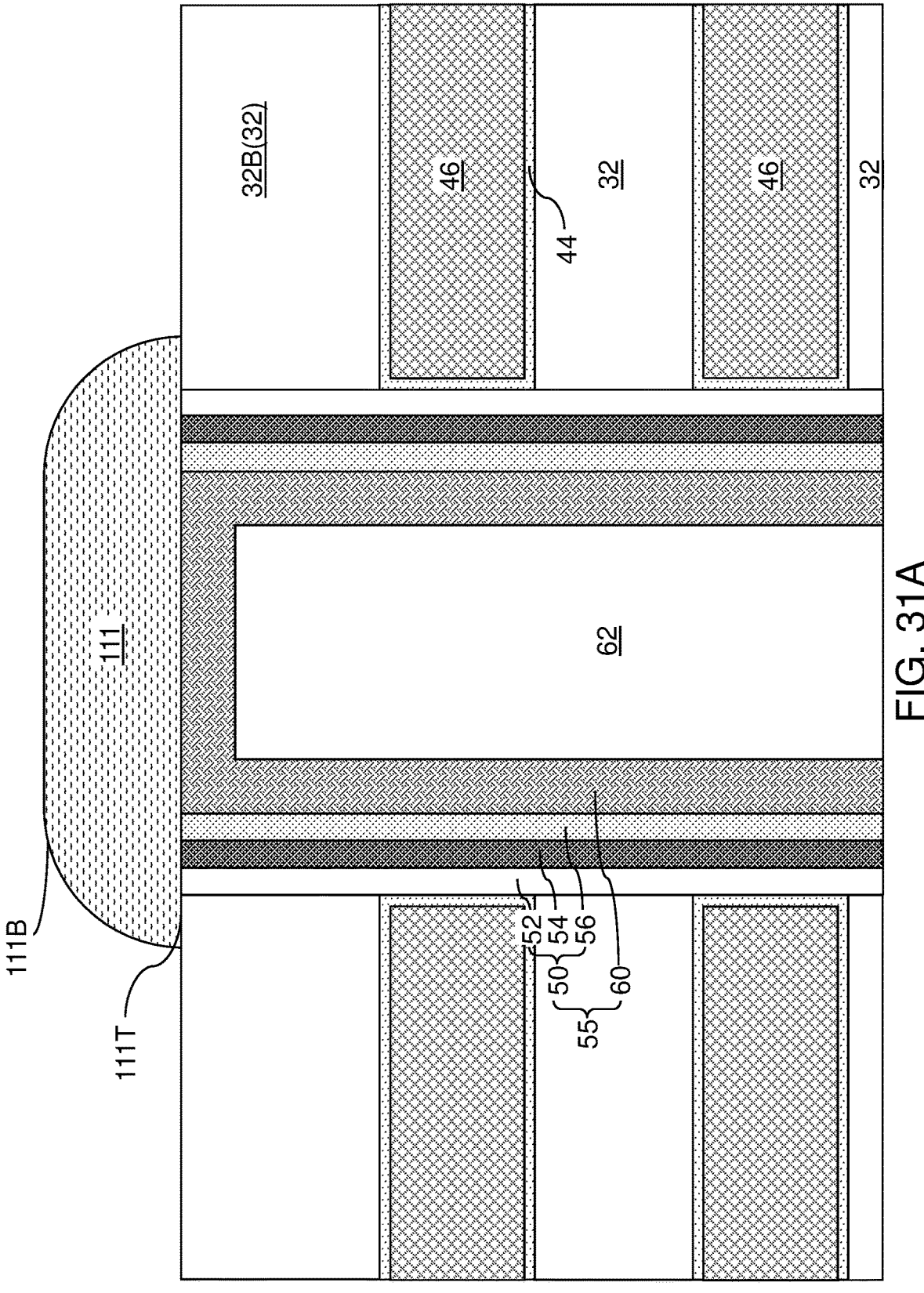
FIGS. 31A-31D are sequential vertical cross-sectional views of a region of a first configuration of the second exemplary structure during formation of a backside semiconductor cap structure and a source contact structure according to the second embodiment of the present disclosure.

Referring to FIG. 31A, a selective semiconductor deposition process can be performed to grow a semiconductor material from physically exposed semiconductor surfaces of the vertical semiconductor channels 60. The selective semiconductor deposition process employs concurrent or alternating flow of a reactant gas and an etchant gas during the deposition process. The reactant gas comprises a semiconductor-containing precursor gas such as $SiH_4$, $SiH_2Cl_2$, $SiHCl_3$, $Si_2H_6$, $Ge_2H_6$, etc. In one embodiment, the reactant gas may comprise at least one silicon-containing precursor gas, and the deposited semiconductor material may comprise silicon. A suitable dopant gas, such as diborane, phosphene, or arsine, may be optionally flowed as needed. In one embodiment, the selective semiconductor deposition process is carried out at a temperature below 400 degrees Celsius, such as 180 to 375 degrees Celsius to avoid damaging the bonding pads.

Deposited portions of the silicon-containing semiconductor material form a respective backside semiconductor cap structure 111. The backside semiconductor cap structure 111 may comprise a Group IV (i.e., Group IVA) semiconductor material, such as Si, Ge or SiGe. Generally, the selective semiconductor deposition process can grow a silicon-containing semiconductor material from the physically exposed surfaces of each vertical semiconductor channel 60 while suppressing growth of the semiconductor material from dielectric surfaces. In one embodiment, each backside semiconductor cap structure 111 comprises a semiconductor material portion contacting the entirety of an end surface of a vertical semiconductor channel 60, covering an entirety of an annular end surface of a memory film 50, and covering an annular surface segment of the backside surface of the bottommost insulating layer 32B.

Generally, each backside semiconductor cap structure 111 is formed by deposition of a semiconductor material directly on the bottom surface of a respective vertical semiconductor channel 60. In one embodiment, the backside semiconductor cap structures 111 can be formed by performing a selective semiconductor deposition process that grows the semiconductor material from the bottom surface of the vertical semiconductor channel 60 while suppressing growth of the semiconductor material from the bottom surface of the bottommost insulating layer within the alternating stack (32, 46). In one embodiment, the bottom surface of each vertical semiconductor channel 60 can be free of any opening therein. In one embodiment, an entirety of an interface between the memory opening fill structure 58 and the backside semiconductor cap structure 111 is located within the horizontal plane. The thickness of the planar portion of each backside semiconductor cap structure 111 may be in a range from 20 nm to 200 nm, such as from 40 nm to 100 nm, although lesser and greater thicknesses may also be employed.

In one embodiment, the top surface 111T of each backside semiconductor cap structure 111 can be in contact with a bottom surface of the vertical semiconductor channel 60. In one embodiment, the entirety of the top surface of each backside semiconductor cap structure 111 can be located within a horizontal plane including a bottom surface of a bottommost insulating layer within the alternating stack (32, 46). In one embodiment, an annular bottom surface of each memory film 50 can be in contact with an annular surface segment of the top surface of a respective backside semiconductor cap structure 111. In one embodiment, the contact area between a backside semiconductor cap structure 111 and a vertical semiconductor channel 60 comprises an entire area that is laterally enclosed by a periphery of a bottom surface of the vertical semiconductor channel 60.

In one embodiment, each backside semiconductor cap structure 111 may comprise a contoured bottom surface 111B. In one embodiment, each point on the contoured bottom surface of a backside semiconductor cap structure 111 may be equidistant from a respective most proximal point on a bottom surface of the vertical semiconductor channel 60 that is in contact with the backside semiconductor cap structure 111. In one embodiment, the contoured bottom surface 111B comprises a horizontal planar bottom surface segment and a convex tapered annular surface segment connecting a periphery of the horizontal planar bottom surface segment to a periphery of the top surface of the backside semiconductor cap structure 111.

In one embodiment, the backside semiconductor cap structures 111 may be formed as extensions of the vertical semiconductor channels 60. In this case, the vertical semiconductor channel 60 has a doping of a first conductivity type, and the backside semiconductor cap structure 111 has a doping of the first conductivity type. In case the backside semiconductor cap structures 111 comprise, and/or consist essentially of, a semiconductor material having a doping of the first conductivity type, the atomic concentration of dopants of the first conductivity type in backside semiconductor cap structures 111 the may be in a range from $1.0\times10^{14}/cm^3$ to $1.0\times10^{18}/cm^3$, although lesser and greater atomic concentrations may also be employed.

In one embodiment, the backside semiconductor cap structures 111 may be formed as semiconductor portions of a source contact structure. In this case, the vertical semiconductor channels 60 have a doping of a first conductivity type, and the backside semiconductor cap structure 111 has a doping of a second conductivity type that is an opposite of the first conductivity type. In case the backside semiconductor cap structures 111 comprise, and/or consist essentially of, a semiconductor material having a doping of the second conductivity type, the atomic concentration of dopants of the second conductivity type in backside semiconductor cap structures 111 may be in a range from $5.0\times10^{19}/$ cm$^3$ to $2.0\times10^{21}$/cm$^3$, although lesser and greater atomic concentrations may also be employed.

Figure 31B:
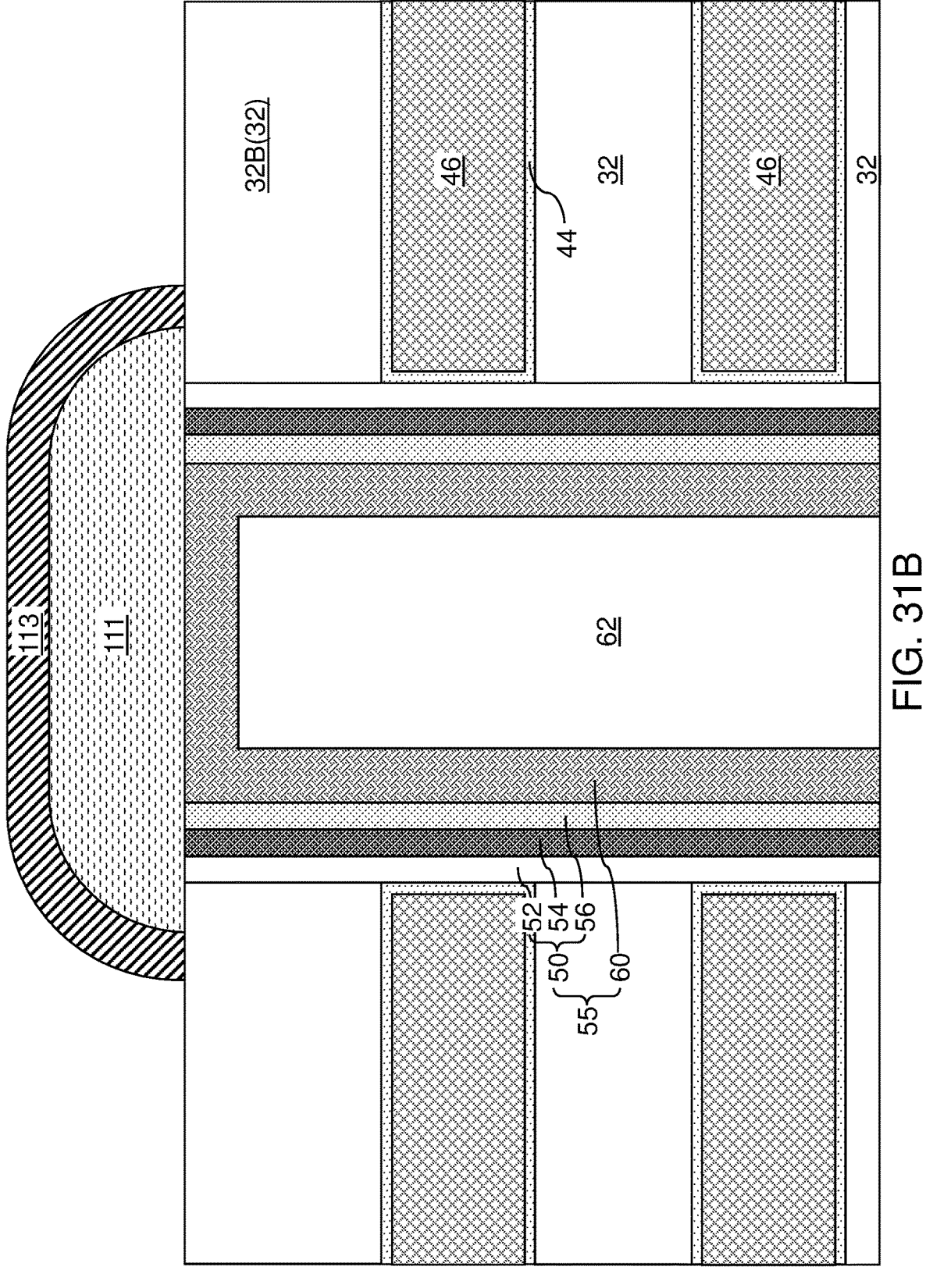

Referring to FIG. 31B, a metal layer 113 can be formed on the bottom surface of each backside semiconductor cap structure 111 by performing a selective metal deposition process. A selective metal deposition process is a metal deposition process that grows metal on semiconductor surfaces while suppressing deposition of the metal on dielectric surfaces. According to an embodiment of the present disclosure, the metal deposited by the selective metal deposition process comprises a metal that forms a metal-semiconductor alloy such as a metal silicide, germanide or silicide-germanide. For example, the metal may be tungsten, cobalt, titanium, molybdenum or ruthenium.

The selective metal deposition process may comprise a chemical vapor deposition process or an atomic layer deposition process employing a metallic precursor gas that nucleates on metallic surfaces or semiconductor surfaces and does not nucleate on dielectric surfaces. In one embodiment, the metal may be ruthenium which can be selectively deposited on silicon at a temperature of 250 degrees Celsius or less using selective atomic layer deposition. Alternatively, an etchant gas may be flowed concurrently with, or alternately with, the metallic precursor gas to etch back any metallic material portion that nucleate in small clusters on physically exposed dielectric surfaces such as the physically exposed backside surfaces of the bottommost insulating layer 32B. The metallic precursor gas and the optional etchant gas may be selected depending on the species of the metal that is deposited by the selective metal deposition process. The thickness of the metal layer 113 is selected such that the entirety of the metal layer 113 can be consumed during a subsequent metallization process. For example, the thickness of the metal layer 113 may be in a range from 5 nm to 80 nm, such as from 10 nm to 40 nm, although lesser and greater thicknesses may also be employed. A two-dimensional array of discrete metal layers 113 can be formed over the two-dimensional array of memory opening fill structures 58. The discrete metal layers 113 may be laterally spaced from each other without direct contact between them.

Figure 31C:
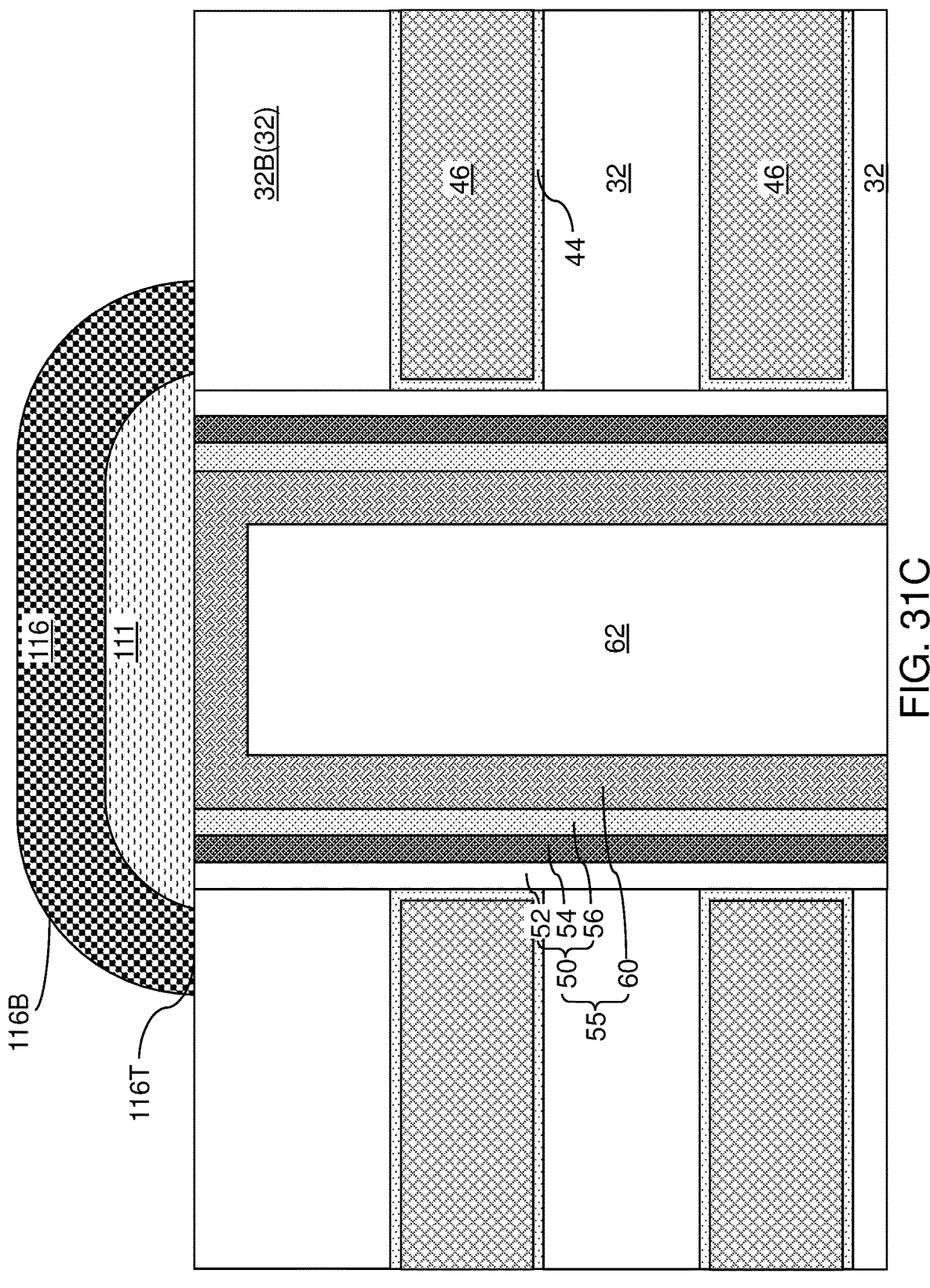

Referring to FIG. 31C, an anneal process can be performed to induce a reaction of each metal layer 113 with a surface portion of the backside semiconductor cap structure 111. Any suitable anneal, such as a laser, flashlamp or furnace anneal may be performed. In one embodiment, the anneal is performed at below 450 degrees Celsius. A metal-semiconductor alloy structure 116 is formed on each remaining portion of the backside semiconductor cap structure 111. In one embodiment, the metal-semiconductor alloy structure 116 may comprise tungsten silicide, germanide or silicide-germanide, titanium silicide, germanide or silicide-germanide, cobalt silicide, germanide or silicide-germanide, molybdenum silicide, germanide or silicide-germanide, or ruthenium silicide, germanide or silicide-germanide. The thickness of each metal-semiconductor alloy structure 116 may be in a range from 8 nm to 100 nm, such as from 16 nm to 50 nm, although lesser and greater thicknesses may also be employed. In one embodiment, each metal-semiconductor alloy structure 116 comprises a contoured bottom surface 111B and an annular top surface 116T in contact with an annular surface segment of the bottom surface of the bottommost insulating layer 32B of the alternating stack (32, 46) within the horizontal plane.

Figure 31D:
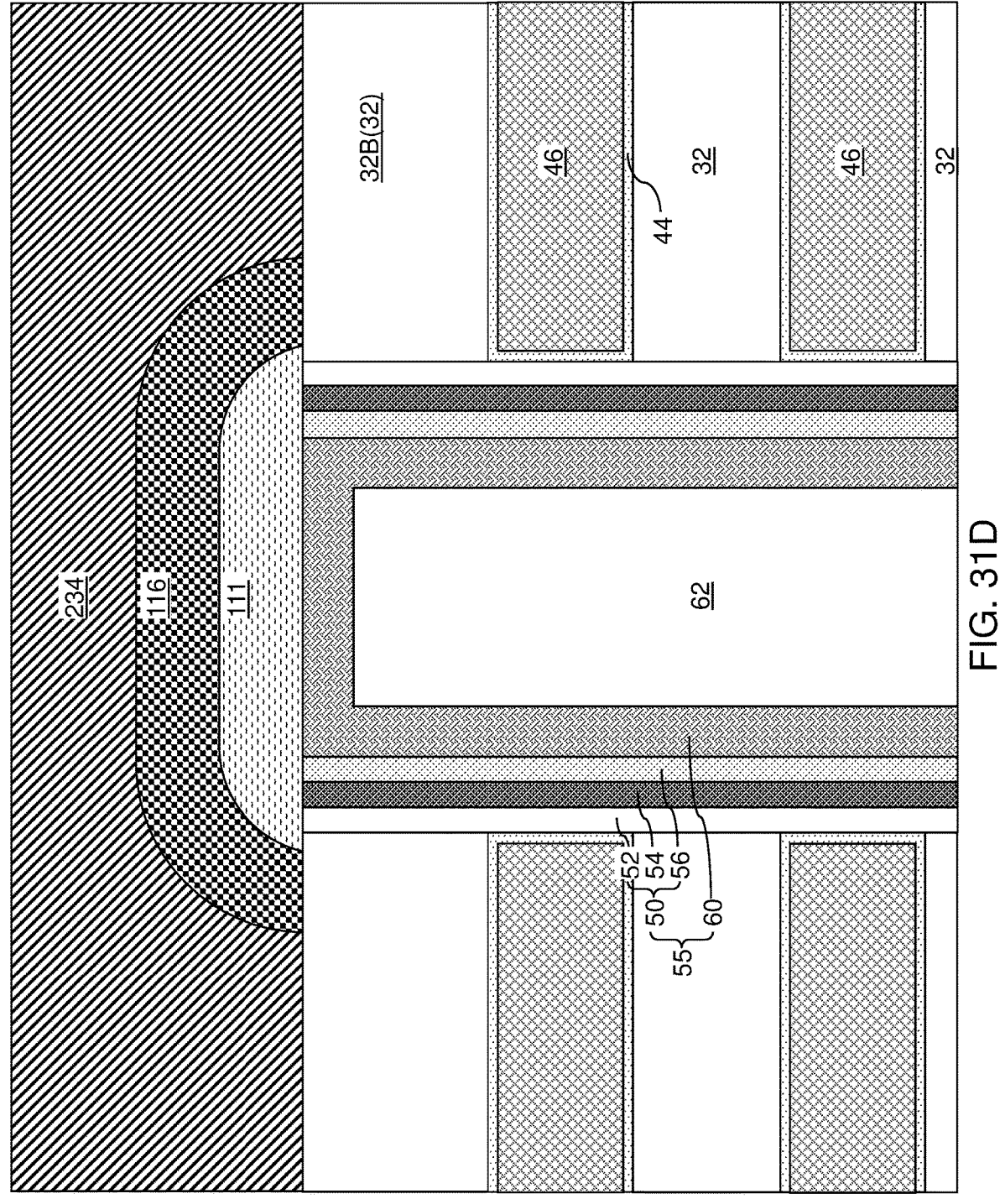

Referring to FIG. 31D, a backside conductive layer 234 comprising at least one metallic material can be formed over the metal-semiconductor alloy structures 116 and the backside surface of the bottommost insulating layer 32B. In one embodiment, the backside conductive layer 234 may comprise any material that may be employed for the source contact structure 224 described above with reference to the first exemplary structure. In this case, the backside conductive layer 234 may comprise a stack of a metallic barrier layer (such as titanium nitride, tantalum nitride, tungsten nitride, or molybdenum nitride, titanium carbide, tantalum carbide, or tungsten carbide) and a metal layer (such as tungsten, tantalum, titanium, molybdenum, cobalt, ruthenium, copper, etc.). The backside conductive layer 234 may be patterned, for example, by applying and patterning a photoresist layer to cover the memory array region 100 without covering the contact region 300, and by performing an etch process that etches the backside conductive layer 234 employing the patterned photoresist layer as an etch mask. The patterned photoresist layer can be subsequently removed, for example, by ashing. A source contact structure is formed, which comprises the backside conductive layer 234 and the metal-semiconductor alloy structures 116. In case the backside semiconductor cap structures 111 are doped with dopants of the second conductivity type, opposite to the first conductivity type of the vertical semiconductor channel 60, then the backside semiconductor cap structures 111 comprise doped source regions.

Figure 31E:
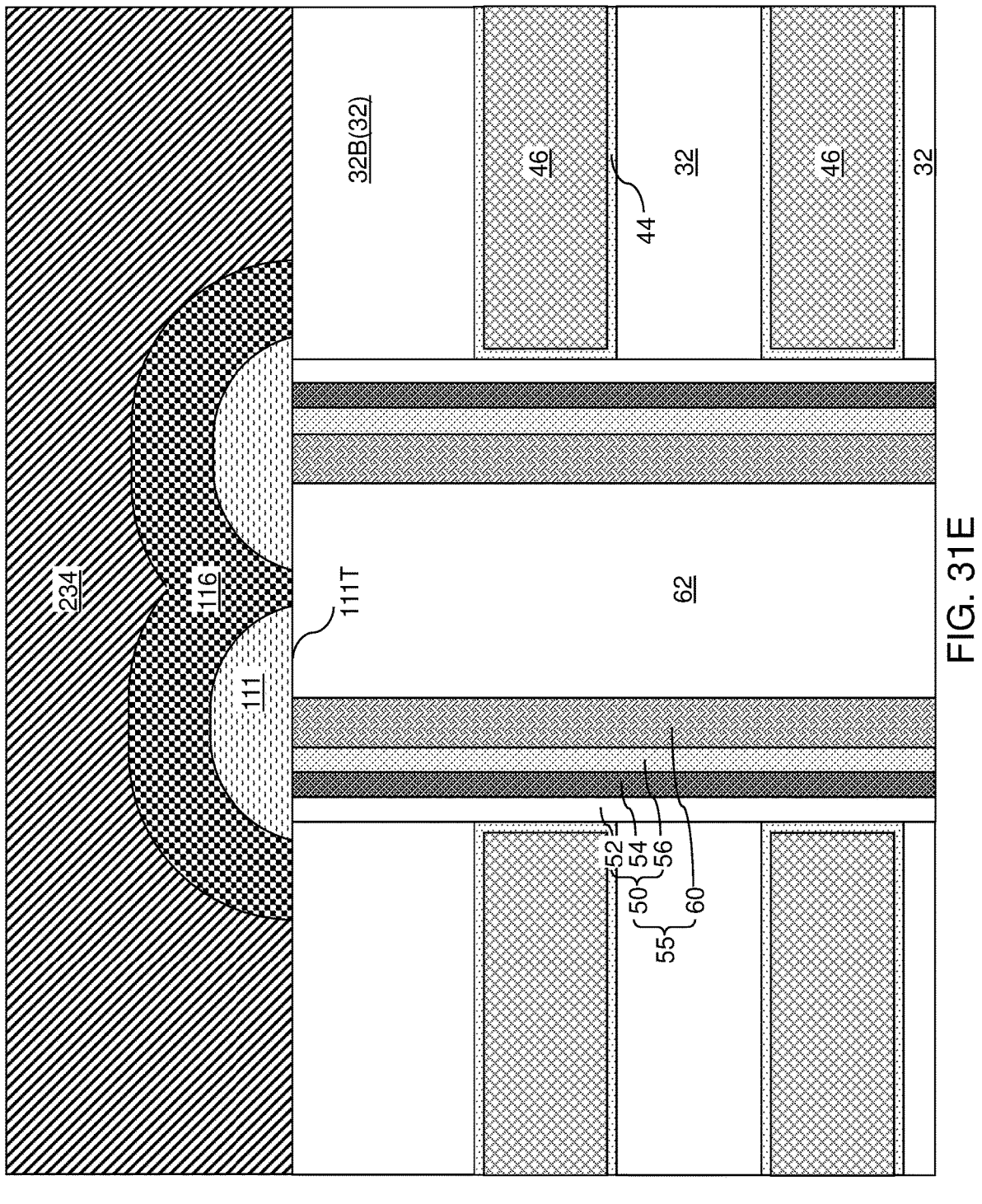
FIG. 31E is an alternative embodiment of the first configuration of the second exemplary structure.

Referring to FIG. 31E, an alternative embodiment of the first configuration of the second exemplary structure is illustrated, which can be derived from the first configuration of the second exemplary structure illustrated in FIG. 31E by increasing the overetch depth of the memory openings 49 at the processing steps of FIGS. 20A and 20B and/or by increasing the etch depth during the etching step at the processing steps of FIGS. 30A and 30B. In this case, the planar horizontal bottom portion of each vertical semiconductor channel 60 may be removed at the processing steps of FIGS. 30A and 30B. Each physically exposed surface of the vertical semiconductor channels 60 may be an annular surface having an inner periphery and an outer periphery. In one embodiment, each memory opening fill structure 58 comprises a dielectric core 62 that is laterally surrounded by a vertical semiconductor channel 60 and having a bottom surface that contacts a circular segment of the top surface 111T of a backside semiconductor cap structure 111.

Figure 32A:
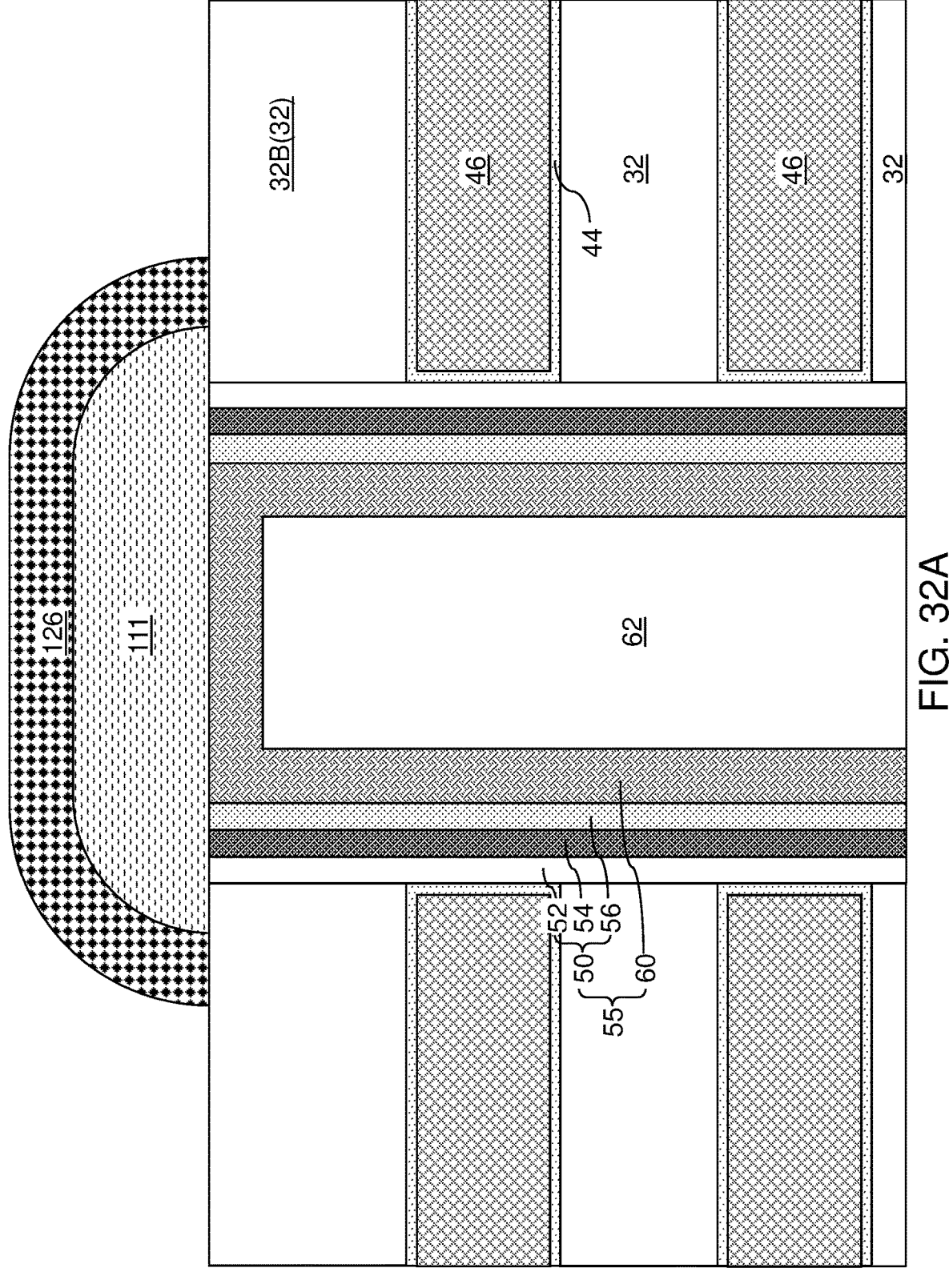
FIGS. 32A and 32B are sequential vertical cross-sectional views of a region of a second configuration of the second exemplary structure during formation of a backside semiconductor cap structure and a source contact structure according to the second embodiment of the present disclosure.
Figure 32B:
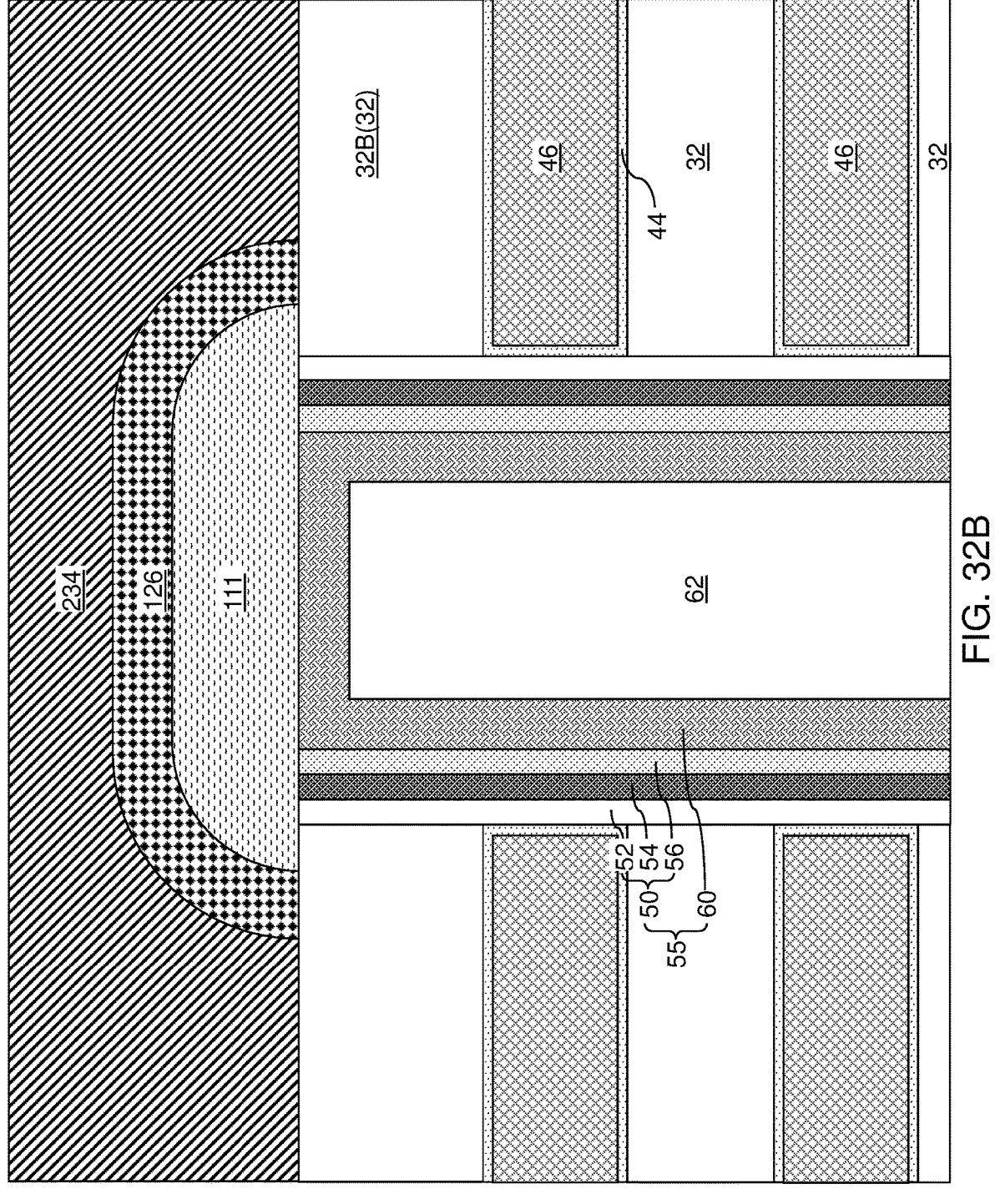

FIGS. 32A and 32B are sequential vertical cross-sectional views of a region of a second configuration of the second exemplary structure during formation of a backside semiconductor cap structure 111 and a source contact structure according to the second embodiment of the present disclosure.

Referring to FIG. 32A, the second configuration of the second exemplary structure can be derived from the first configuration of the second exemplary structure illustrated in FIG. 31A by forming a metal-semiconductor alloy structure 126 directly on each backside semiconductor cap structure 111. In this case, the metal-semiconductor alloy structure 126 can be formed by selective growth of a metal-semiconductor alloy material. For example, the metal-semiconductor alloy structures 126 may comprise, and/or may consist essentially of, molybdenum silicide, germanide or silicide-germanide, titanium silicide, germanide or silicide-germanide, tungsten silicide, germanide or silicide-germanide, or cobalt silicide, germanide or silicide-germanide. The selective growth of the metal-semiconductor alloy material may be performed employing a combination of a metallic precursor gas, a semiconductor precursor gas (such as silane, disilane, germane, etc.), and an optional etchant gas. For example, molybdenum silicide may be selectively grown on silicon via atomic layer deposition using molybdenum hexafluoride and disilane sources at a temperature of about 120 degrees Celsius. The thickness of the metal-semiconductor alloy structures 126 may be in a range from 8 nm to 100 nm, such as from 16 nm to 50 nm, although lesser and greater thicknesses may also be employed.

Referring to FIG. 32B, the processing steps described with reference to FIG. 31D can be performed to form a backside conductive layer 234. A source contact structure is formed, which comprises the backside conductive layer 234 and the metal-semiconductor alloy structures 126.

Figure 32C:
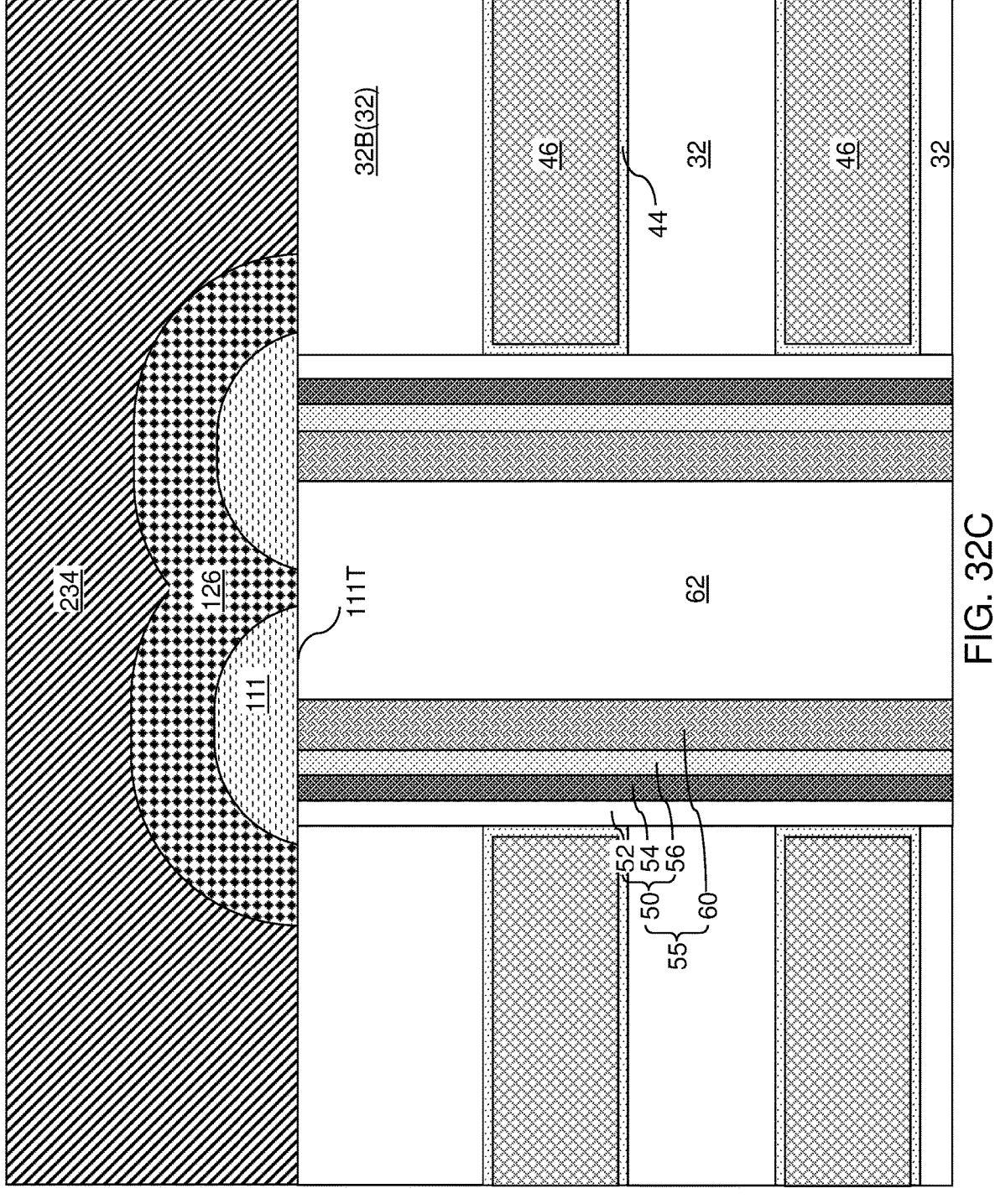
FIG. 32C is an alternative embodiment of the second configuration of the second exemplary structure.

Referring to FIG. 32C, an alternative embodiment of the second configuration of the second exemplary structure is illustrated, which can be derived from the second configuration of the second exemplary structure illustrated in FIG. 32B by increasing the overetch depth of the memory openings 49 at the processing steps of FIGS. 20A and 20B and/or by increasing the etch depth during the etching step at the processing steps of FIGS. 30A and 30B. In this case, the planar horizontal bottom portion of each vertical semiconductor channel 60 may be removed at the processing steps of FIGS. 30A and 30B. Each physically exposed surface of the vertical semiconductor channels 60 may be an annular surface having an inner periphery and an outer periphery. In one embodiment, each memory opening fill structure 58 comprises a dielectric core 62 that is laterally surrounded by a vertical semiconductor channel 60 and having a bottom surface that contacts a circular segment of the top surface 111T of a backside semiconductor cap structure 111.

FIGS. 33A-33D are sequential vertical cross-sectional views of a region of a third configuration of the second exemplary structure during formation of a backside semiconductor cap structure 111 and a source contact structure according to the second embodiment of the present disclosure.

Figure 33A:
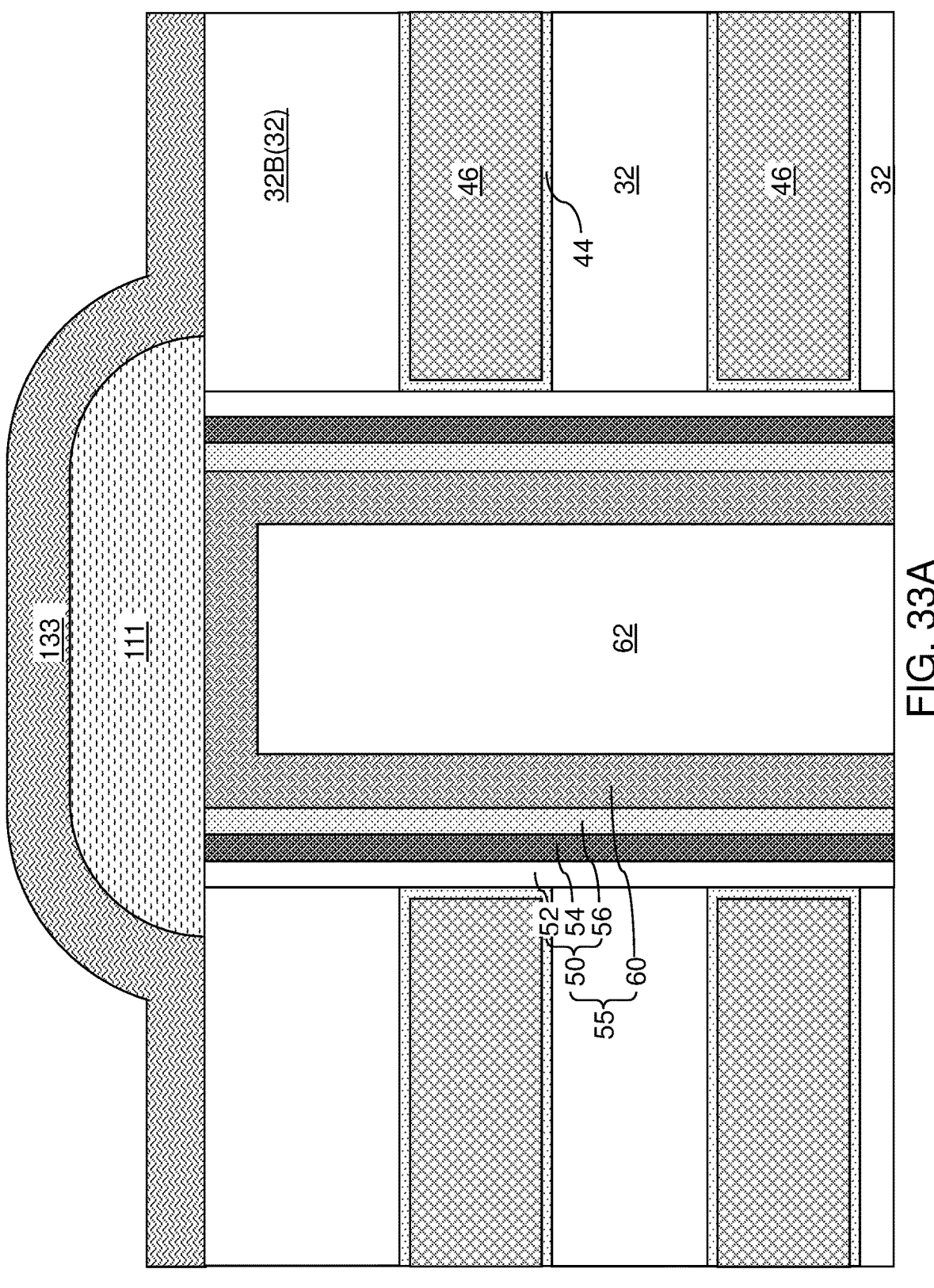
FIGS. 33A-33D are sequential vertical cross-sectional views of a region of a third configuration of the second exemplary structure during formation of a backside semiconductor cap structure and a source contact structure according to the second embodiment of the present disclosure.

Referring to FIG. 33A, the third configuration of the second exemplary structure can be derived from the first configuration of the second exemplary structure illustrated in FIG. 31A by depositing a metal layer 133 on each backside semiconductor cap structure 111 by a non-selective deposition process. The metal layer 133 includes any metal that can form a metal-semiconductor alloy upon reaction with the semiconductor material of the backside semiconductor cap structures 111. For example, the metal layer 133 may comprise, and/or may consist essentially of, at least one metal selected from tungsten, titanium, cobalt, molybdenum, ruthenium, nickel, platinum, palladium, etc. The metal layer 133 may be deposited by a non-selective deposition process, i.e., a deposition process that deposits the same amount of material irrespective of the material composition of an underlying surface. For example, the metal layer 133 may be deposited by physical vapor deposition (PVD) or non-selective chemical vapor deposition (CVD). The thickness of the metal layer 133 may be in a range from 5 nm to 80 nm, such as from 10 nm to 40 nm, although lesser and greater thicknesses may also be employed. The metal layer 133 may be formed as a continuous metal layer that contacts backside surfaces of a two-dimensional array of backside semiconductor cap structures 111.

Figure 33B:
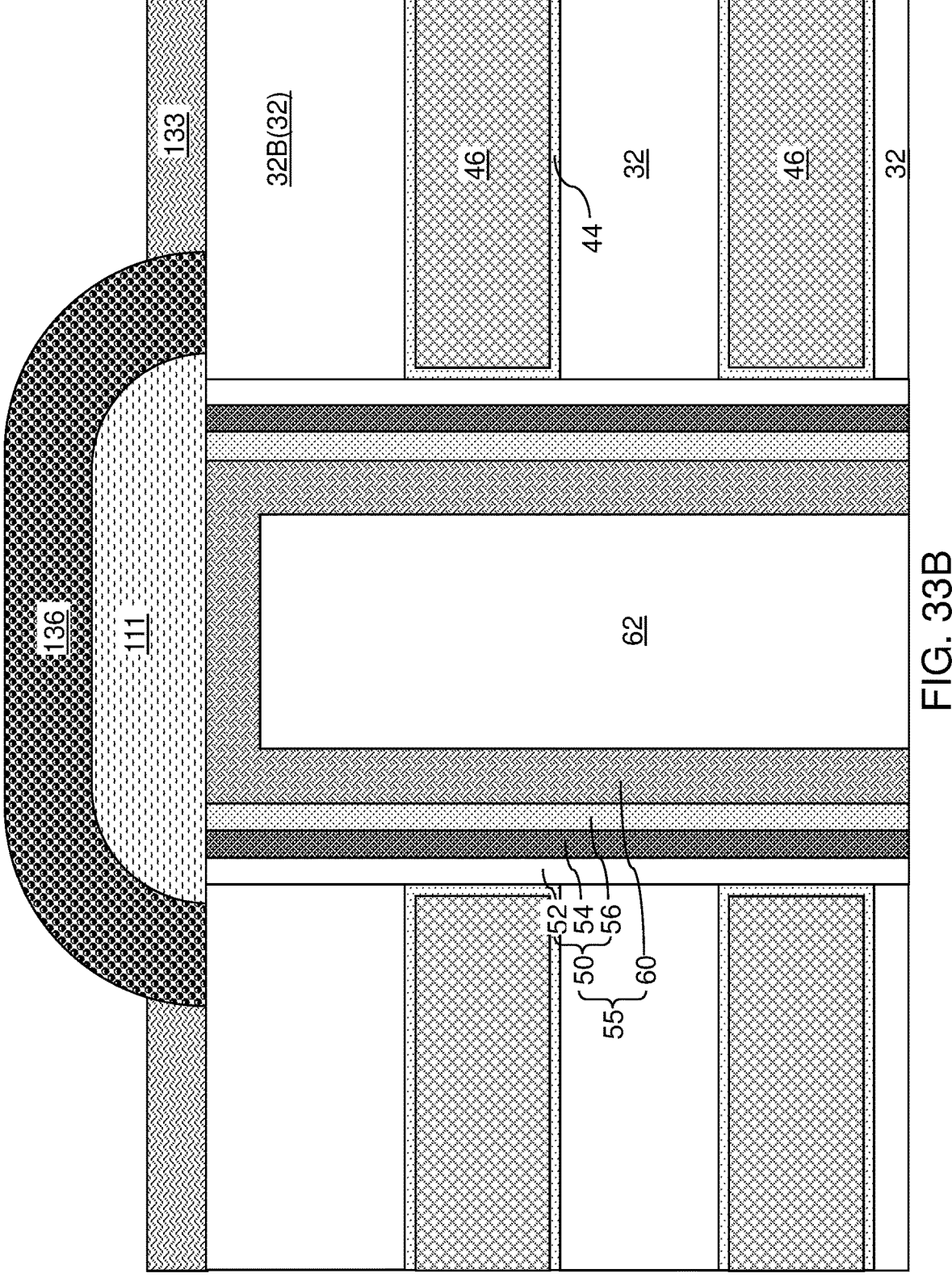

Referring to FIG. 33B, the above described anneal process can be performed to react portions of the metal layer 133 contacting the backside semiconductor cap structures 111 with the backside semiconductor cap structure 111 to form a metal-semiconductor alloy structure 136 on each remaining portion of the backside semiconductor cap structure 111. In one embodiment, the metal-semiconductor alloy structure 136 may comprise tungsten silicide, germanide or silicide-germanide, titanium silicide, germanide or silicide-germanide, cobalt silicide, germanide or silicide-germanide, ruthenium silicide, germanide or silicide-germanide, molybdenum silicide, germanide or silicide-germanide, nickel silicide, germanide or silicide-germanide, platinum silicide, germanide or silicide-germanide, or palladium silicide, germanide or silicide-germanide or a combination thereof. For example, platinum, nickel and cobalt may be reacted with silicon to form a silicide at a temperature of less than 450 degrees Celsius, such as 250 to 400 degrees Celsius for platinum, 300 to 400 degrees Celsius for cobalt and 400 to 440 degrees Celsius for nickel. The thickness of each metal-semiconductor alloy structure 136 may be in a range from 8 nm to 100 nm, such as from 16 nm to 50 nm, although lesser and greater thicknesses may also be employed. In one embodiment, each metal-semiconductor alloy structure 136 comprises an annular top surface in contact with an annular surface segment of the bottom surface of the bottommost insulating layer 32B of the alternating stack (32, 46) within the horizontal plane. A planar unreacted portion of the metal layer 133 may be present on the backside surface of the bottommost insulating layer 133.

Figure 33C:
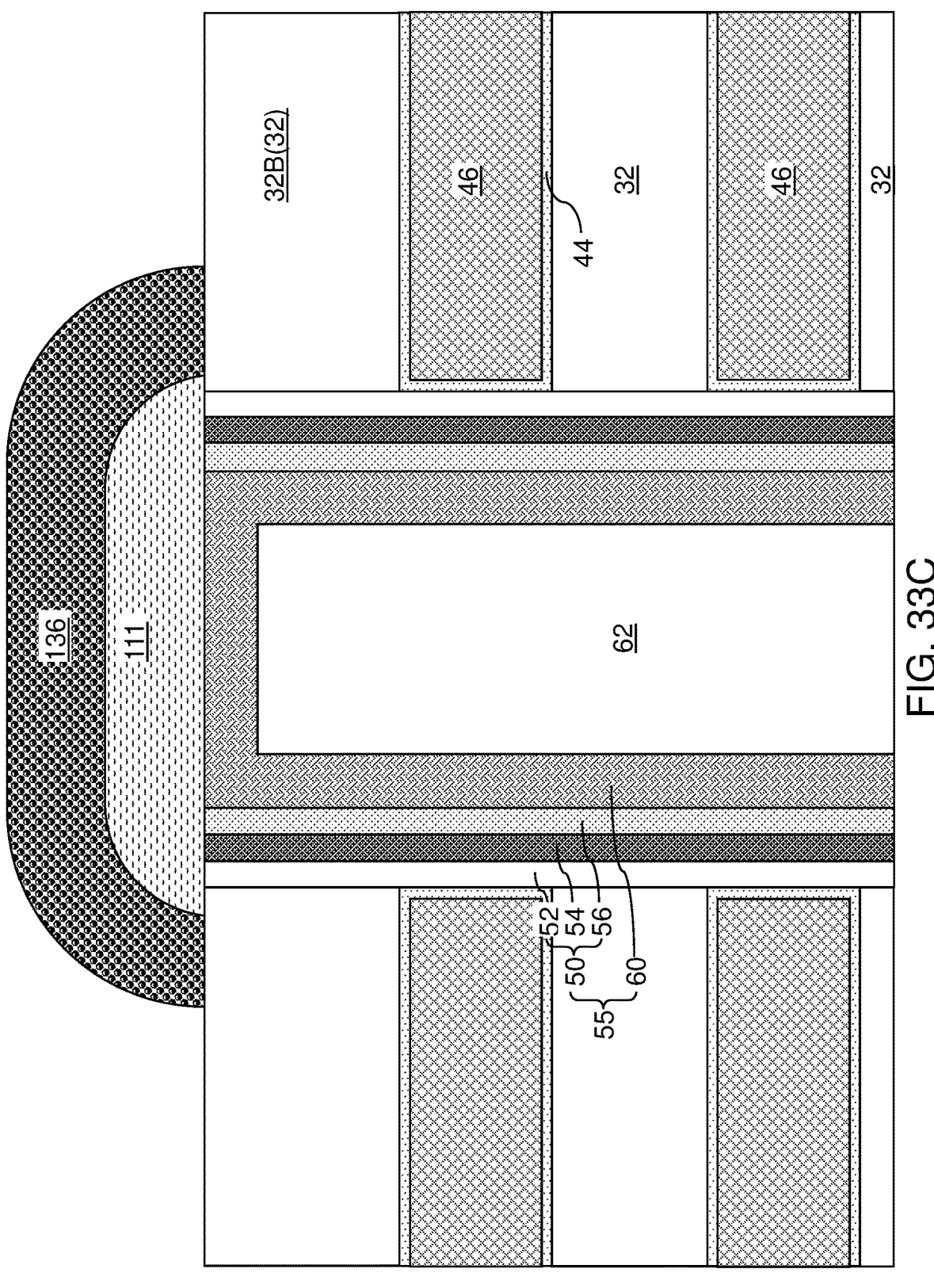

Referring to FIG. 33C, a wet etch process that etches remaining portions of the metal layer 133 selective to the metal-semiconductor alloy material of the metal-semiconductor alloy structures 136 and the bottommost insulating layer 32B can be performed. The remaining portions of the metal layer 133 can be removed, and portions of the backside surface of the bottommost insulating layer 32B can be physically exposed.

Figure 33D:
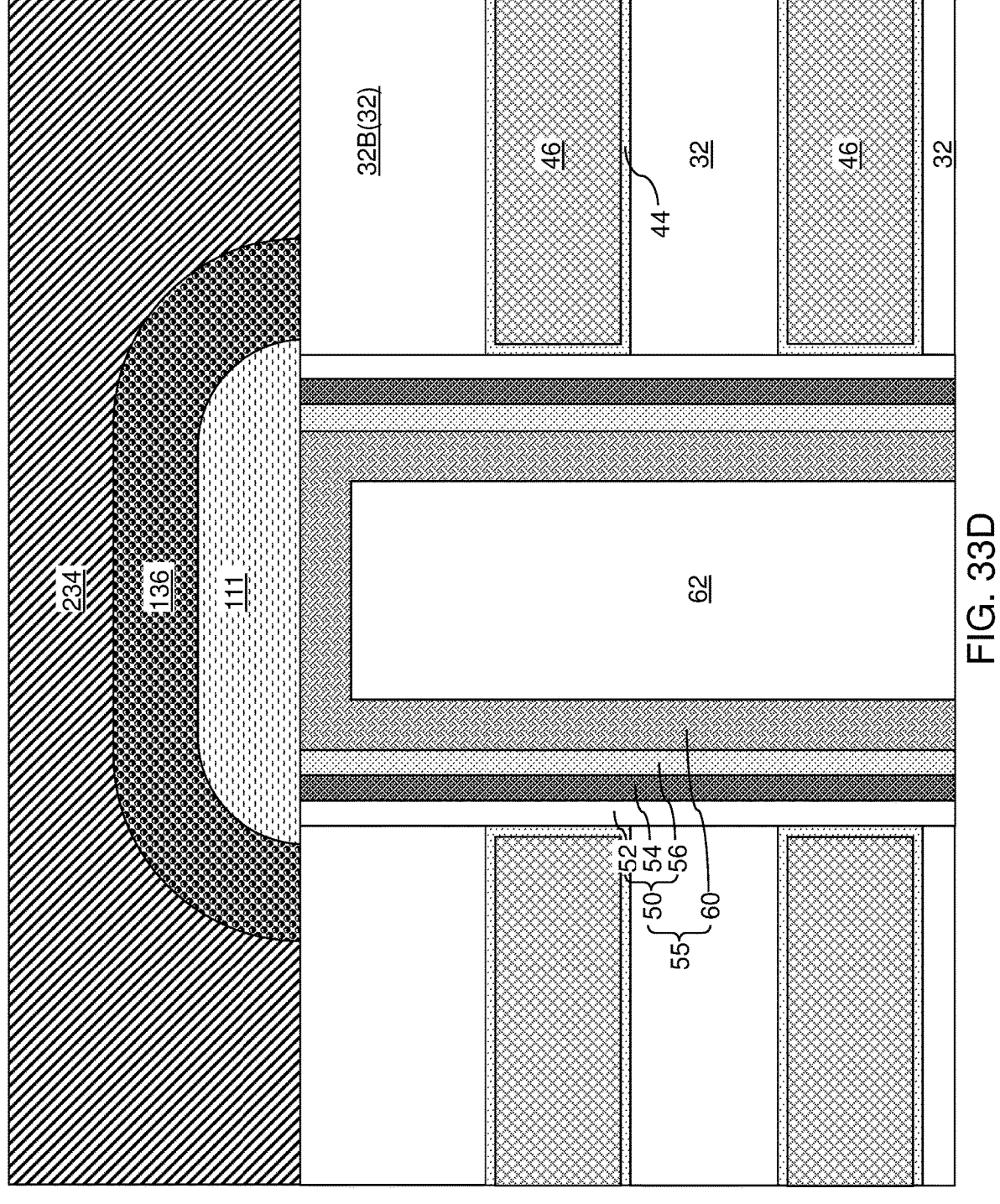

Referring to FIG. 33D, the processing steps described with reference to FIG. 31D can be performed to form a backside conductive layer 234. A source contact structure is formed, which comprises the backside conductive layer 234 and the metal-semiconductor alloy structures 136.

Figure 33E:
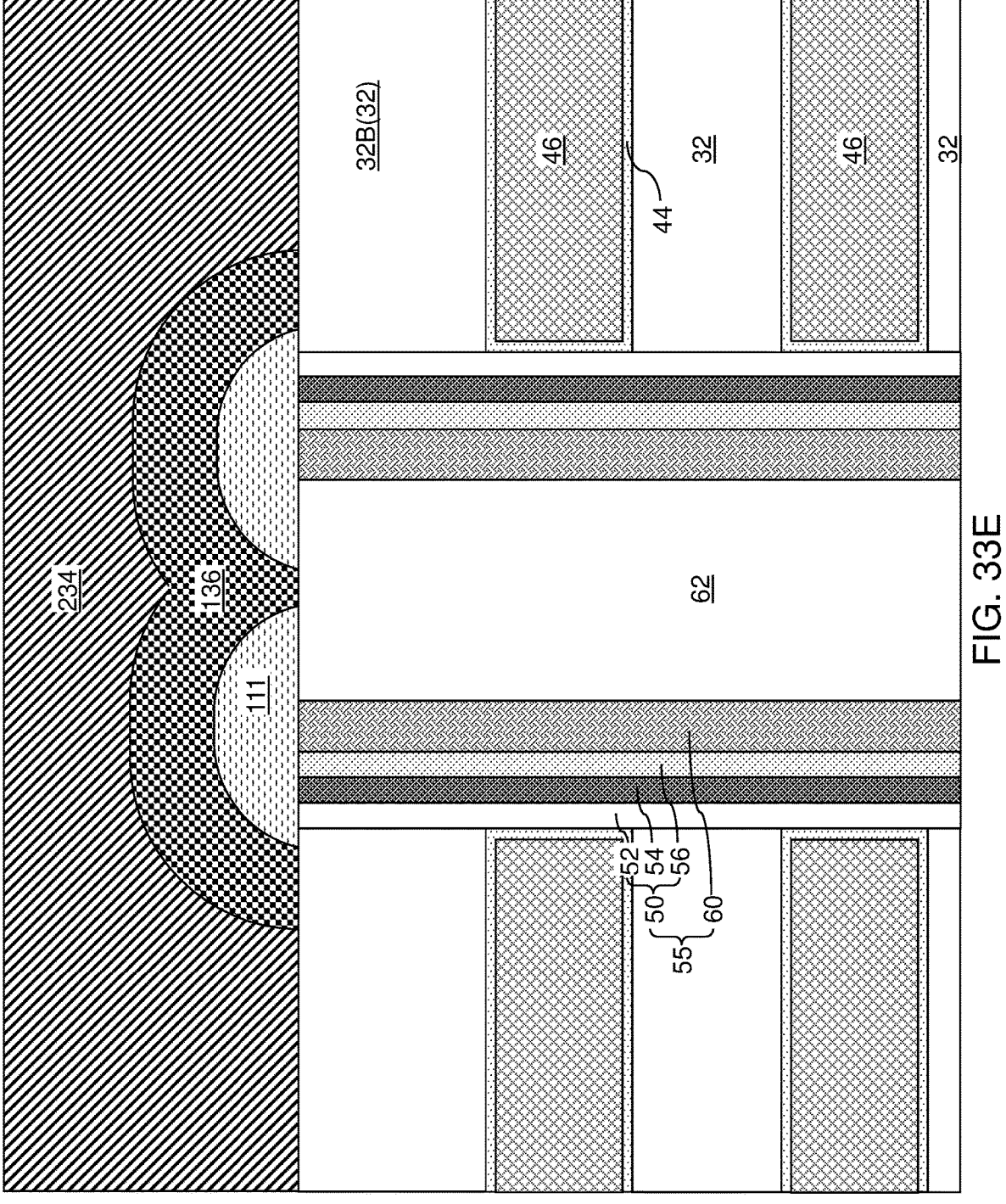
FIG. 33E is an alternative embodiment of the third configuration of the second exemplary structure.

Referring to FIG. 33E, an alternative embodiment of the third configuration of the second exemplary structure is illustrated, which can be derived from the third configuration of the second exemplary structure illustrated in FIG. 33D by increasing the overetch depth of the memory openings 49 at the processing steps of FIGS. 20A and 20B and/or by increasing the etch depth during the etching step at the processing steps of FIGS. 30A and 30B. In this case, the planar horizontal bottom portion of each vertical semiconductor channel 60 may be removed at the processing steps of FIGS. 30A and 30B. Each physically exposed surface of the vertical semiconductor channels 60 may be an annular surface having an inner periphery and an outer periphery. In one embodiment, each memory opening fill structure 58 comprises a dielectric core 62 that is laterally surrounded by a vertical semiconductor channel 60 and having a bottom surface that contacts a circular segment of the top surface of a backside semiconductor cap structure 111.

Figure 34A:
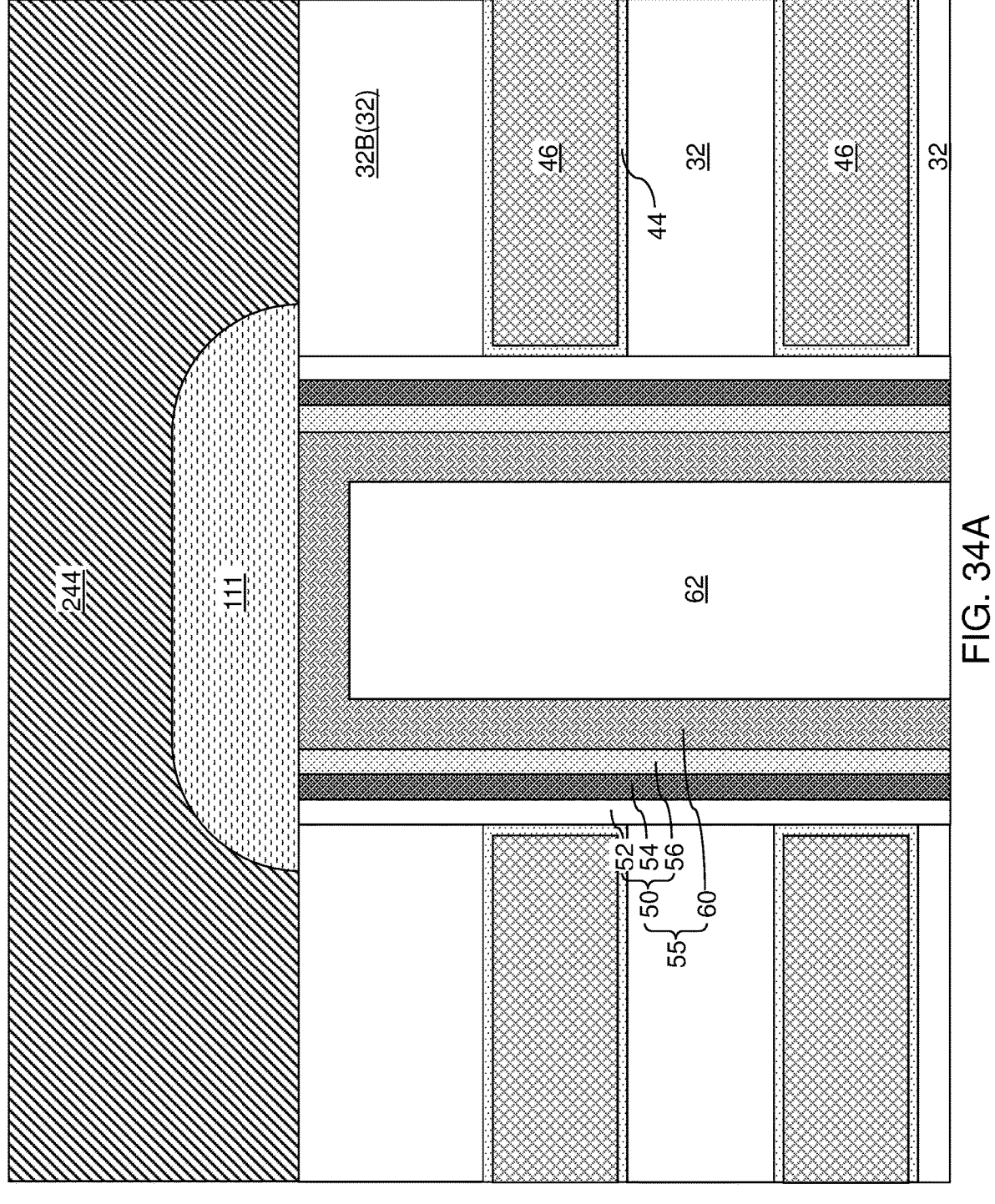
FIGS. 34A and 34B are sequential vertical cross-sectional views of a region of a fourth configuration of the second exemplary structure during formation of a backside semiconductor cap structure and a source contact structure according to the second embodiment of the present disclosure.
Figure 34B:
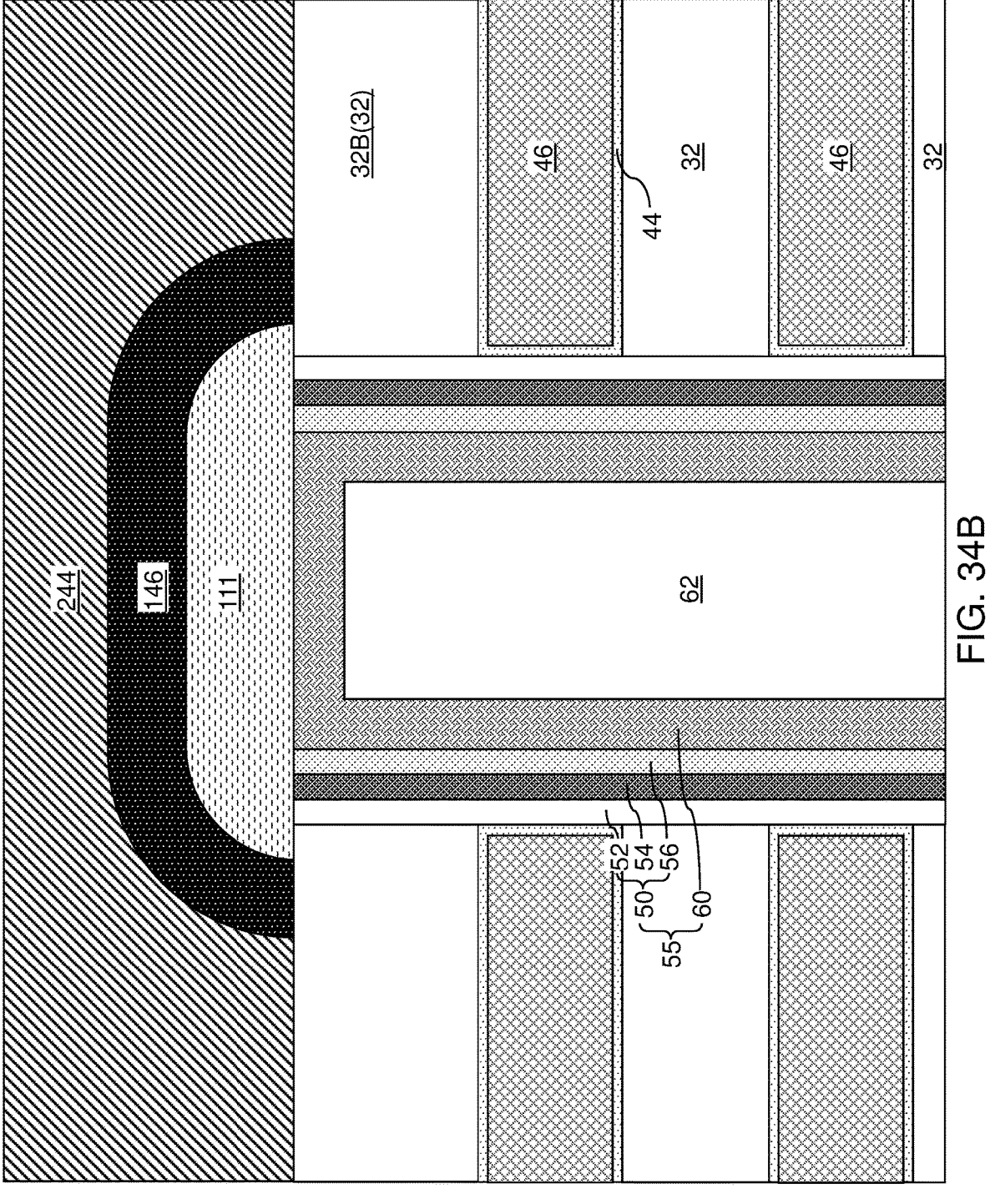

FIGS. 34A and 34B are sequential vertical cross-sectional views of a region of a fourth configuration of the second exemplary structure during formation of a backside semiconductor cap structure 111 and a source contact structure according to the second embodiment of the present disclosure.

Referring to FIG. 34A, the fourth configuration of the second exemplary structure can be derived from the first configuration of the second exemplary structure illustrated in FIG. 31A by depositing a backside conductive layer 244 comprising a material that can form a metal-semiconductor alloy upon reaction with the semiconductor material of the backside semiconductor cap structures 111. In this case, the backside conductive layer 244 may comprise, and/or may consist essentially of, at least one metal selected from tungsten, titanium, cobalt, molybdenum, ruthenium, nickel, platinum, palladium, etc. The backside conductive layer 244 may be deposited by a non-selective deposition process, i.e., a deposition process that deposits the same amount of material irrespective of the material composition of an underlying surface. For example, the backside conductive layer 244 may be deposited by physical vapor deposition (PVD) or non-selective chemical vapor deposition (CVD). The thickness of the backside conductive layer 244 may be in a range from 100 nm to 400 nm, such as from 150 nm to 300 nm, although lesser and greater thicknesses may also be employed. The backside conductive layer 244 may be formed as a continuous metal layer that contacts backside surfaces of a two-dimensional array of backside semiconductor cap structures 111.

Referring to FIG. 34B, the above described anneal process can be performed to react portions of the backside conductive layer 244 with a surface portion of a respective overlying backside semiconductor cap structure 111 to form a metal-semiconductor alloy structure 146. The metal-semiconductor alloy structure 146 may comprise tungsten silicide, germanide or silicide-germanide, titanium silicide, germanide or silicide-germanide, cobalt silicide, germanide or silicide-germanide, ruthenium silicide, germanide or silicide-germanide, molybdenum silicide, germanide or silicide-germanide, nickel silicide, germanide or silicide-germanide, platinum silicide, germanide or silicide-germanide, or palladium silicide, germanide or silicide-germanide or a combination thereof. The thickness of each metal-semiconductor alloy structure 146 may be in a range from 8 nm to 100 nm, such as from 16 nm to 50 nm, although lesser and greater thicknesses may also be employed. In one embodiment, each metal-semiconductor alloy structure 146 comprises an annular top surface in contact with an annular surface segment of the bottom surface of the bottommost insulating layer 32B of the alternating stack (32, 46) within the horizontal plane. Unreacted portions of the backside conductive layer 244 constitute a continuous metal layer contacting the backside surface of the bottommost insulating layer 32B. A source contact structure is formed, which comprises the backside conductive layer 234 and the metal-semiconductor alloy structures 146.

Figure 34C:
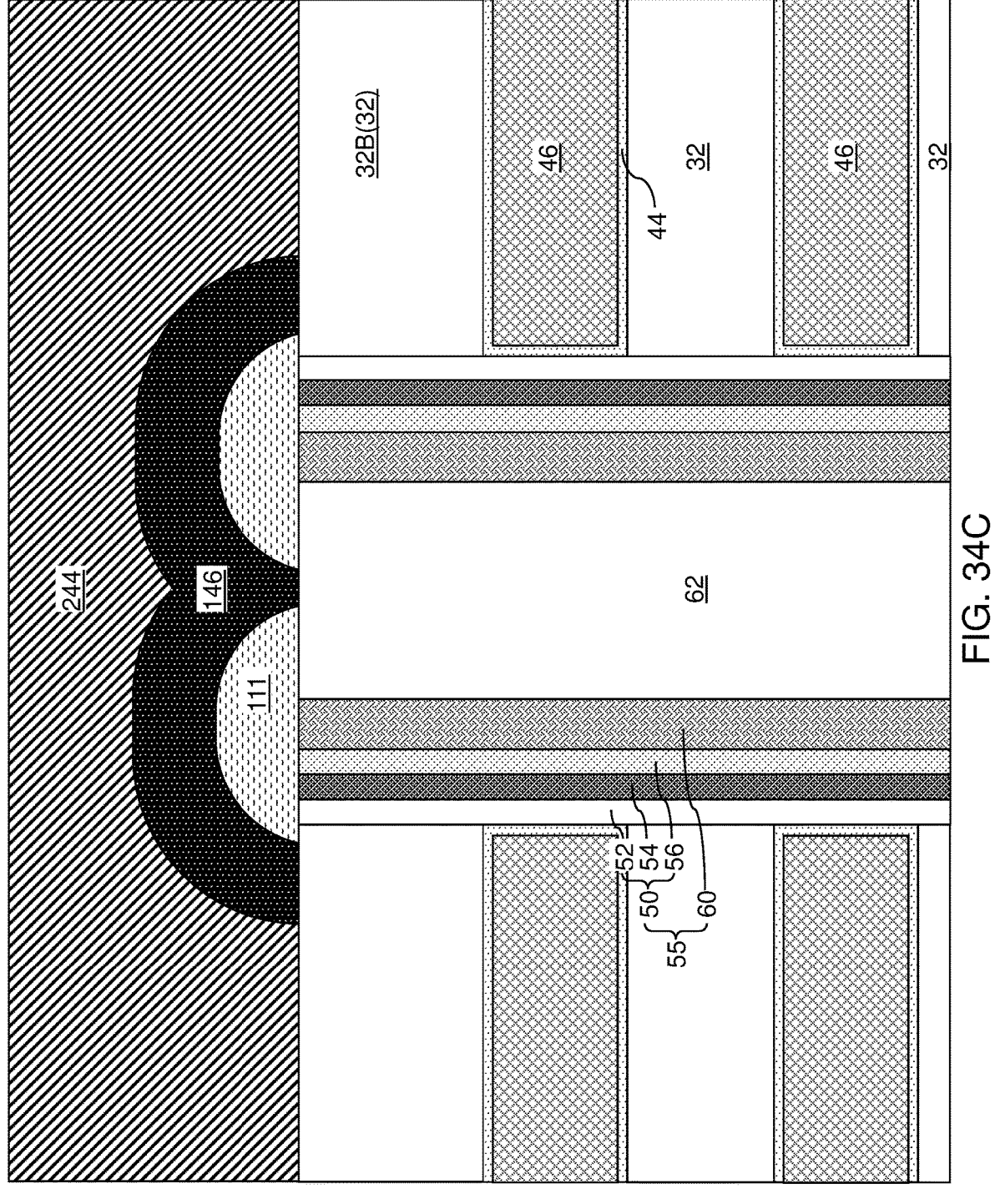
FIG. 34C is an alternative embodiment of the fourth configuration of the second exemplary structure.

Referring to FIG. 34C, an alternative embodiment of the fourth configuration of the second exemplary structure is illustrated, which can be derived from the fourth configuration of the second exemplary structure illustrated in FIG. 34B by increasing the overetch depth of the memory openings 49 at the processing steps of FIGS. 20A and 20B and/or by increasing the etch depth during the etching step at the processing steps of FIGS. 30A and 30B. In this case, the planar horizontal bottom portion of each vertical semiconductor channel 60 may be removed at the processing steps of FIGS. 30A and 30B. Each physically exposed surface of the vertical semiconductor channels 60 may be an annular surface having an inner periphery and an outer periphery. In one embodiment, each memory opening fill structure 58 comprises a dielectric core 62 that is laterally surrounded by a vertical semiconductor channel 60 and having a bottom surface that contacts a circular segment of the top surface of a backside semiconductor cap structure 111.

Figure 35A:
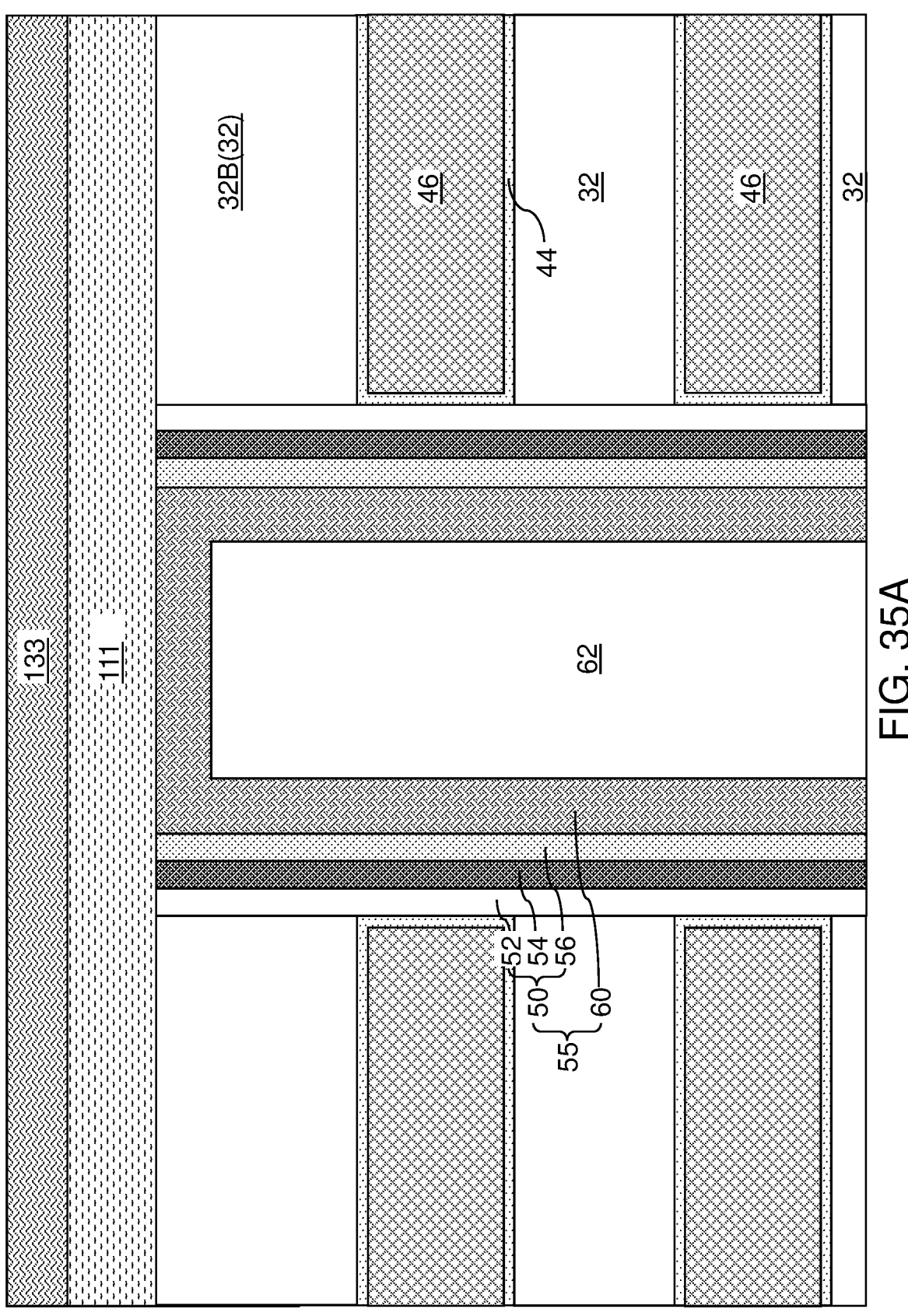
FIGS. 35A-35C are sequential vertical cross-sectional views of a region of a fifth configuration of the second exemplary structure during formation of a backside semi-conductor cap structure and a source contact structure according to the second embodiment of the present disclo-sure.
Figure 35B:
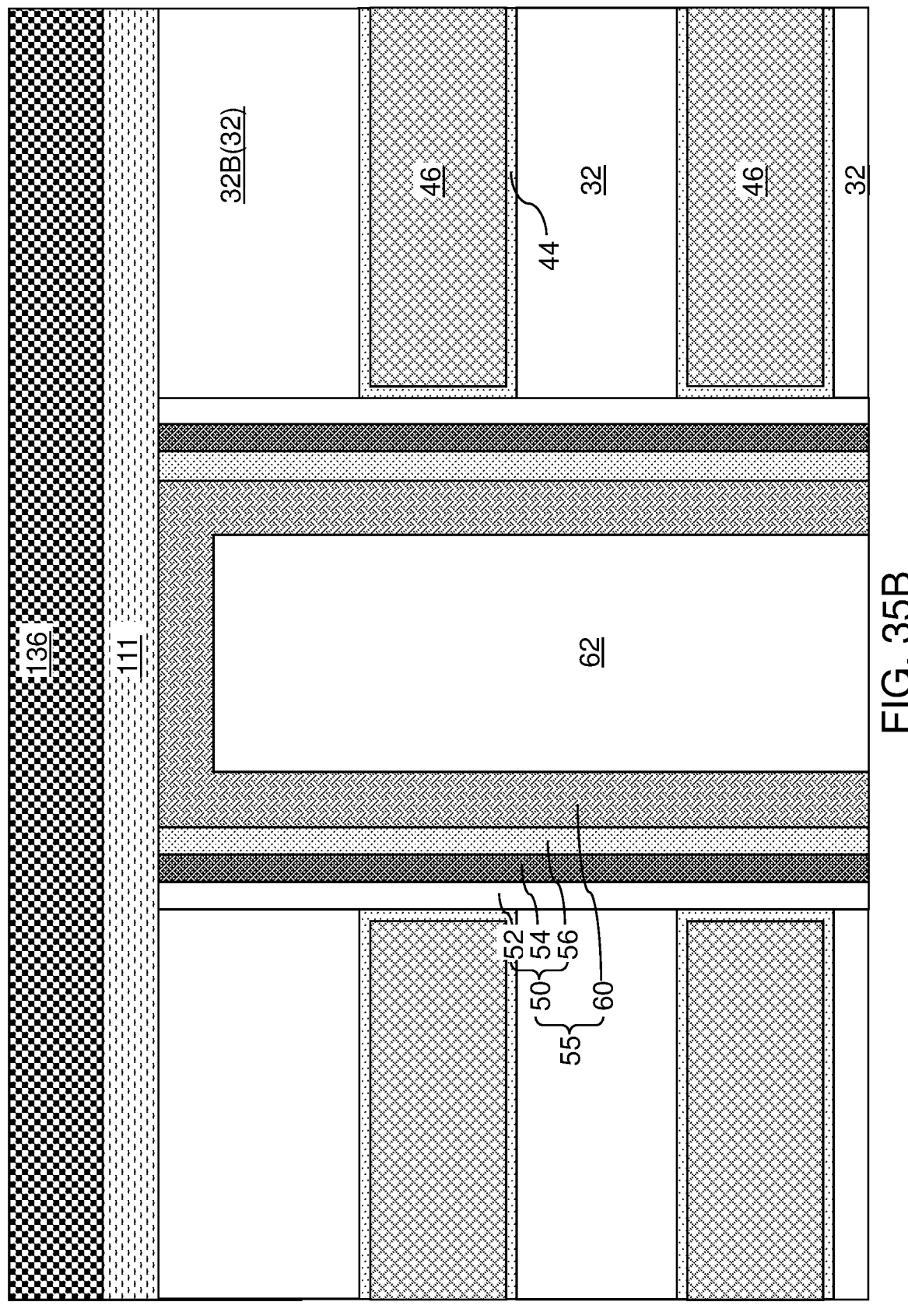
Figure 35C:
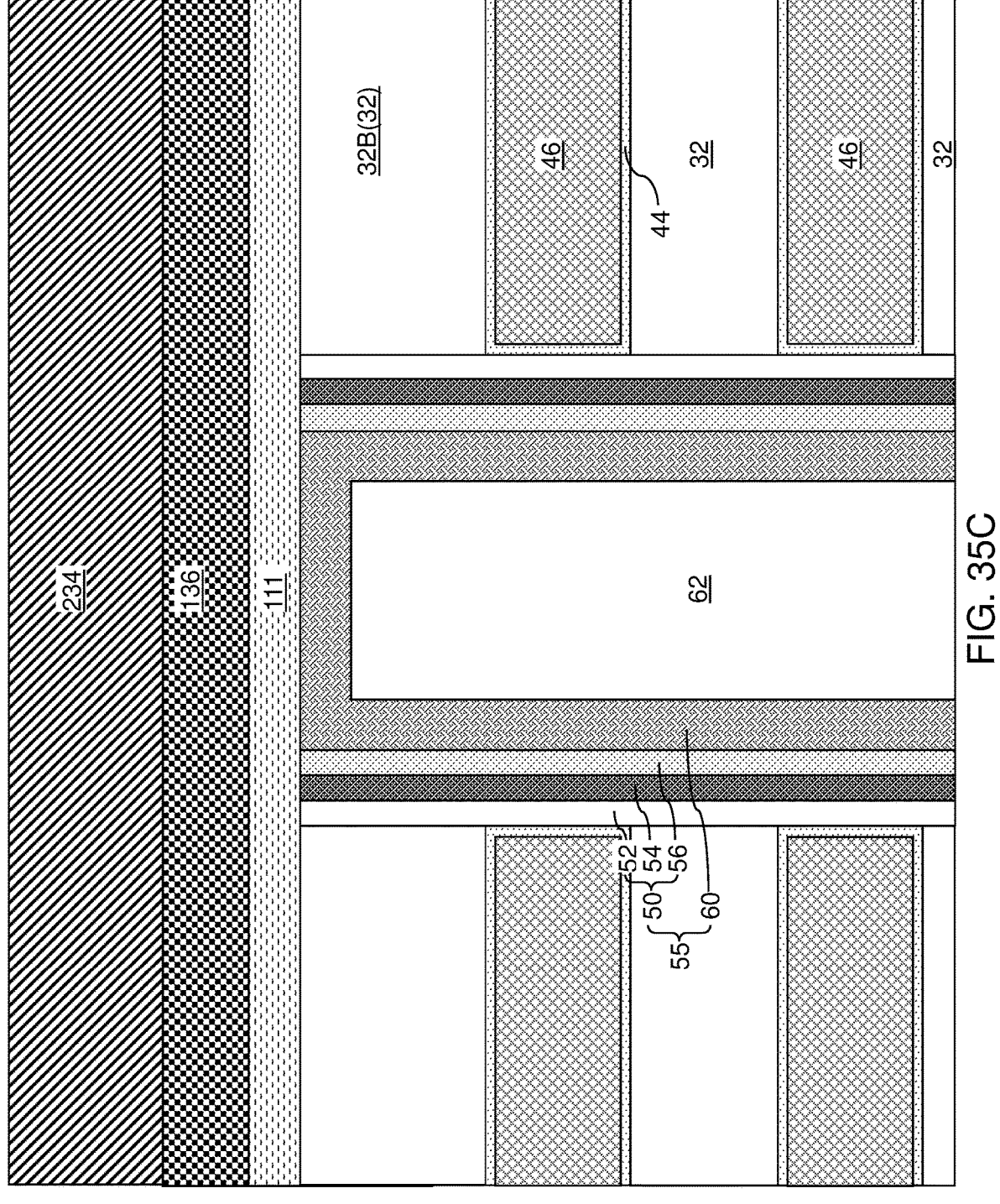

FIGS. 35A-35C are sequential vertical cross-sectional views of a region of a fifth configuration of the second exemplary structure during formation of a backside semiconductor cap structure 111 and a source contact structure according to the second embodiment of the present disclosure.

Referring to FIG. 35A, a backside semiconductor cap structure 111 of the fifth configuration of the second exemplary structure can be formed by a uniform non-selective deposition of a semiconductor material directly on the physically exposed surfaces of the vertical semiconductor channels 60 and the backside surface of the bottommost insulating layer 32B. Thus, the backside semiconductor cap structure 111 of the fifth configuration of the second exemplary structure can be formed as a continuous semiconductor material layer having a uniform thickness throughout, and may have the same composition and optional doping as previously described backside semiconductor cap structures 111 of other configurations of the second exemplary structure. The backside semiconductor cap structure 111 is formed as a semiconductor material layer covering all physically exposed portions of the bottom surface of the bottommost insulating layer 32B within the alternating stack (32, 46). The thickness of the planar portion of each backside semiconductor cap structure 111 may be in a range from 20 nm to 200 nm, such as from 40 nm to 100 nm, although lesser and greater thicknesses may also be employed.

A metal layer 133 can be deposited on the backside surface of the backside semiconductor cap structure 111. The metal layer 133 includes any metal that can form a metal-semiconductor alloy upon reaction with the semiconductor material of the backside semiconductor cap structures 111. For example, the metal layer 133 may comprise, and/or may consist essentially of, at least one metal selected from tungsten, titanium, cobalt, molybdenum, ruthenium, nickel, platinum, palladium, etc. The metal layer 133 may be deposited by a non-selective deposition process or a selective deposition process. For example, the metal layer 133 may be deposited by physical vapor deposition (PVD) or non-selective chemical vapor deposition (CVD). The thickness of the metal layer 133 may be in a range from 5 nm to 80 nm, such as from 10 nm to 40 nm, although lesser and greater thicknesses may also be employed. The metal layer 133 may be formed as a continuous metal layer that contacts the entirety of the backside surface of the backside semiconductor cap structure 111.

Referring to FIG. 35B, the processing steps described with reference to FIG. 33B can be performed. Specifically, the above described anneal process can be performed to react the metal layer 133 with a surface portion of the backside semiconductor cap structure 111 to form the metal-semiconductor alloy structure 136 on the backside semiconductor cap structure 111. In one embodiment, the metal-semiconductor alloy structure 136 may comprise tungsten silicide, germanide or silicide-germanide, titanium silicide, germanide or silicide-germanide, cobalt silicide, germanide or silicide-germanide, ruthenium silicide, germanide or silicide-germanide, molybdenum silicide, germanide or silicide-germanide, nickel silicide, germanide or silicide-germanide, platinum silicide, germanide or silicide-germanide, or palladium silicide, germanide or silicide-germanide or a combination thereof.

In this case, the metal-semiconductor alloy structure 136 comprises a planar metal-semiconductor alloy layer that is vertically spaced from the bottommost insulating layer 32B by the backside semiconductor cap structure 111. In this case, the semiconductor cap structure 111 comprises a semiconductor material layer having a uniform thickness that contacts a two-dimensional array of vertical semiconductor channels 60. The metal-semiconductor alloy structure 136 may be formed as a continuous layer having a uniform thickness throughout. The thickness of the metal-semiconductor alloy structure 136 may be in a range from 8 nm to 100 nm, such as from 16 nm to 50 nm, although lesser and greater thicknesses may also be employed.

Referring to FIG. 35C, the processing steps described with reference to FIG. 31D can be performed to form a backside conductive layer 234. A source contact structure is formed, which comprises the backside conductive layer 234 and the metal-semiconductor alloy structures 136.

Figure 35D:
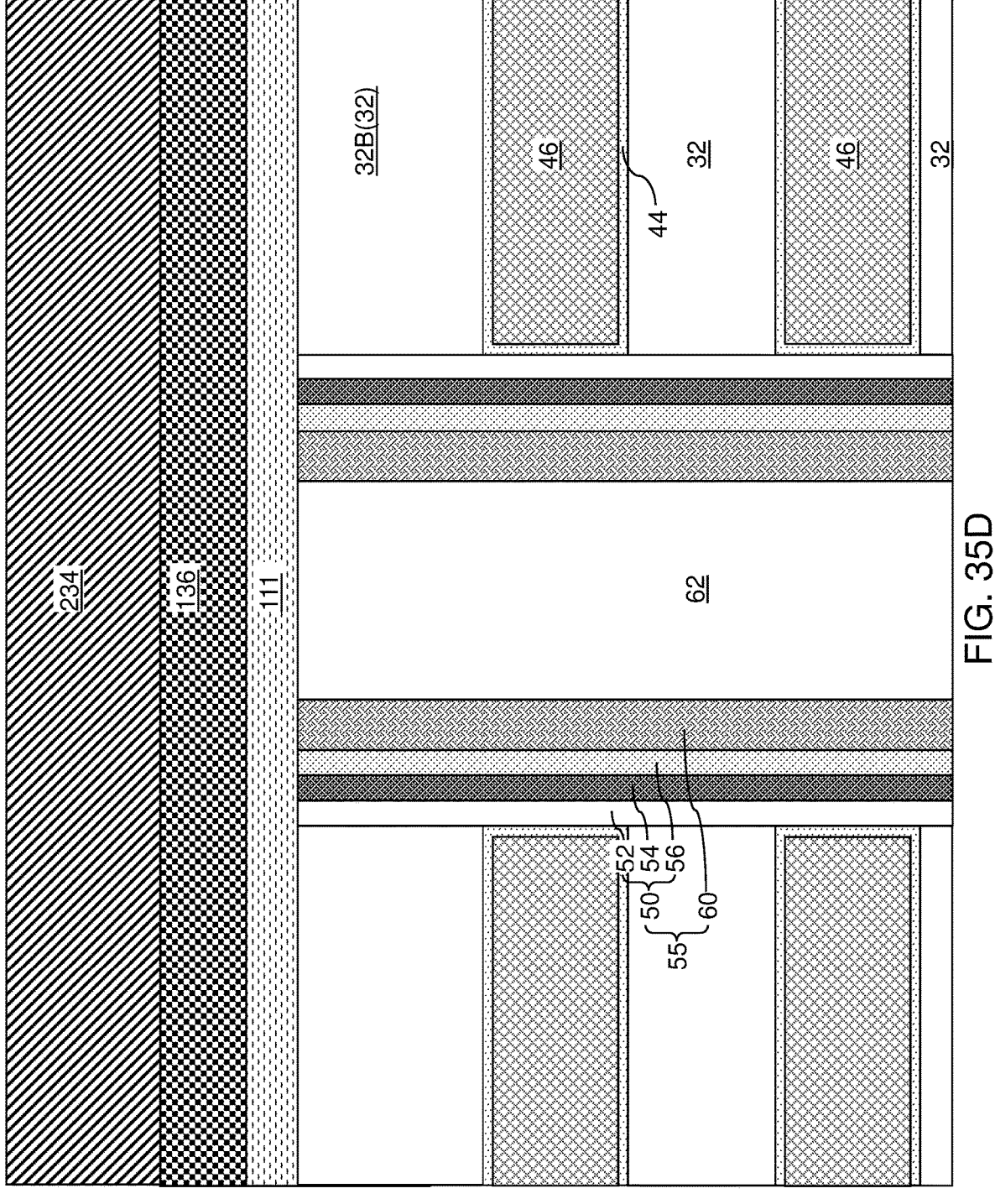
FIG. 35D is an alternative embodiment of the fifth con-figuration of the second exemplary structure.

Referring to FIG. 35D, an alternative embodiment of the fifth configuration of the second exemplary structure is illustrated, which can be derived from the fifth configuration of the second exemplary structure illustrated in FIG. 35C by increasing the overetch depth of the memory openings 49 at the processing steps of FIGS. 20A and 20B and/or by increasing the etch depth during the etching step at the processing steps of FIGS. 30A and 30B. In this case, the planar horizontal bottom portion of each vertical semiconductor channel 60 may be removed at the processing steps of FIGS. 30A and 30B. Each physically exposed surface of the vertical semiconductor channels 60 may be an annular surface having an inner periphery and an outer periphery. In one embodiment, each memory opening fill structure 58 comprises a dielectric core 62 that is laterally surrounded by a vertical semiconductor channel 60 and having a bottom surface that contacts a circular segment of the top surface of a backside semiconductor cap structure 111.

Figure 36:
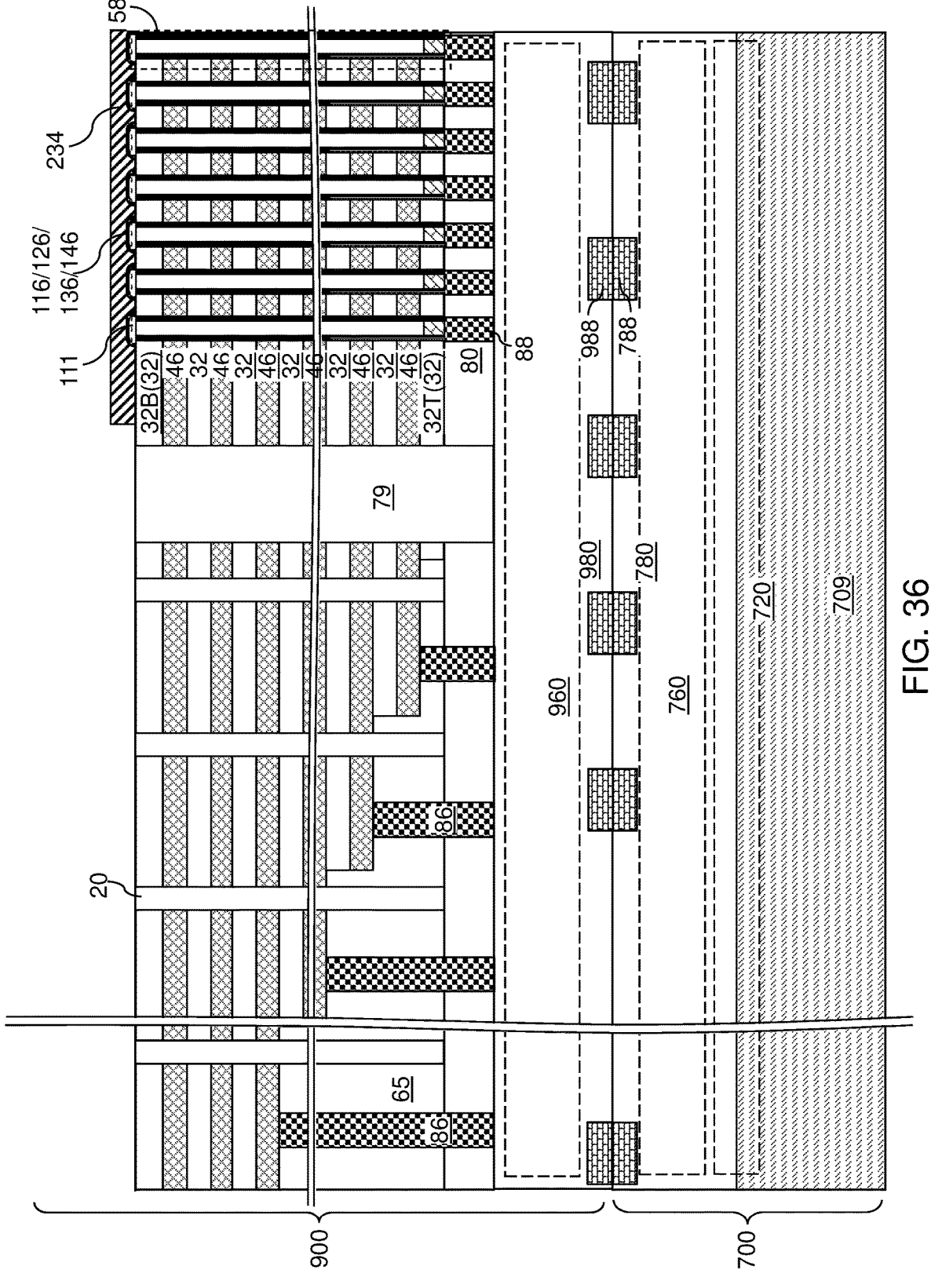
FIG. 36 is a vertical cross-sectional view of the second exemplary structure after formation of a source contact structure according to the second embodiment of the present disclosure.

Referring to FIG. 36, the second exemplary structure is illustrated after formation of a source contact structure according to the second embodiment of the present disclosure. FIG. 36 illustrates the first through fourth configurations of the second exemplary structure in which a two-dimensional array of discrete backside semiconductor cap structures 111 is employed.

Figure 37:
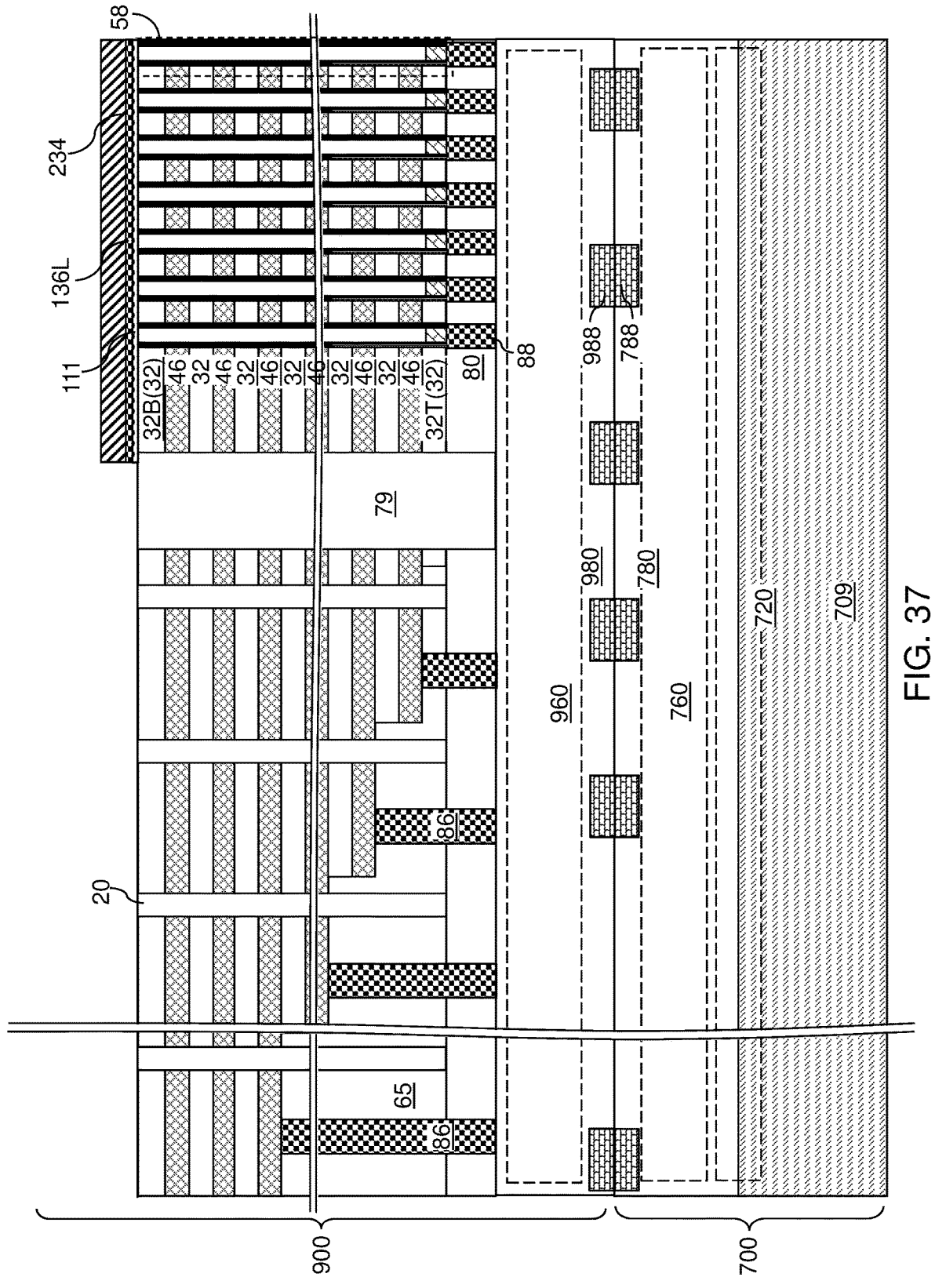
FIG. 37 is a vertical cross-sectional view of an alternative embodiment the second exemplary structure after formation of a source contact structure according to the second embodiment of the present disclosure.

Referring to FIG. 37, an alternative embodiment the second exemplary structure is illustrated after formation of a source contact structure. FIG. 37 illustrates the fifth configuration of the second exemplary structure in which the backside semiconductor cap structure 111 is formed as a single continuous semiconductor material layer.

Referring to FIGS. 1-4 and 20A-37 and according to the second embodiment of the present disclosure, a semiconductor structure comprises: an alternating stack (32, 46) of insulating layers 32 and electrically conductive layers 46; a memory opening 49 vertically extending through the alternating stack (32, 46); a memory opening fill structure 58 located in the memory opening 49 and comprising a memory film 50 and a vertical semiconductor channel 60; and a backside semiconductor cap structure 111 having a top surface 111T that is in contact with a bottom surface of the vertical semiconductor channel 60, wherein an entirety of the top surface 111T of the backside semiconductor cap structure 111 is located within a horizontal plane including a bottom surface of a bottommost insulating layer within the alternating stack (32, 46).

In one embodiment, an annular bottom surface of the memory film 50 is in contact with an annular surface segment of the top surface of the backside semiconductor cap structure 111. In one embodiment, the top surface 111T of the backside semiconductor cap structure 111 is in contact with a bottom surface of the bottommost insulating layer within the alternating stack (32, 46) and with a planar horizontal surface of the vertical semiconductor channel 60.

In one embodiment, the backside semiconductor cap structure 111 comprises a contoured bottom surface 111B; and each point on the contoured bottom surface 111B is equidistant from a respective most proximal point on a bottom surface of the vertical semiconductor channel 60. In one embodiment, the contoured bottom surface 111B comprises a horizontal planar bottom surface segment and a convex tapered annular surface segment connecting a periphery of the horizontal planar bottom surface segment to a periphery of the top surface of the backside semiconductor cap structure 111.

In one embodiment, the semiconductor structure further comprises a metal-semiconductor alloy structure (116, 126, 136, 146) contacting a bottom surface of the backside semiconductor cap structure 111. In one embodiment, the metal-semiconductor alloy structure (116, 126, 136, 146) comprises an annular top surface in contact with an annular surface segment of the bottom surface of the bottommost insulating layer of the alternating stack (32, 46) within the horizontal plane. In one embodiment, the metal-semiconductor alloy structure 136 comprises a planar metal-semiconductor alloy layer that is vertically spaced from the bottommost insulating layer by the backside semiconductor cap structure 111. In one embodiment, the semiconductor structure further comprises a backside conductive layer (234, 244) comprising and/or consisting essentially of at least one metallic material and contacting a bottom surface of the metal-semiconductor alloy structure (116, 126, 136, 146).

In one embodiment, the vertical semiconductor channel 60 has a doping of a first conductivity type; and the backside semiconductor cap structure 111 has a doping of the first conductivity type. Alternatively, the vertical semiconductor channel 60 has a doping of a first conductivity type; and the backside semiconductor cap structure 111 has a doping of a second conductivity type that is an opposite of the first conductivity type. In one embodiment, an entirety of an interface between the memory opening fill structure 58 and the backside semiconductor cap structure 111 is located within the horizontal plane.

The various embodiments of the present disclosure can be employed to provide various backside semiconductor cap structures 111 that can be advantageously employed to provide reliable electrical contact between vertical semiconductor channels 60 and a backside conductive layer (234, 244). Both the semiconductor cap structures 111 and the metal-semiconductor alloy structure (116, 126, 136, 146) can be formed at a relatively low temperature (e.g., below 400 degrees Celsius) to avoid negatively affecting the bonding pads and the quality of the bond between the logic die 700 and the memory die 900. The metal-semiconductor alloy structure (116, 126, 136, 146) provides a low contact resistance between the source contact structure and the vertical semiconductor channel 60. Furthermore, by forming the semiconductor cap structures 111 under the alternating stack (32, 46) increases the contact area with the vertical semiconductor channel, which further reduces contact resistance.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Whenever two or more elements are listed as alternatives in a same paragraph of in different paragraphs, a Markush group including a listing of the two or more elements is also impliedly disclosed. Whenever the auxiliary verb "can" is employed in this disclosure to describe formation of an element or performance of a processing step, an embodiment in which such an element or such a processing step is not performed is also expressly contemplated, provided that the resulting apparatus or device can provide an equivalent result. As such, the auxiliary verb "can" as applied to formation of an element or performance of a processing step should also be interpreted as "may" or as "may, or may not" whenever omission of formation of such an element or such a processing step is capable of providing the same result or equivalent results, the equivalent results including somewhat superior results and somewhat inferior results. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. If publications, patent applications, and/or patents are cited herein, each of such documents is incorporated herein by reference in their entirety.

What is claimed is:

1. A semiconductor structure, comprising:
an alternating stack of insulating layers and electrically conductive layers;
a memory opening vertically extending through the alternating stack;
a memory opening fill structure located in the memory opening and comprising a memory film and a vertical semiconductor channel that laterally surrounds a core cavity that is free of any solid-phase material therein;
a Group IV-containing material portion contacting an end portion of the vertical semiconductor channel and exposed in the core cavity; and
a source contact structure in contact with a bottom surface of the Group IV-containing material portion and a bottom surface of a bottommost layer in the alternating stack.

2. The semiconductor structure of claim 1, wherein the memory opening fill structure further comprises a dielectric core that laterally surrounds the core cavity and that is laterally surrounded by the vertical semiconductor channel.

3. The semiconductor structure of claim 2, wherein:
the Group IV-containing material portion is in contact with an end segment of an inner sidewall of the dielectric core that is exposed in the core cavity; and
a lateral thickness of the dielectric core, as measured between the inner sidewall of the dielectric core and an outer sidewall of the dielectric core, increase with a vertical distance from the source contact structure around an end portion of the core cavity.

4. The semiconductor structure of claim 1, further comprising a logic die bonded to a memory die containing the alternating stack.

5. The semiconductor structure of claim 1, wherein a top surface of the Group IV-containing material portion comprises a tapered convex surface having a lowest point at a center region thereof.

6. The semiconductor structure of claim 1, wherein the vertical semiconductor channel has a tubular configuration, and the Group IV-containing material portion is located within an end portion of a cylindrical cavity within the vertical semiconductor channel.

7. The semiconductor structure of claim 1, wherein the Group IV-containing material portion comprises at least one silicon or germanium.

8. The semiconductor structure of claim 7, wherein the Group IV-containing material portion comprises a semiconductor portion consisting essentially of silicon, germanium or silicon-germanium.

9. The semiconductor structure of claim 7, wherein the Group IV-containing material portion comprises a doped semiconductor portion consisting essentially of silicon, germanium or silicon-germanium doped with at least one p-type or n-type dopant.

10. The semiconductor structure of claim 9, wherein:
the vertical semiconductor channel has a doping of a first conductivity type; and
the doped semiconductor portion has a doping of the first conductivity type.

11. The semiconductor structure of claim 9, wherein:
the vertical semiconductor channel has a doping of a first conductivity type; and
the doped semiconductor portion has a doping of a second conductivity type that is an opposite of the first conductivity type.

12. The semiconductor structure of claim 7, wherein the Group IV-containing material portion comprises a metal-semiconductor alloy portion.

13. The semiconductor structure of claim 12, wherein the metal-semiconductor alloy portion comprises a metal silicide, a metal germanide or a metal silicide-germanide.

14. The semiconductor structure of claim 1, wherein an annular end surface of the vertical semiconductor channel is in contact with the source contact structure.

* * * * *